(12) United States Patent
Liaw

(10) Patent No.: US 12,361,985 B2
(45) Date of Patent: Jul. 15, 2025

(54) MEMORY DEVICE

(71) Applicant: Taiwan Semiconductor Manufacturing Company, Ltd., Hsinchu (TW)

(72) Inventor: Jhon-Jhy Liaw, Zhudong Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 190 days.

(21) Appl. No.: 18/170,109

(22) Filed: Feb. 16, 2023

(65) Prior Publication Data

US 2024/0096383 A1 Mar. 21, 2024

Related U.S. Application Data

(60) Provisional application No. 63/375,886, filed on Sep. 16, 2022.

(51) Int. Cl.
*G11C 7/00* (2006.01)
*G11C 5/06* (2006.01)
*G11C 7/10* (2006.01)

(52) U.S. Cl.
CPC .......... *G11C 7/1069* (2013.01); *G11C 5/063* (2013.01); *G11C 7/1096* (2013.01)

(58) Field of Classification Search
CPC ...... G11C 7/1069; G11C 5/063; G11C 7/1096
USPC .................................................. 365/189.011
See application file for complete search history.

(56) References Cited

U.S. PATENT DOCUMENTS

| | | | |
|---|---|---|---|
| 7,233,032 B2 | 6/2007 | Liaw | |
| 7,525,867 B2 * | 4/2009 | Ramaraju | G11C 15/00 365/189.04 |
| 7,969,811 B2 * | 6/2011 | Nii | H10B 10/12 365/230.06 |
| 8,072,833 B2 * | 12/2011 | Kushida | G11C 11/419 365/154 |
| 8,144,540 B2 | 3/2012 | Liaw | |
| 9,024,392 B2 | 5/2015 | Liaw | |
| 9,209,247 B2 | 12/2015 | Colinge | |
| 9,236,267 B2 | 1/2016 | De | |

(Continued)

OTHER PUBLICATIONS

Pending U.S. Appl. No. 17/876,044, filed on Jul. 28, 2022 invented by 1st inventor Jhon-Jhy Liaw.

*Primary Examiner* — Viet Q Nguyen
(74) *Attorney, Agent, or Firm* — Cooper Legal Group, LLC

(57) ABSTRACT

A memory device includes a first static random access memory (SRAM) cell, a second SRAM cell, and a first metal layer. The first SRAM cell includes a first write-port pull-up (PU) transistor and a second write-port PU transistor arranged in a Y-direction, and a first read-port PD transistor and a first read-port PG transistor. The second SRAM cell includes a third write-port PU transistor and a fourth write-port PU transistor arranged in the Y-direction, and a second read-port PD transistor and a second read-port PG transistor. The first and second read-port PD transistors and the first and second read-port PG transistors are arranged in the Y-direction. The first metal layer is over the first SRAM cell and the second SRAM cell. The first metal layer includes a read bit-line conductor extending in the Y-direction and shared by the first SRAM cell and the second SRAM cell.

20 Claims, 29 Drawing Sheets

(56) References Cited

U.S. PATENT DOCUMENTS

| | | | |
|---|---|---|---|
| 9,412,817 B2 | 8/2016 | Yang | |
| 9,412,828 B2 | 8/2016 | Ching | |
| 9,472,618 B2 | 10/2016 | Oxland | |
| 9,502,265 B1 | 11/2016 | Jiang | |
| 9,520,482 B1 | 12/2016 | Chang | |
| 9,536,738 B2 | 1/2017 | Huang | |
| 9,576,814 B2 | 2/2017 | Wu | |
| 9,608,116 B2 | 3/2017 | Ching | |
| 9,640,540 B1 | 5/2017 | Liaw | |
| 9,672,903 B2 | 6/2017 | Liaw | |
| 9,892,781 B2 | 2/2018 | Liaw | |
| 10,128,253 B2 | 11/2018 | Liaw | |
| 11,950,401 B2 * | 4/2024 | Liaw | H01L 29/0665 |
| 12,033,721 B2 * | 7/2024 | Banerjee | G11C 11/419 |
| 12,068,027 B2 * | 8/2024 | Giterman | H10B 10/12 |
| 12,073,919 B2 * | 8/2024 | Banerjee | G06F 30/392 |
| 12,114,473 B2 * | 10/2024 | Liaw | G11C 11/412 |
| 2024/0040762 A1 * | 2/2024 | Liaw | H10B 10/12 |

* cited by examiner

MEMORY DEVICE

PRIORITY CLAIM AND CROSS-REFERENCE

This application claims the benefit of U.S. Provisional Application No. 63/375,886, filed Sep. 16, 2022, the entirety of which is/are incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, fin field-effect transistors (FinFETs) and gate-all-around (GAA) transistors have been incorporated into memory devices (including, for example, static random-access memory, or SRAM, cells) to reduce chip footprint while maintaining reasonable processing margins.

However, as memory devices continue to be scaled down, interconnection routing for memory devices uses too many routing resources and therefore impacts the cell scaling as well as memory performance. Accordingly, although existing technologies for fabricating memory devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
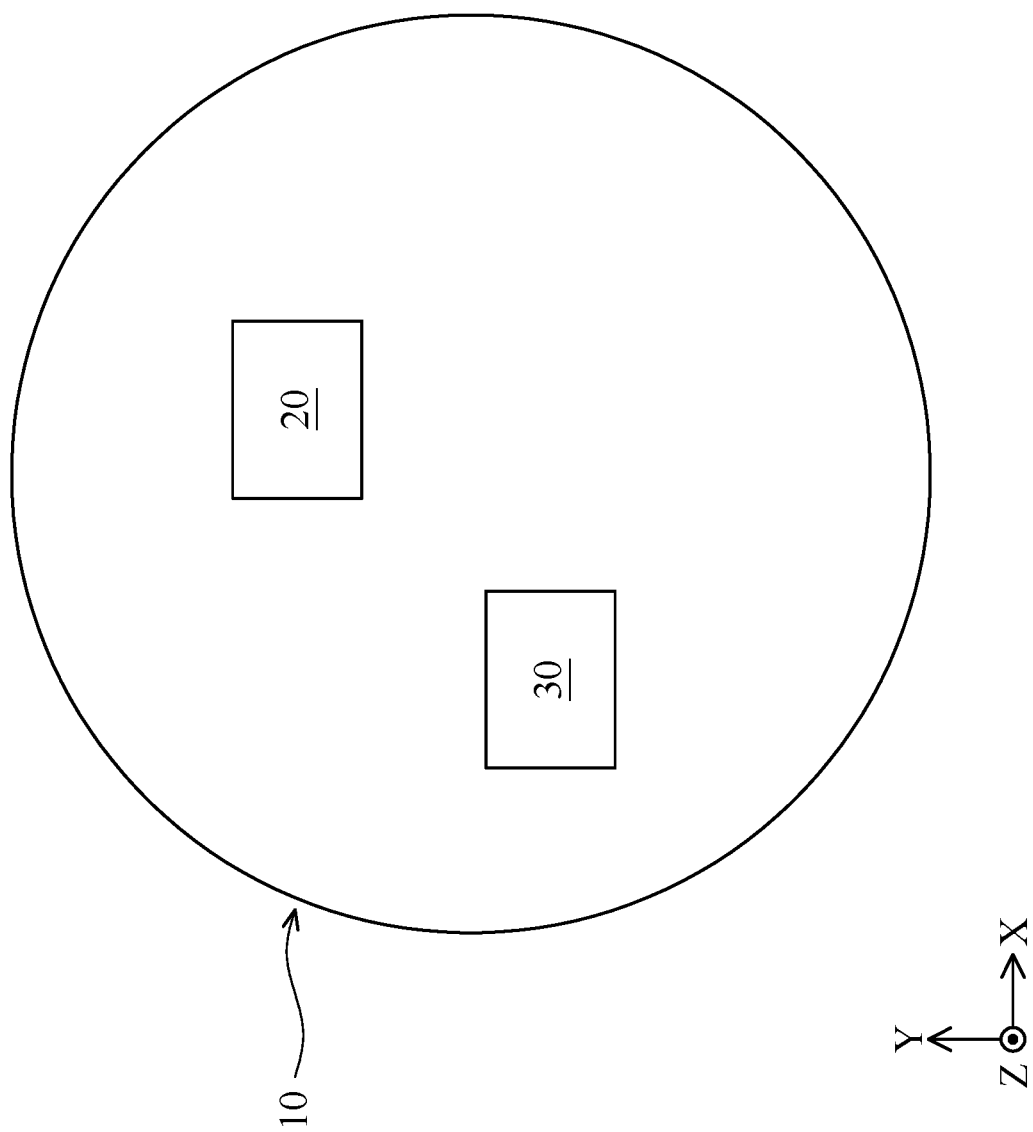
FIG. 1 is a fragmentary diagrammatic top view of an integrated circuit (IC) chip, in portion or entirety, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to memory devices, and more particularly to static random-access memory (SRAM) cells having field-effect transistors (FETs), such as three-dimensional gate-all-around (GAA) transistors, in an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure also relates to layouts and structures thereof of memory devices. More particularly, the present disclosure relates to two-port SRAM cell layout designs and structures. The present disclosure provides a compact two-port SRAM cell design having a width of four gate pitches (the so-called four-gate-pitch SRAM cell) and with multiple metal layers with metal conductors (or tracks) used for connections and over transistors. Transistors such as gate-all-around (GAA) transistors forming the two-port SRAM cell are fabricated over a substrate. Some of the metal conductors such as read bit-line conductors and VDD lines are fabricated in the lowest metal layer without extra landing pad, thereby reducing the capacitance. Other metal conductors such as write word-line conductors, write bit-line conductors, and write bit-line-bar (also referred to as complementary bit-line) conductors are fabricated in higher metal layers. The write word-line conductors, write bit-line conductors, and write bit-line-bar conductors can be made wider than those metal conductors, thereby reducing the resistance.

Embodiments of the present disclosure offer advantages over the existing art, though it should be understood that other embodiments may offer different advantages, not all advantages are necessarily discussed herein, and no particular advantage is required for all embodiments. For example, embodiments discussed herein include an array of two-port SRAM cells each constructed by eight GAA transistors, in which two two-port SRAM cells in adjacent two rows share a read bit-line in the lowest metal layer, that can improve cell performance and reduce the routing complexity of the two-port SRAM cell. The details of the present disclosure are described below in conjunction with the accompanying drawings, which illustrate the layout and structure of circuit cells, according to some embodiments.

FIG. 1 is a fragmentary diagrammatic top view of an integrated circuit (IC) chip 10, in portion or entirety, in accordance with some embodiments of the present disclosure. The IC chip 10 may include various passive microelectronic devices and active microelectronic devices, such as resistors, capacitors, inductors, diodes, p-type field effect transistors (PFETs), n-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high frequency transistors, other suitable components, or combinations thereof. The various microelectronic devices can be configured to provide the IC chip 10 with functionally distinct regions, such as a core region (also referred to as a logic region), a memory region (e.g., a static random access memory (SRAM) region), an analog region, a peripheral region (also referred to as an input/output (I/O) region), a dummy region, and/or other suitable region. In some embodiments, the IC chip 10 includes a memory region 20 and a logic region 30. The memory region 20 can include an array of memory cells, each of which includes transistors and interconnection structures (also referred to as routing structures) that combine to provide a storage device and/or a storage function, such as a flip flop, a latch, other suitable memory devices, or combinations thereof. In some embodiments, the memory region 20 is configured with static random-access memory (SRAM) cells, dynamic random-access memory (DRAM) cells, non-volatile random-access memory (NVRAM) cells, flash memory cells, other suitable memory cells, or combinations thereof. Logic region 30 can include an array of standard cells, each of which includes transistors and interconnection structures that combine to provide a logic device and/or a logic function, such as an inverter, an AND gate, an NAND gate, an OR gate, an NOR gate, a NOT gate, an XOR gate, an XNOR gate, other suitable logic devices, or combinations thereof. FIG. 1 has been simplified for the sake of clarity to better understand the inventive concepts of the present disclosure. Additional features can be added to the IC chip 10, and some of the features described herein can be replaced, modified, or eliminated in other embodiments of the IC chip 10.

Figure 2:
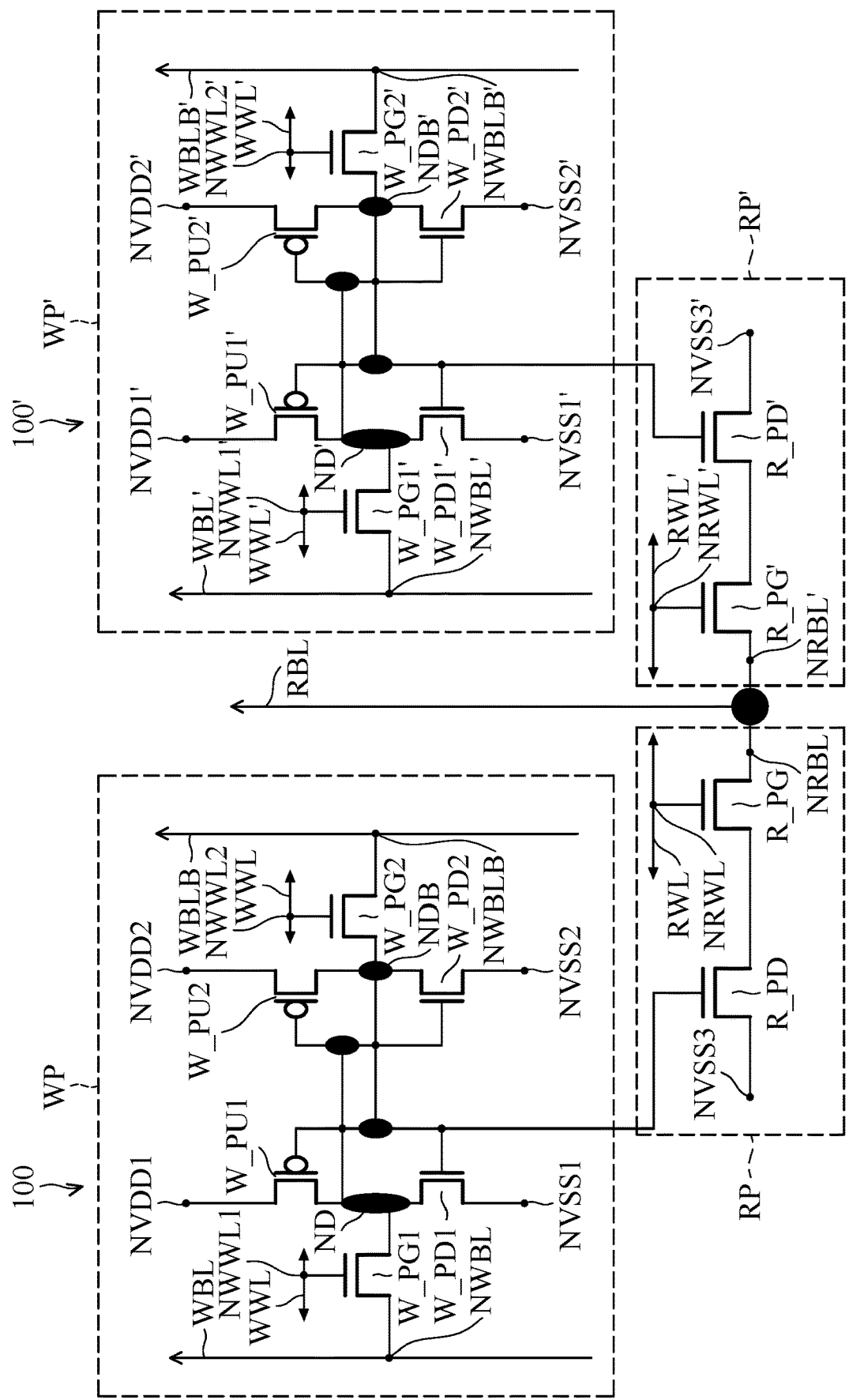
FIG. 2 is a circuit diagram for SRAM cells that can be implemented in an array of two-port SRAM cells in the memory region of FIG. 1, in accordance with some alternative embodiments of the present disclosure.

FIG. 2 is a circuit diagram for SRAM cells 100 and 100' that can be implemented in an array of two-port SRAM cells in the memory region 20 of FIG. 1, in accordance with some alternative embodiments of the present disclosure. The SRAM cell 100 includes a write-port circuit WP having data nodes ND and NDB, a read-port circuit RP coupled with data node ND. Similarly, the SRAM cell 100' includes a write-port circuit WP' having data nodes ND' and NDB', a read-port circuit RP1' coupled with data node ND', and a second read-port circuit RP2' coupled with data node NDB'. The SRAM cells 100 and 100' may also be referred to as two-port SRAM cells due to each of the SRAM cells 100 and 100' has two-port of write-port circuit and the read-port circuit, as shown in FIG. 2.

The SRAM cell 100 may be in a row of an array of SRAM cells, and the SRAM cell 100' may be adjacent to the SRAM cell 100 and in an adjacent row of the array of the SRAM cells. The SRAM cells 100 and 100' have the same function and operation. The SRAM cells 100 and 100' also have the same features and components. For the sake of distinction, the reference numbers of the components in the SRAM cell 100' are additionally labeled with "'".

For the sake of simplicity, take the SRAM cell 100 as an example below to illustrate the operations and circuits of the SRAM cell 100 and 100'. The write-port circuit WP includes two p-type transistors, such as write-port pull-up (PU) transistors W_PU1 and W_PU2, and four n-type transistors, such as write-port pull-down (PD) transistors W_PD1 and W_PD2 and write-port pass-gate (PG) transistors W_PG1 and W_PG2. The write-port PU transistor W_PU1, the write-port PU transistor W_PU2, the write-port PD transistor W_PD1, and the write-port PD transistor W_PD2 form a cross latch having two cross-coupled inverters. The write-port PU transistor W_PU1 and the write-port PD transistor W_PD1 form a first inverter while the write-port PU transistor W_PU2 and the write-port PD transistor W_PD2 form a second inverter.

Drains of the write-port PU transistor W_PU1 and the write-port PD transistor W_PD1 are coupled together and form data node ND. Drains of the write-port PU transistor W_PU2 and the write-port PD transistor W_PD2 are coupled together and form data node NDB. Gates of the write-port PU transistor W_PU1 and the write-port PD transistor W_PD1 are coupled together and to drains of the write-port PU transistor W_PU2 and the write-port PD transistor W_PD2. Gates of the write-port PU transistor W_PU2 and the write-port PD transistor W_PD2 are coupled together and to drains of the write-port PU transistor W_PU1 and the write-port PD transistor W_PD1.

Source of write-port PU transistor W_PU1 is coupled with a supply voltage node NVDD1. Source of write-port PU transistor W_PU2 is coupled with a supply voltage node NVDD2. In some embodiments, supply voltage nodes NVDD1 and NVDD2 are electrically coupled together and configured to receive a supply voltage VDD. Source of the write-port PD transistor W_PD1 is coupled with a reference voltage node NVSS1, and source of the write-port PD transistor W_PD2 is coupled with a reference voltage node NVSS2. In some embodiments, reference voltage node NVSS1 and reference voltage node NVSS2 are electrically coupled together and configured to receive a reference voltage VSS.

The write-port PG transistor W_PG1 functions as a pass gate between the data node ND and a write bit-line WBL, and the write-port PG transistor W_PG2 functions as a pass gate between the data node NDB and a write bit-line-bar WBLB. A drain of the write-port PG transistor W_PG1 is referred to as a write bit-line node NWBL and electrically coupled with the write bit-line WBL. A source of the write-port PG transistor W_PG1 is electrically coupled with the data node ND. A drain of the write-port PG transistor W_PG2 is referred to as a write bit-line-bar node NWBLB and electrically coupled with the write bit-line-bar WBLB. A source of the write-port PG transistor W_PG2 is electrically coupled with the data node NDB. A gate of the write-port PG transistor W_PG1 is referred to as a write word-line node NWWL1, a gate of the write-port PG transistor W_PG2 is referred to as a write word-line node NWWL2, and write word-line nodes NWWL1 and NWWL2 are electrically coupled with a write word-line WWL.

In some embodiments, the write bit-line-bars WBLB and write bit-lines WBL are coupled to each drain of the write-port PG transistors W_PG1 and W_PG2 of memory cells in the same column of the array of the SRAM cells, and write word-line WWL is coupled to each gate of the write-port PG transistors W_PG1 and W_PG2 of memory cells in the same row of the array of the SRAM cells.

In a write operation of the SRAM cell 100 using the write-port circuit WP, data to be written to the SRAM cell 100 is applied to the write bit-line WBL and the write bit-line-bar WBLB. The write word-line WWL is then activated to turn on the write-port PG transistors W_PG1 and W_PG2. As a result, the data on the write bit-line WBL and the write bit-line-bar WBLB is transferred to and is stored in corresponding data nodes ND and NDB.

The read-port circuit RP includes two n-type transistors, such as read-port PD transistor R_PD and read-port PG transistor R_PG. A source of the read-port PD transistor R_PD is coupled with a reference voltage node NVSS3. In some embodiments, the reference voltage node NVSS3 is configured to receive the reference voltage VSS. A gate of the read-port PD transistor R_PD is coupled with the data node NDB. A drain of the read-port PD transistor R_PD is coupled with a source of the read-port PG transistor R_PG. A drain of the read-port PG transistor R_PG is referred to as a read bit-line node NRBL and electrically coupled with a read bit-line RBL. A gate of the read-port PG transistor R_PG is referred to as a read word-line node NRWL and electrically coupled with a read word-line RWL.

In a read operation of the SRAM cell 100 using the read-port circuit RP, the read bit-line RBL is pre-charged with a high logical value. The read word-line RWL is activated with a high logical value to turn on the read-port PG transistor R_PG. The data stored in data node NDB turns on or off the read-port PD transistor R_PD. For example, if data node NDB stores a high logical value, the read-port PD transistor R_PD is turned on. The turned-on read-port PG transistor R_PG and the turned-on read-port PD transistor R_PD then pull read bit-line RBL to the reference voltage VSS or a low logical value at the source of the read-port PD transistor R_PD. On the other hand, if the data node NDB stores a low logical value, the read-port PD transistor R_PD is turned off and operates as an open circuit. As a result, the read bit-line RBL remains at the pre-charged high logical value. Detecting a logical value on the read bit-line RBL therefore reveals the logical value stored in the data node NDB.

In the present embodiments, the read bit-line node NRBL of the read-port PG transistor R_PG of the SRAM cell 100 and the read bit-line node NRBL' of the read-port PG transistor R_PG' of the SRAM cell 100' are further coupled together and to the read bit-line RBL, as shown in FIG. 2. In other word, the SRAM cell 100 and 100' share the read bit-line RBL. The SRAM cells 100 and 100' are illustrated as an example. In some embodiments, each of the SRAM cells 100 and 100' shown in FIG. 2 has a total of eight transistors (including the write-port PU transistors W_PU1 and W_PU2, the write-port PD transistors W_PD1 and W_PD2, the write-port PG transistors W_PG1 and W_PG2, and the read-port PD transistors R_PD and R_PD), such that the SRAM cells 100 and 100' may be referred to as 8T SRAM cells.

Figure 3:
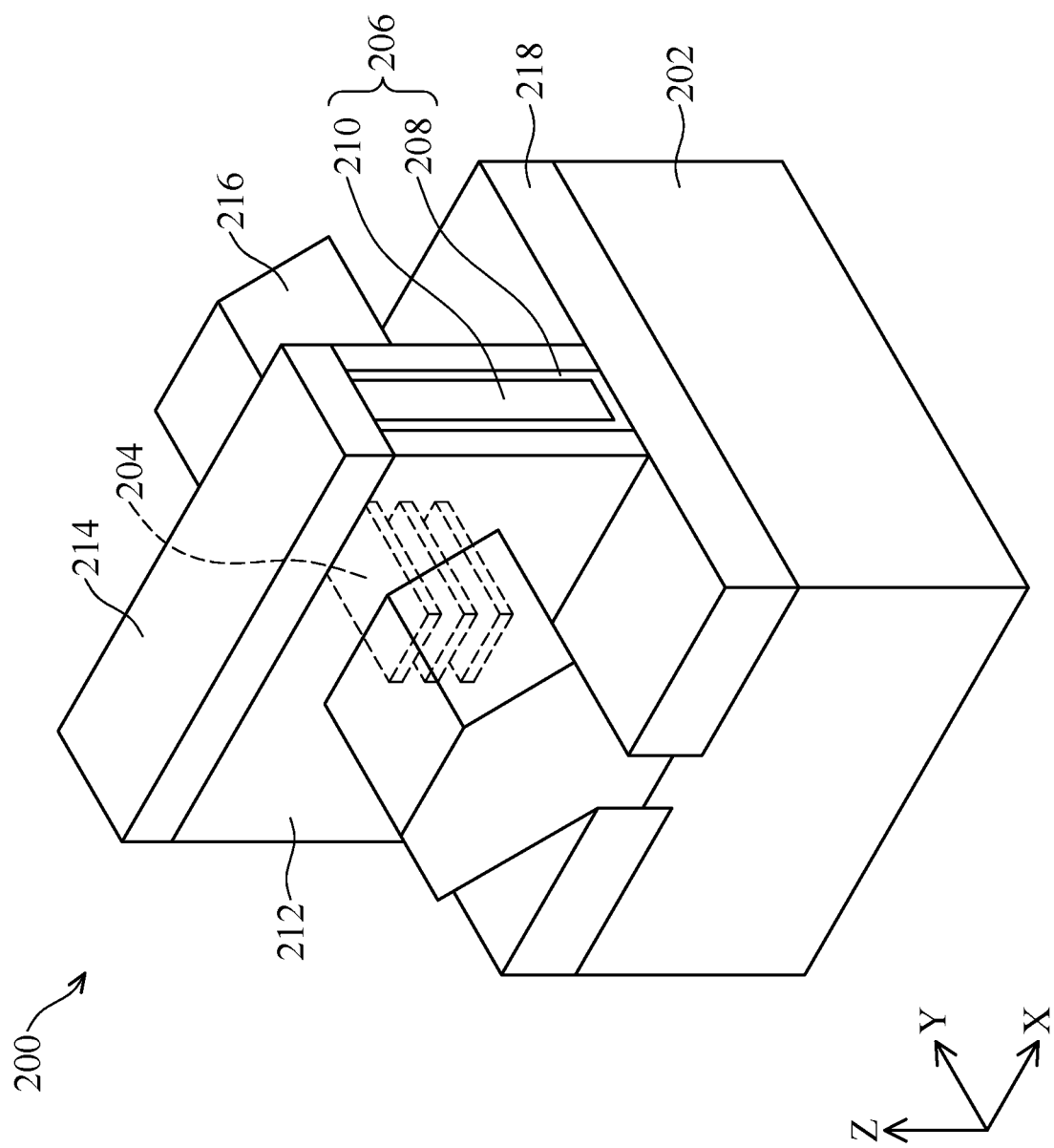
FIG. 3 is a perspective view of a GAA transistor in the SRAM cell, in accordance with some embodiments of the present disclosure.

Each of the SRAM cells 100 and 100' discussed above is constructed by transistors. The transistors may be planar transistors, fin field-effect transistor (FinFET) transistors, gate-all-around (GAA) transistors, nano-wire transistors, nano-sheet transistors, or a combination thereof. For the sake of providing an example, an exemplary GAA transistor is illustrated in FIG. 3. However, it should be understood that the application should not be limited to a particular type of device, except as specifically claimed.

Referring to FIG. 3, a perspective view of an exemplary GAA transistor 200 is illustrated. The GAA transistor 200 is formed over a substrate 202. The substrate 202 may contains a semiconductor material, such as bulk silicon (Si).

The GAA transistor 200 also includes one or more nanostructures 204 (dash lines) extending in a Y-direction and vertically stacked (or arranged) in a Z-direction. More specifically, the nanostructures 204 are spaced apart from each other in the Z-direction. In some embodiments, the nanostructures 204 may also be referred to as channels, channel layers, nanosheets, or nanowires.

The GAA transistor 200 further includes a gate structure 206 including a gate dielectric layer 208 and a gate electrode 210. The gate dielectric layer 208 wraps around the nanostructures 204 and the gate electrode 210 wraps around the gate dielectric layer 208 (not shown in FIG. 3, may refer to FIGS. 5E to 5G). As shown in FIG. 3, gate spacers 212 are on sidewalls of the gate structure 206 and over the nanostructures 204 (not shown in FIG. 3, may refer to FIGS. 5E and 5G). A gate top dielectric layer 214 is over the gate dielectric layer 208, the gate electrode 210, and the nanostructures 204. The gate top dielectric layer 214 is used for contact etch protection layer.

The GAA transistor 200 further includes source/drain features 216. As shown in FIG. 3, two source/drain features 216 are on opposite sides of the gate structure 206. The nanostructures 204 (dash lines) extends in the Y-direction to connect one source/drain feature 216 to the other source/drain feature 216. The source/drain features 216 may also be referred to as source/drain, or source/drain regions. In some embodiments, source/drain feature(s) may refer to a source or a drain, individually or collectively dependent upon the context.

Isolation feature 218 is over the substrate 202 and under the gate dielectric layer 208, the gate electrode 210, and the gate spacers 212. The isolation feature 218 is used for isolating the GAA transistor 200 from other devices. In some embodiments, the isolation feature 218 may include different structures, such as shallow trench isolation (STI) structure, deep trench isolation (DTI) structure. Therefore, the isolation feature 218 is also referred as to as a STI feature or DTI feature.

Figure 4:
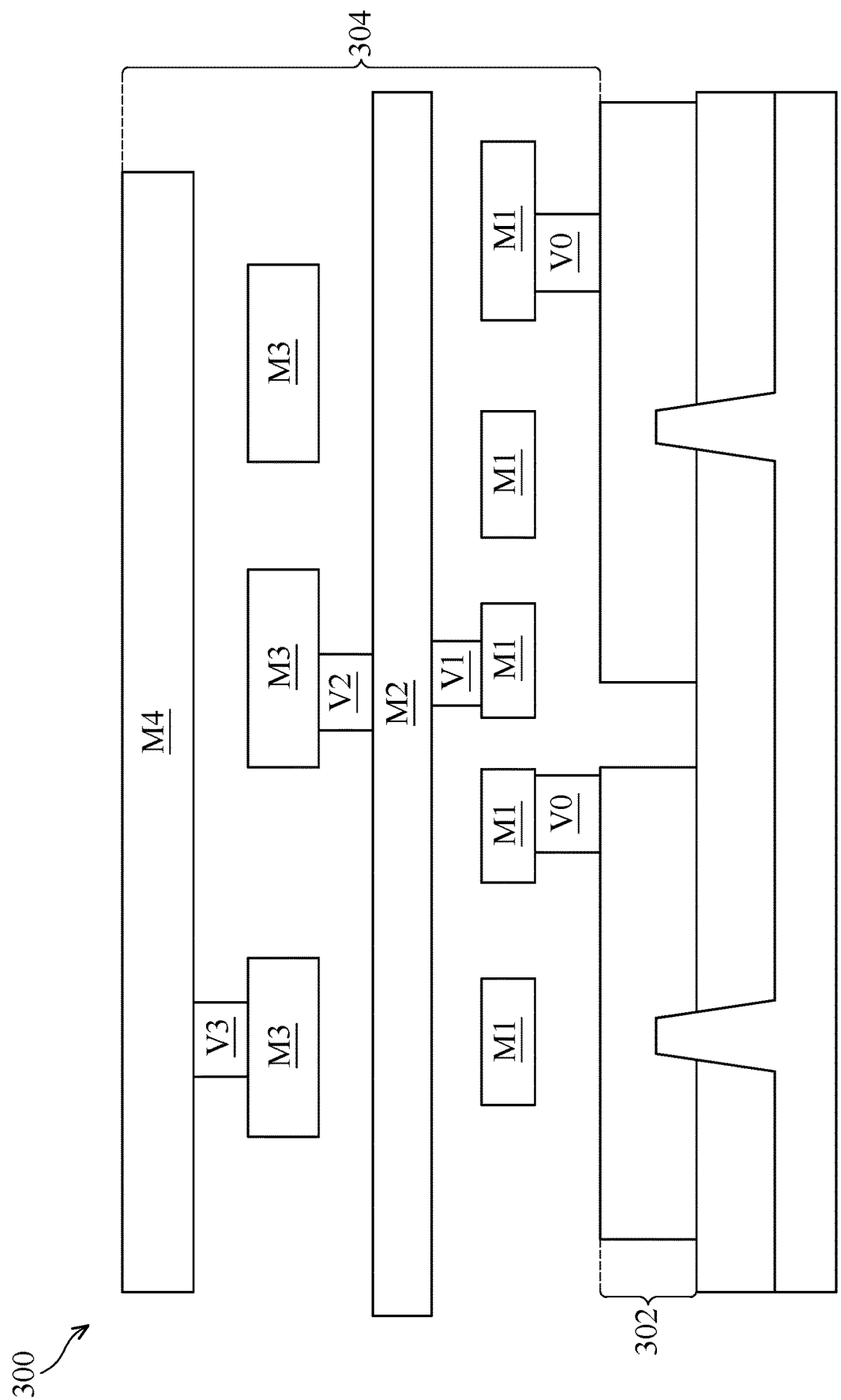
FIG. 4 shows a cross sectional view of a memory device for illustrating an interconnection structure, in accordance with some embodiments of the present disclosure.

FIG. 4 shows a cross sectional view of a memory device 300 for illustrating an interconnection structure, in accordance with some embodiments of the present disclosure. The memory device 300 has device region 302 (also referred to as a device layer) and an interconnection structure 304. The device region 302 is the region where the transistors and main features are located, such as gate, channel, source/drain, contact features, and the transistors (e.g., the transistors of the SRAM cells 100 and 100' discussed above) of the circuit cells discussed above. The interconnection structure 304 is over the device region 302 or at the front-side of the device region 302.

As shown in FIG. 4, the interconnection structure 304 includes metal layer M1, metal layer M2 over the metal layer M1, metal layer M3 over the metal layer M5, and metal layer M4 over the metal layer M3. Each of the metal layers M1, M2, M3, and M4 includes metal conductors The interconnection structure 304 further includes vias V0, V1, V2, and V3 for connecting the metal conductor in the underlying metal layer to the metal conductor in the overlying metal layer. The vias and metal conductors electrically couple various transistors and/or components (for example, gate, source/drain features, resistors, capacitors, and/or inductors) in the device region 302, such that the various devices and/or components can operate as specified by the design requirements of circuit cells (e.g., logic cells and memory cells). It should be noted that there may be more vias and metal conductors for connections. In some embodiments, the vias V1 are connected to the gate structures (gate electrodes) of the transistors. Therefore, the vias V1 connected to the gate structures are also referred to as the gate vias. In some embodiments, the vias and metal conductors are used for the connections of the features of the transistor. In other embodiments, the vias and metal conductors are connected to voltage sources (the supply voltage VDD or the reference voltage VSS discussed above) to provide voltage to the transistors in the device region 302. Therefore, the metal conductors connected to the voltage sources may be also referred to as the voltage metal conductors, the voltage lines, or voltage conductors.

For the operation speed of the read-port (e.g., the read-port PG of the SRAM cell 100) of the two-port SRAM cell is major dominated by transistor on-current and bit-line capacitance, in the present disclosure, the read bit-lines are designed to be located in the lowest metal layer (i.e., the metal layer MD to have lower capacitance (save metal landing pad capacitance if located at higher metal layers). Further, since the read word lines and the write word lines are more care about resistance, the read word lines and the write word lines are designed to be located in the higher metal layer for having larger width. Therefore, in some embodiments, the metal conductors serving as read bit-lines and VDD lines are designed to be located in the metal layer M1; the metal conductors serving as write word-lines are designed to be located in the metal layer M2; the metal conductors serving as write bit-lines and write bit-line-bars are designed to be located in the metal layer M3; and the metal conductors serving as read word-lines are designed to be located in the metal layer M4.

Figure 5A:
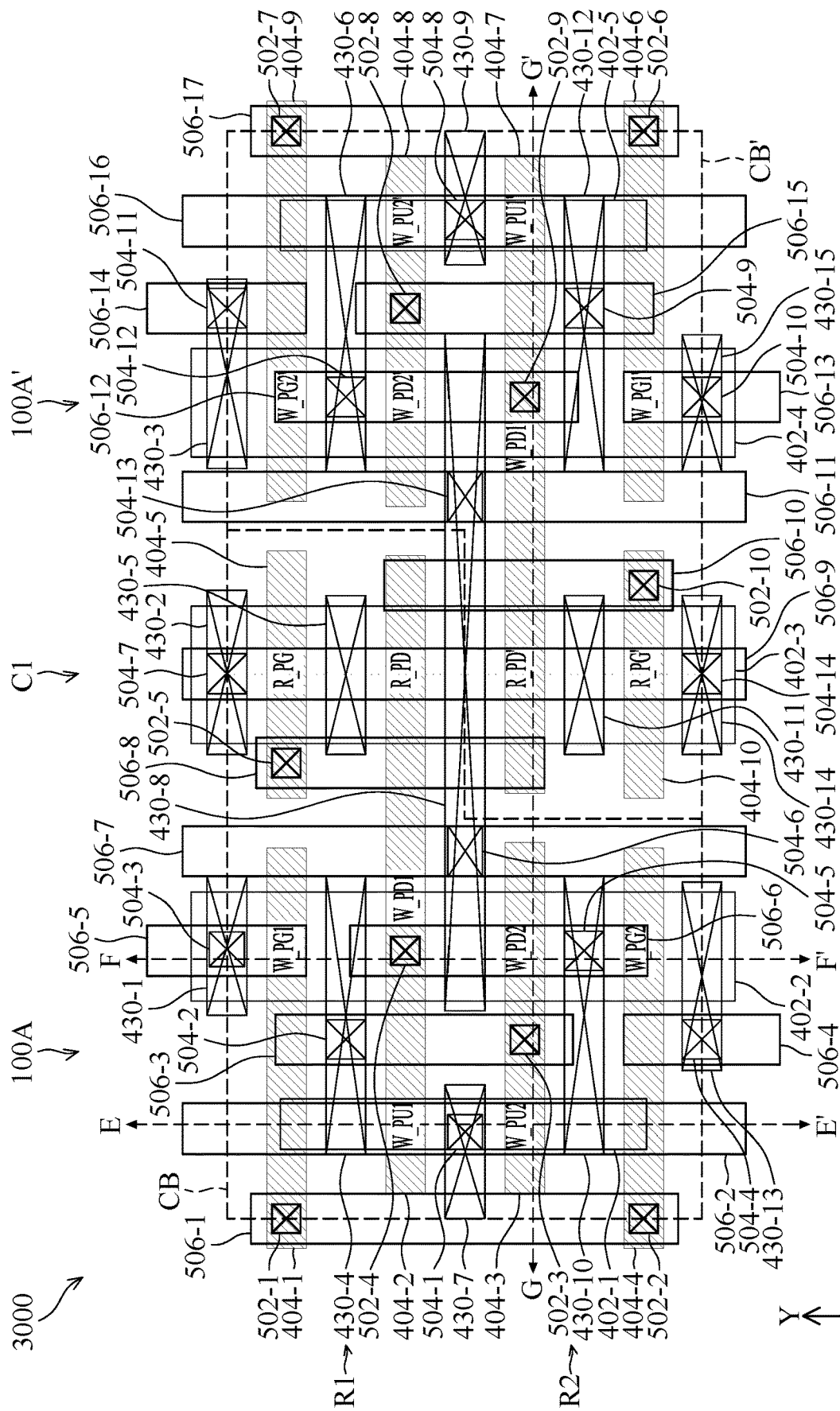
FIGS. 5A, 5B, 5C, and 5D illustrate top views (or layouts) of two adjacent SRAM cells in a portion of a array that can be one embodiment of the SRAM cells implemented in the memory region, in accordance with some embodiments of the present disclosure.
Figure 5B:
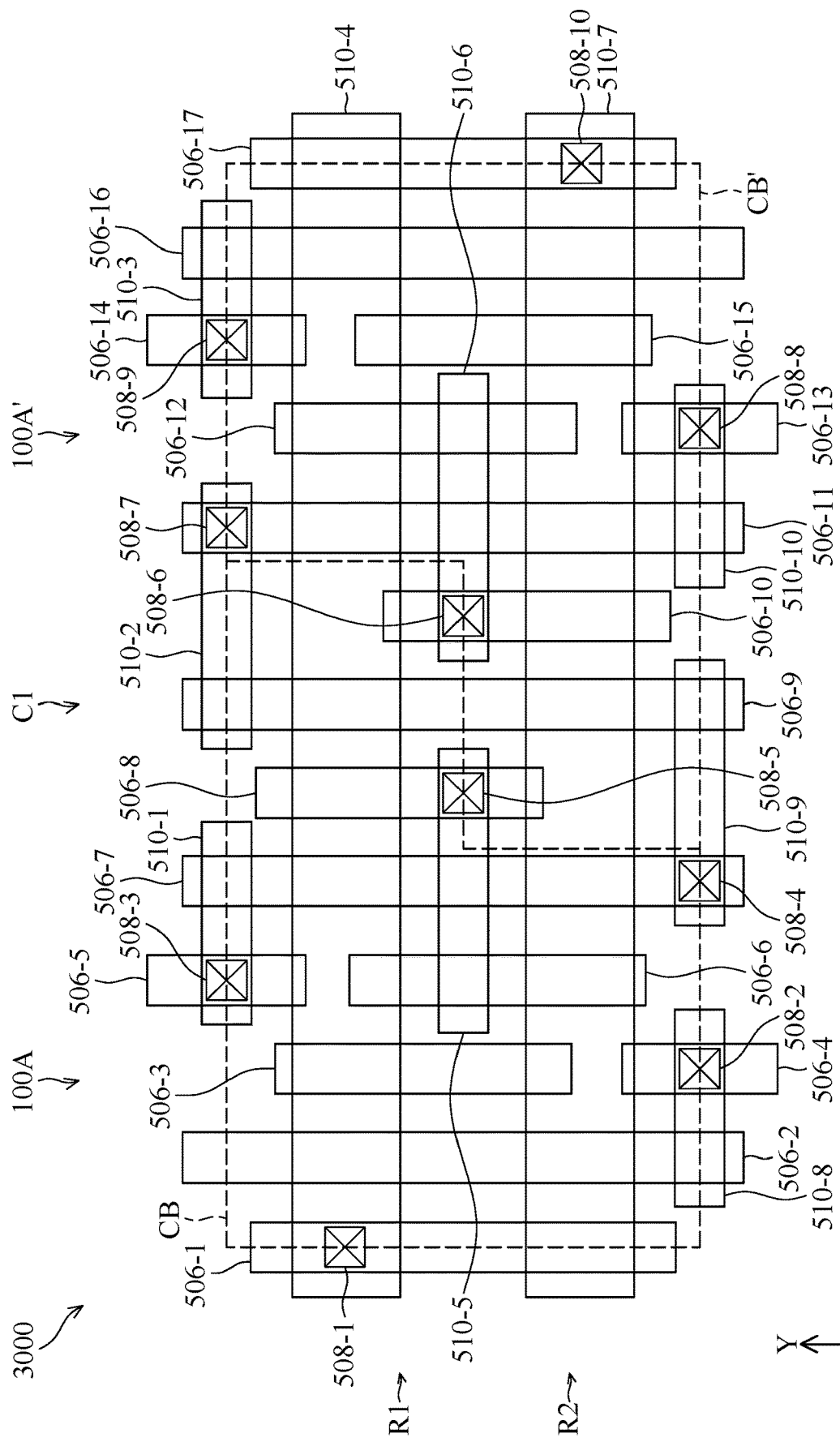
Figure 5C:
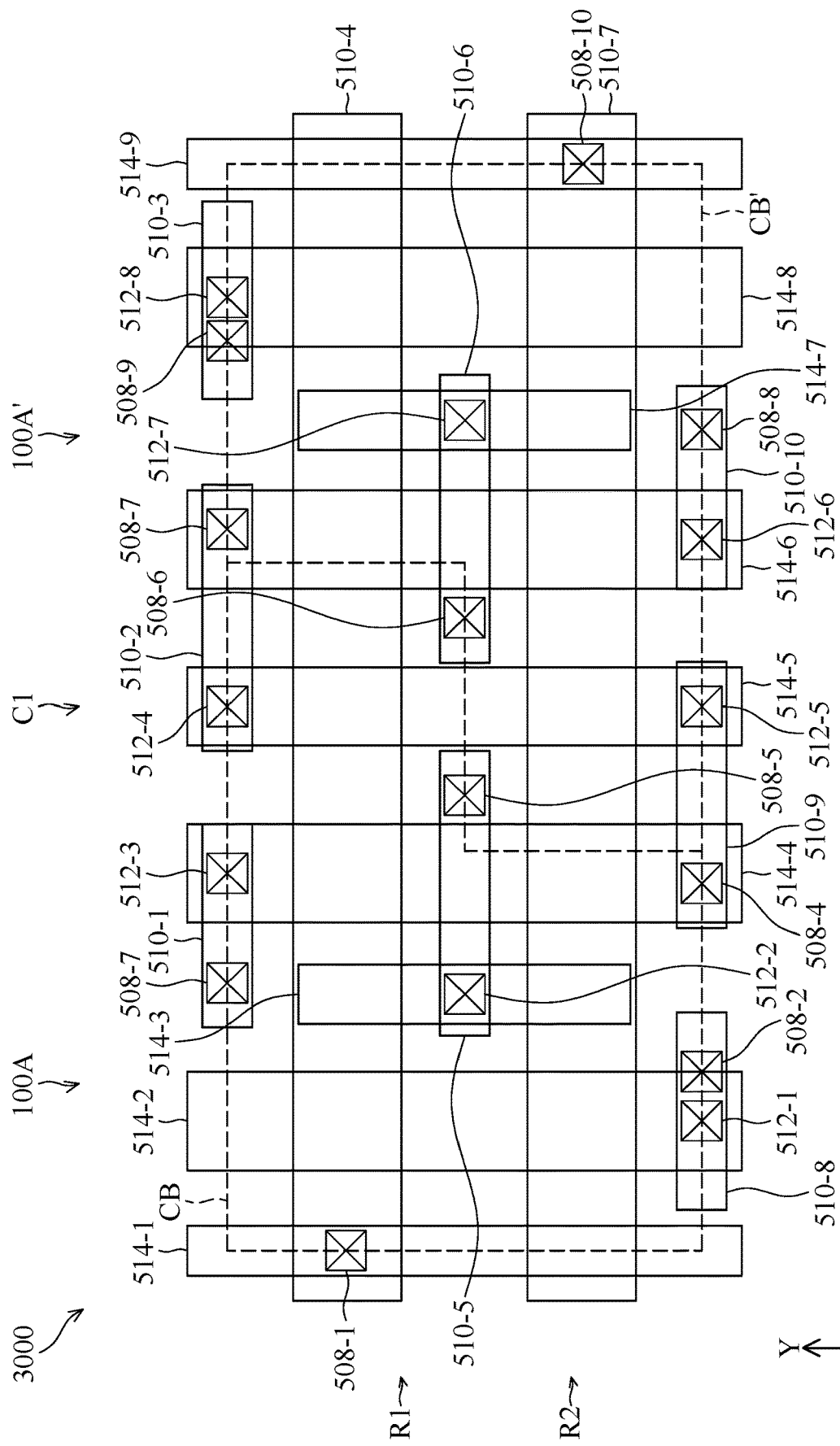
Figure 5D:
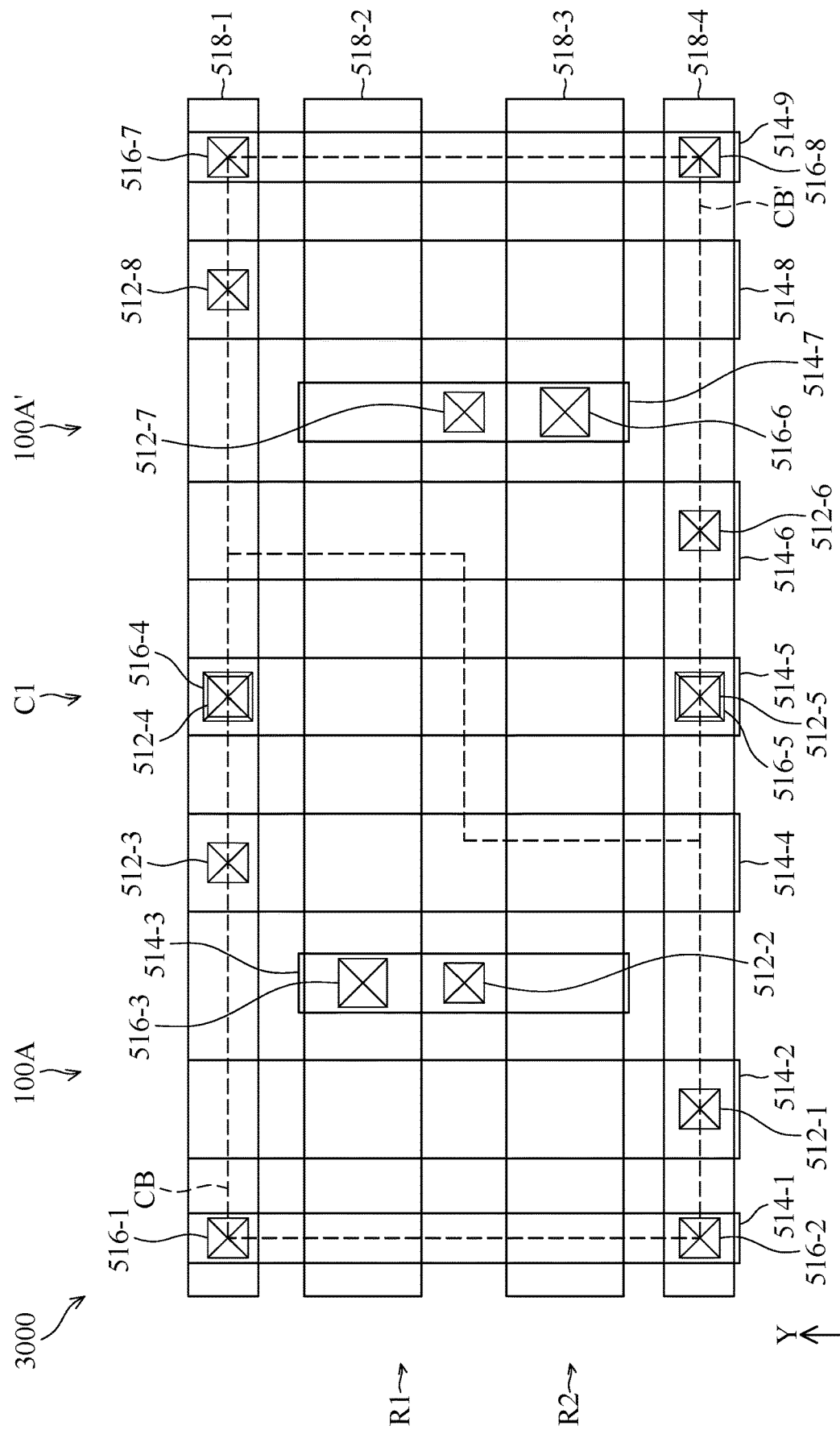
Figure 5E:
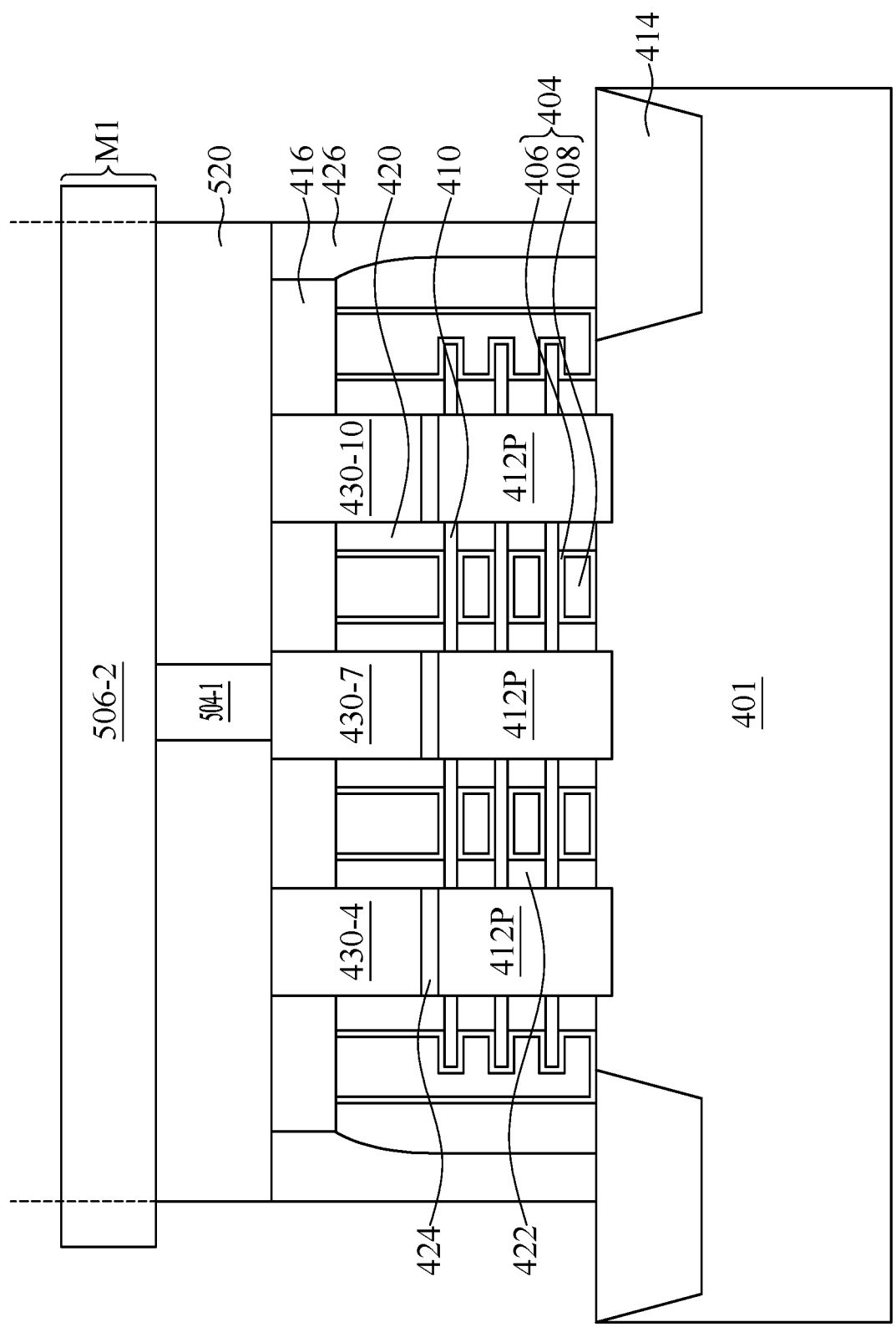
FIG. 5E illustrates a cross sectional view of the array along a line E-E' in FIG. 5A, in accordance with some embodiments of the present disclosure.
Figure 5F:
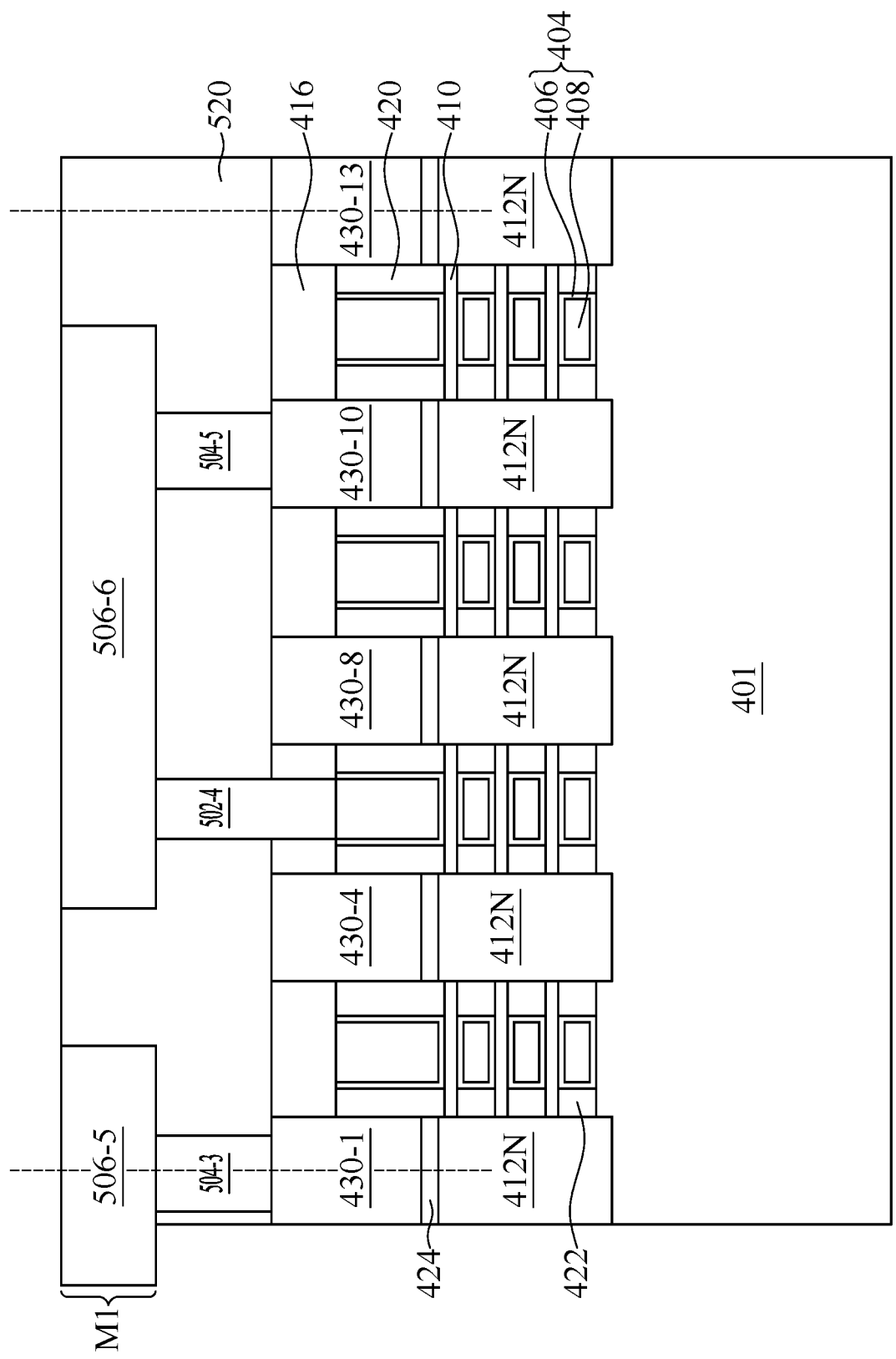
FIG. 5F illustrates a cross sectional view of the array along a line F-F' in FIG. 5A, in accordance with some embodiments of the present disclosure.
Figure 5G:
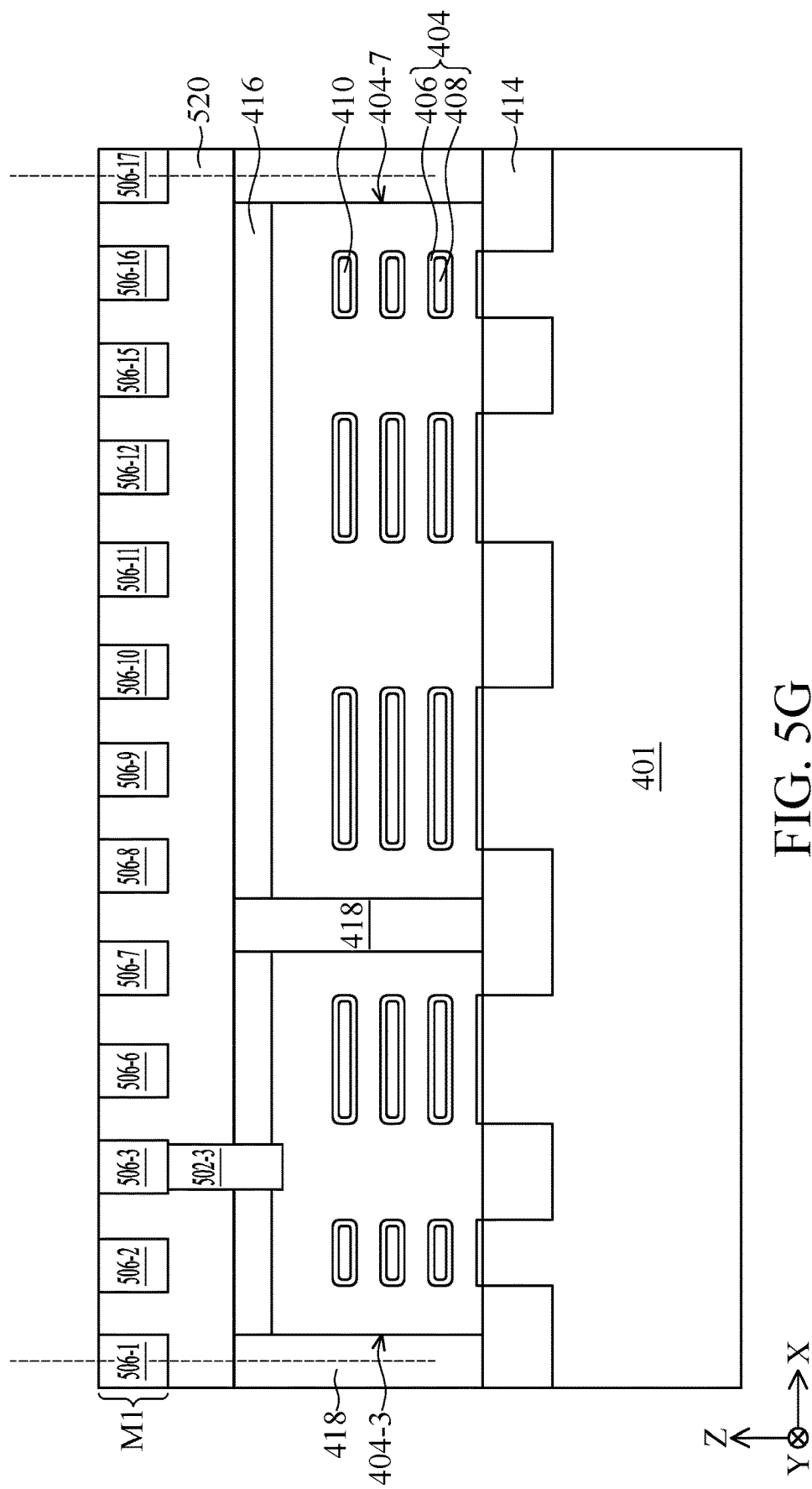
FIG. 5G illustrates a cross sectional view of the array along a line G-G' in FIG. 5A, in accordance with some embodiments of the present disclosure.

FIGS. 5A to 5D illustrate top views (or layouts) of two adjacent SRAM cells 100A and 100A' in a portion of a array 3000 that can be one embodiment of the SRAM cells 100 and 100' implemented in the memory region 20, in accordance with some embodiments of the present disclosure. FIG. 5A illustrates the features in the device region (including transistors), the metal conductors in the first metal layer (M1), and vias vertically between the features and the first metal layer (M1). FIG. 5B illustrates the metal conductors in the first metal layer (M1) and the second metal layer (M2), and vias vertically between the first metal layer (M1) and the second metal layer (M2). FIG. 5C illustrates the metal conductors in the second metal layer (M2) and the third metal layer (M3), vias vertically between the first metal layer (M1) and the second metal layer (M2), and vias vertically between the second metal layer (M2) and the third metal layer (M3). FIG. 5D illustrates the metal conductors in the third metal layer (M3) and the fourth metal layer (M4), vias vertically between the second metal layer (M2) and the third metal layer (M3), and vias vertically between the third metal layer (M3) and the fourth metal layer (M4). FIG. 5E illustrates a cross sectional view of the array 3000 along a line E-E' in FIG. 5A, in accordance with some embodiments of the present disclosure. FIG. 5F illustrates a cross sectional view of the array 3000 along a line F-F' in FIG. 5A, in accordance with some embodiments of the present disclosure. FIG. 5G illustrates a cross sectional view of the array 3000 along a line G-G' in FIG. 5A, in accordance with some embodiments of the present disclosure. For the sake of simplicity, FIGS. 5E to 5G shows the features in the device region, the metal conductors in the first metal layer (M1), and vias vertically between the features and the first metal layer (M1), while the vias and the metal conductors in higher metal layers (higher than the first metal layer (M1)) are omitted.

As shown in FIG. 5A to 5D, the array 3000 shows a row R1 having the SRAM cells 100A' which is abutted and adjacent to the SRAM cells 100A' in a row R2. More specifically, the adjacent two SRAM cells 100A and 100A' are respectively in the adjacent two rows R1 and R2, and are together in a column C1.

The SRAM cells 100A and 100A' each respectively has a cell boundary CB and a cell boundary CB'. The cell boundaries CB and CB' each has a non-rectangular shape (indicated by the dotted rectangular box). More specifically, each of the cell boundaries CB and CB' is L-shaped in a top view (or an X-Y plane view), as shown in FIG. 5A to 5D. Therefore, in some embodiments, the cell boundaries CB and CB' may be referred to as non-rectangular cell boundaries or L-shaped cell boundaries. The SRAM cells 100A and 100A' are abutted together such the cell boundaries CB and CB' are combined to have a rectangular shape.

The array 3000 includes active areas, such as active areas 402-1 to 402-5, (may be collectively referred to as the active areas 402) that extend lengthwise in the Y-direction and are arranged in an X-direction. The active areas 402-1 and 402-2 are used for the SRAM cell 100A; the active areas 402-4 and 402-5 are used for the SRAM cell 100A'; and the active area 402-3 is shared by the SRAM cells 100A and 100A'. Each of active areas 402 includes channel regions, source regions, and drain regions (where source regions and drain regions are collectively referred to as source/drain regions herein) of transistors. The array 3000 further includes gate structures, such as gate structures 404-1 to 404-10 (may be collectively referred to as the gate structures 404) that extend lengthwise in the X-direction. The X-direction and the Y-direction are perpendicular. The gate structures 404-1 to 404-10 are disposed over the channel regions of the respective active areas 402-1 to 402-5 (i.e., vertically stacked) nanostructures 410) and disposed between respective source/drain regions of the active areas 402-1 to 402-5 (i.e., source/drain features 412N and 412P). In some embodiments, the gate structures 404-1 to 404-10 wrap and/or surround suspended, vertically stacked nanostructures 410 in the channel regions of the active areas 402-1 to 402-5, respectively (as shown in FIGS. 5E to 5G).

In the SRAM cell 100A, the gate structure 404-1 extends across the active area 402-2 in the top view and engages the active area 402-2 to form the write-port PG transistor W_PG1; the gate structure 404-2 extends across the active areas 402-1 to 402-3 in the top view and engages the active area 402-1 to 402-3 to respectively form the write-port PU transistor W_PU1, the write-port PD transistor W_PD1, and the read-port PD transistor R_PD; the gate structure 404-3 extends across the active areas 402-1 and 402-2 in the top view and engages the active area 402-1 and 402-2 to respectively form the write-port PU transistor W_PU2 and the write-port PD transistor W_PD2; the gate structure 404-4 extends across the active area 402-2 in the top view and engages the active area 402-2 to form the write-port PG transistor W_PG2; and the gate structure 404-5 extends across the active area 402-3 in the top view and engages the active area 402-3 to form the read-port PG transistor R_PG.

In the SRAM cell 100A', the gate structure 404-6 extends across the active area 402-4 in the top view and engages the active area 402-4 to form the write-port PG transistor W_PG1'; the gate structure 404-7 extends across the active areas 402-3 to 402-53 in the top view and engages the active area 402-3 to 402-5 to respectively form the read-port PD transistor R_PD', the write-port PD transistor W_PD1', and the write-port PU transistor W_PU1'; the gate structure 404-8 extends across the active areas 402-4 and 402-5 in the top view and engages the active area 402-4 and 402-5 to respectively form the write-port PD transistor W_PD2' and the write-port PU transistor W_PU2'; the gate structure 404-9 extends across the active area 402-4 in the top view and engages the active area 402-4 to form the write-port PG transistor W_PG2'; and the gate structure 404-10 extends across the active area 402-3 in the top view and engages the active area 402-3 to form the read-port PG transistor R_PG'.

As shown in FIGS. 5A and 5B, the write-port PU transistor W_PU1 and the write-port PU transistor W_PU2 are arranged in the Y-direction and share the active area 402-1; the write-port PG transistor W_PG1, the write-port PD transistor W_PD1, the write-port PD transistor W_PD2, and the write-port PG transistor W_PG2 are arranged in the Y-direction and share the active area 402-2; the read-port PG transistor R_PG, the read-port PD transistor R_PD, the read-port PD transistor R_PD', and the read-port PG transistor R_PG' are arranged in the Y-direction and share the active area 402-3; the write-port PG transistor W_PG1', the write-port PD transistor W_PD1', the write-port PD transistor W_PD2', and the write-port PG transistor W_PG2' are arranged in the Y-direction and share the active area 402-4; and the write-port PU transistor W_PU1' and the write-port PU transistor W_PU2' are arranged in the Y-direction and share the active area 402-5.

Similar to the substrate 202 discussed above, the array 3000 further includes substrate 401, over which the various features are formed, such as the gate structures 404-1 to 404-10. The substrate 401 may contains a semiconductor material, such as bulk silicon (Si). In some other embodiments, the substrate 401 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). Alternatively, the substrate 401 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding, and/or other suitable methods.

Similar to the isolation feature 218 discussed above, the array 3000 further includes an isolation feature (or isolation structure) 414. The isolation feature 414 may include silicon oxide, silicon nitride, silicon oxynitride, other suitable isolation material (for example, including silicon, oxygen, nitrogen, carbon, or other suitable isolation constituent), or combinations thereof. The isolation feature 414 may include different structures, such as shallow trench isolation (STI) structures, deep trench isolation (DTI) structures, and/or local oxidation of silicon (LOCOS) structures. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

Each of the transistors in the SRAM cell 100A (e.g., the write-port PG transistors W_PG1 and W_PG2, the write-port PD transistors W_PD1 and W_PD2, the write-port PU transistors W_PU1 and W_PU2, the read-port PG transistor R_PG, and the read-port PD transistor R_PD) and the transistors in the SRAM cell 100A' (e.g., the write-port PG transistors W_PG1' and W_PG2', the write-port PD transistors W_PD1' and W_PD2', the write-port PU transistors W_PU1' and W_PU2', the read-port PG transistor R_PG', and the read-port PD transistor R_PD') includes nanostructures 410 similar to the nanostructures 204 discussed above. As shown in FIGS. 5E to 5G, the nanostructures 410 are suspended. In some embodiments, three nanostructures 410 are vertically stacked (or vertically arranged) from each other in the Z-direction for one transistor. However, there may be another appropriate number of nanostructures in one transistor. For example, there may be from 2 to 6 nanostructures 410 in one transistor. The nanostructures 410 further extend lengthwise in the Y-direction (FIGS. 5E and 5F) and widthwise in the X-direction (FIG. 5G). In some embodiments, a width of the nanostructures 410 in the active area 402-3 in the X-direction is greater than a width of the nanostructures 410 in the active areas 402-2 and 402-4, and the width of the nanostructures 410 in the active areas 402-2 and 402-4 is greater than a width of the nanostructures 410 in the active areas 402-1 and 402-5, as shown in FIGS. 5A and 5G. As shown in FIG. 5G, in each of the transistors in the SRAM cell 100A and 100A', three nanostructures 410 are spaced apart from each other in the Z-direction.

The nanostructures 410 may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures 410 include silicon for n-type transistors, such as the write-port PD transistors W_PD1, W_PD2, W_PD1', and W_PD2', the write-port PG transistors W_PG1, W_PG2, W_PG1', and W_PG2', the read-port PD transistors R_PD1 and R_PD', and the read-port PG transistors R_PG and R_PG'. In other embodiments, the nanostructures 410 include silicon germanium for p-type transistors, such as the write-port PU transistors W_PU1, W_PU2, W_PU1', and W_PU2'. In some embodiments, the nanostructures 410 are all made of silicon, and the type of the transistors depend on work function metal layer wrapping around the nanostructures 410. In some embodiments, the nanostructures 410 are epitaxially grown using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized.

Each of the gate structures 404-1 to 404-10 has a gate dielectric layer 406 and a gate electrode layer 408. The gate dielectric layers 406 wrap around each of the nanostructures 410 and the gate electrodes layer 408 wrap around the gate dielectric layer 406. In some embodiments, the gate structures 404 each further includes an interfacial layer (such as having silicon dioxide, silicon oxynitride, or other suitable materials) between the gate dielectric layer 406 and the nanostructures 410. The gate dielectric layers 406 may include oxide with nitrogen doped dielectric material (initial layer) combined with metal content high-K dielectric material (K value (dielectric constant)>13). For example, gate dielectric layers 406 may include hafnium oxide ($HfO_2$), which has a dielectric constant in a range from about 18 to about 40. Alternatively, the gate dielectric layers 406 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric layers 406 may be formed by chemical oxidation, thermal oxidation, ALD, CVD, and/or other suitable methods.

The gate electrode layer 408 is formed to wrap around the gate dielectric layer 406 and the center portions of the nanostructures 410, as shown in FIGS. 5E and 5F. In some embodiments, the gate electrode layer 408 may include an n-type work function metal layer for n-type transistor (such as the write-port PD transistors W_PD1, W_PD2, W_PD1', and W_PD2', the write-port PG transistors W_PG1, W_PG2, W_PG1', and W_PG2', the read-port PD transistors R_PD1 and R_PD', and the read-port PG transistors R_PG and R_PG') or a p-type work function metal layer for p-type transistor (such as the write-port PU transistors W_PU1, W_PU2, W_PU1', and W_PU2'). In an embodiment the n-type work function metal layer is a material such as W, Cu, AlCu, TiAlC, TiAlN, TiAl, Pt, Ti, TiN, Ta, TaN, Co, Ni, Ag, Al, TaAl, TaAlC, TaC, TaCN, TaSiN, Mn, Zr, other suitable n-type work function materials, or combinations thereof. For example, the n-type work function metal layer may be deposited utilizing ALD, CVD, or the like. However, any suitable materials and processes may be utilized to form the n-type work function metal layer. In an embodiment, the p-type work function metal layer may be formed from a metallic material such as W, Al, Cu, TiN, Ti, TiAl, Pt, Ta, TaN, Co, Ni, TaC, TaCN, TaSiN, $TaSi_2$, $NiSi_2$, Mn, Zr, $ZrSi_2$, Ru, AlCu, Mo, $MoSi_2$, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the p-type work function metal layer may be deposited using a deposition process such as ALD, CVD, or the like, although any suitable deposition process may be used.

In some embodiments, the gate electrode layer 408 may include a single layer or alternatively a multi-layer structure. In some embodiments, the gate electrode layer 408 may further include a capping layer, a barrier layer, and a fill material (not shown). The capping layer may be formed adjacent to the gate dielectric layers 406 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as ALD, CVD, or the like, although any suitable deposition process may be used. The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The SRAM cells 100A and 100A' further include gate top dielectric layers 416 are over the gate dielectric layers 406, the gate electrodes 408, and the nanostructures 410. The gate top dielectric layers 416 are similar to the gate top dielectric layer 214 discussed above. The gate top dielectric layer 416 is used for contact etch protection layer. The material of gate top dielectric layer 416 is selected from a group consisting of oxide, SiOC, SiON, SiOCN, nitride base dielectric, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), combinations thereof, or other suitable material.

As shown in FIG. 5G, gate end dielectrics 418 are at ends of the gate structures 404. The gate end dielectrics 418 are used for separating the gate structures 404 aligned in the X-direction. For example, the gate end dielectrics 418 separate the gate structures 404-3 and 404-7, as shown in FIG. 5G. The material of the gate end dielectrics 418 is selected from a group consisting of $Si_3N_4$, nitride-base dielectric, carbon-base dielectric, high K material (K>=9), or a combination thereof.

The SRAM cells 100A and 100A' further include gate spacers 420 are on sidewalls of the gate structures 404 and over the nanostructures 410, as shown in FIGS. 5E and 5F. More specifically, the gate spacers 420 are over the nanostructures 410 and on top sidewalls of the gate structures 404, and thus are also referred to as gate top spacers or top spacers. The gate spacers 420 may include multiple dielectric materials and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 420 may include a single layer or a multi-layer structure.

As shown in FIGS. 5H to 5J, the SRAM cells 100A and 100A' further include inner spacers 422 on the sidewalls of the gate structures 404 and below the topmost nanostructures 410. Furthermore, the inner spacers 422 are laterally between the source/drain features 412N (or 412P) and the gate structures 404. The inner spacers 422 are also vertically between adjacent nanostructures 410. The inner spacers 422 may include a dielectric material having higher K value (dielectric constant) than the gate spacers 420 and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), air gap, or a combination thereof. In some embodiments, the thickness of the gate spacers 420 in the Y-direction and the thickness of the inner spacers 422 in the Y-direction are the same. In other embodiments, the thickness of the gate spacers 420 in the Y-direction is less than the thickness of the inner spacers 422 in the Y-direction due to the gate spacers 420 are trimmed during processes for forming source/drain contacts.

Referring to FIGS. 5E and 5F, the SRAM cells 100A and 100A' further include source/drain features 412N and source/drain features 412P in the source/drain regions of the active areas 402. The source/drain features 412N are disposed over both sides of the respective gate structure 404 and connected by the nanostructures 410 to form n-type transistor (e.g., the write-port PD transistors W_PD1, W_PD2, W_PD1', and W_PD2', the write-port PG transistors W_PG1, W_PG2, W_PG1', and W_PG2', the read-port PD transistors R_PD and R_PD', and the read-port PG transistors R_PG and R_PG'). Similarly, the source/drain features 412P are disposed over both sides of the respective gate structure 404 and connected by the nanostructures 410 to form p-type transistor (e.g., the write-port PU transistors W_PU1, W_PU2, W_PU1', and W_PU2'). Further, every two adjacent transistors in the Y direction share one source/drain feature 412N/412P, as shown in FIGS. 5A, 5E, and 5F.

The source/drain features 412N and 412P may be formed by using epitaxial growth. In some embodiments, the source/drain features 412N may include epitaxially-grown material selected from a group consisting of SiP, SiC, SiPC, SiAs, Si, or a combination thereof. In some embodiments, the epitaxially-grown material of the source/drain features 412N may be doped with phosphorus (or arsenic, or both) having a doping concentration in a range from about $2\times10^{19}/cm^3$ to $3\times10^{21}/cm^3$. In some embodiments, the source/drain features 412P may include epitaxially-grown material selected from a group consisting of boron-doped SiGe, boron-doped SiGeC, boron-doped Ge, boron-doped Si, boron and carbon doped SiGe, or a combination thereof. In some embodiments, the epitaxially-grown material of the source/drain features 412P may be doped with boron having a doping concentration in a range from about $1\times10^{19}/cm^3$ to $6\times10^{20}/cm^3$.

As shown in FIGS. 5E and 5F, the SRAM cells 100A and 100A' further include silicide features 424 over the source/drain features 412N and 412P. The silicide features 424 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (Yb Si), platinum silicide (PtSi), iridium silicide (IrSi), erbium silicide (ErSi), cobalt silicide (CoSi), or other suitable compounds.

Referring to FIGS. 5A, 5E, and 5F, the SRAM cells 100A and 100A' further include source/drain contacts 430 (including source/drain contacts 430-1 to 430-15) in an inter-layer dielectric (ILD) layer 426. As shown in FIGS. 5A, 5E, and 5F, the source/drain contacts 430 extend lengthwise in the X-direction. The source/drain contacts 430 are self-aligned source/drain contacts. This means that the source/drain contacts 430 are formed by using the gate spacers 420 as mask. Therefore, the source/drain contacts 430 are in direct contact with the gate spacers 420, as shown in FIGS. 5E and 5F. In some embodiments, the gate spacers 420 are trimmed due to the gate spacers 420 serving as the mask for forming the source/drain contacts 430. Therefore, the thickness of the gate spacers 420 in the Y-direction is less than the thickness of the inner spacers 422 in the Y-direction, as discussed above.

In the top view, as shown in FIG. 5A, the source/drain contacts 430-1, 430-2, 430-13 lengthwise overlap the cell boundary CB, the source/drain contacts 430-3, 430-14, 430-15 lengthwise overlap the cell boundary CB', and the source/drain contact 430-8 lengthwise overlap the cell boundaries CB and CB'.

In the top view, the source/drain contact 430-1 is adjacent to the gate structure 404-1 (or is adjacent to the write-port PG transistor W_PG1) in the Y-direction; the source/drain contact 430-2 is adjacent to the gate structure 404-5 (or is adjacent to the read-port PG transistor R_PG) in the Y-direction; the source/drain contact 430-3 is adjacent to the gate structure 404-9 (or is adjacent to the write-port PG transistor W_PG2') in the Y-direction; the source/drain contact 430-4 is between the gate structures 404-1 and 404-2 (or between the write-port PG transistor W_PG1 and the write-port PD transistor W_PD1) in the Y-direction; the source/drain contact 430-5 is between the gate structures 404-5 and 404-2 (or between the read-port PG transistor R_PG and the read-port PD transistor R_PD) in the Y-direction; the source/drain contact 430-6 is between the gate structures 404-8 and 404-9 (or between the write-port PG transistor W_PG2' and the write-port PD transistor W_PD2') in the Y-direction; the source/drain contact 430-7 is between the gate structures 404-2 and 404-3 (or between the write-port PU transistors W_PU1 and W_PU2) in the Y-direction; the source/drain contact 430-8 is between the gate structures 404-2 and 404-3, between the gate structures 404-2 and 404-7, and between the gate structures 404-7 and 404-8 (or between the write-port PD transistors W_PD1 and W_PD2, between the read-port PD transistors R_PD and R_PD', and between the write-port PD transistors W_PD1' and W_PD2') in the Y-direction; the source/drain contact 430-9 is between the gate structures 404-7 and 404-8 (or between the write-port PU transistors W_PU1' and W_PU2') in the Y-direction; the source/drain contact 430-10 is between the gate structures 404-3 and 404-4 (or between the write-port PG transistor W_PG2 and the write-port PD transistor W_PD2) in the Y-direction; the source/drain contact 430-11 is between the gate structures 404-10 and 404-7 (or between the read-port PG transistor R_PG' and the read-port PD transistor R_PD') in the Y-direction; the source/drain contact 430-12 is between the gate structures 404-6 and 404-7 (or between the write-port PG transistor W_PG1' and the write-port PD transistor W_PD1') in the Y-direction; the source/drain contact 430-13 is adjacent to the gate structure 404-4 (or is adjacent to the write-port PG transistor W_PG2) in the Y-direction; the source/drain contact 430-14 is adjacent to the gate structure 404-10 (or is adjacent to the read-port PG transistor R_PG') in the Y-direction; and the source/drain contact 430-15 is adjacent to the gate structure 404-6 (or is adjacent to the write-port PG transistor W_PG1') in the Y-direction.

Furthermore, each of the source/drain contacts 430 is over and electrically connected to the respective source/drain features 412N/412P. Specifically, as shown in FIGS. 5A, 5E, and 5F, the source/drain contact 430-1 is over and electrically connected to the source/drain feature 412N of the write-port PG transistor W_PG1; the source/drain contact 430-2 is over and electrically connected to the source/drain feature 412N of the read-port PG transistor R_PG; the source/drain contact 430-3 is over and electrically connected to the source/drain feature 412N of the write-port PG transistor W_PG2'; the source/drain contact 430-4 is over and electrically connected to the source/drain feature 412N shared by the write-port PG transistor W_PG1 and the write-port PD transistor W_PD1 (also referred to as common source/drain or common drain) and the source/drain feature 412P of the write-port PU transistor W_PU1, which corresponds to the data node ND shown in FIG. 2; the source/drain contact 430-5 is over and electrically connected to the source/drain feature 412N shared by the read-port PG transistor R_PG and the read-port PD transistor R_PD; the source/drain contact 430-6 is over and electrically connected to the source/drain feature 412N shared by the write-port PG transistor W_PG2' and the write-port PD transistor W_PD2' (also referred to as common source/drain or common drain) and the source/drain feature 412P of the write-port PU transistor W_PU2', which corresponds to the data node NDB' shown in FIG. 2; the source/drain contact 430-7 is over and electrically connected to the source/drain feature 412P shared by the write-port PU transistors W_PU1 and W_PU2; the source/drain contact 430-8 is over and electrically connected to the source/drain feature 412N shared by the write-port PD transistor W_PD1 and W_PD2, the source/drain feature 412N shared by the read-port PD transistors R_PD and R_PD', and the source/drain feature 412N shared by the write-port PD transistor W_PD1' and W_PD2'; the source/drain contact 430-9 is over and electrically connected to the source/drain feature 412P shared by the write-port PU transistors W_PU1' and W_PU2'; the source/drain contact 430-10 is over and electrically connected to the source/drain feature 412N shared by the write-port PG transistor W_PG2 and the write-port PD transistor W_PD2 (also referred to as common source/drain or common drain) and the source/drain feature 412P of the write-port PU transistor W_PU2, which corresponds to the data node NDB shown in FIG. 2; the source/drain contact 430-11 is over and electrically connected to the source/drain feature 412N shared by the read-port PG transistor R_PG' and the read-port PD transistor R_PD'; the source/drain contact 430-12 is over and electrically connected to the source/drain feature 412N shared by the write-port PG transistor W_PG1' and the write-port PD transistor W_PD1' (also referred to as common source/drain or common drain) and the source/drain feature 412P of the write-port PU transistor W_PU1', which corresponds to the data node ND' shown in FIG. 2; the source/drain contact 430-13 is over and electrically connected to the source/drain feature 412N of the write-port PG transistor W_PG2; the source/drain contact 430-14 is over and electrically connected to the source/drain feature 412N of the read-port PG transistor R_PG'; and the source/drain contact 430-15 is over and electrically connected to the source/drain feature 412N of the write-port PG transistor W_PG1'.

The source/drain contacts 430 may each include a conductive material such as Al, Cu, W, Co, Ti, Ta, Ru, Rh, Ir, Pt, TiN, TiAl, TiAlN, TaN, TaC, combinations of these, or the like, although any suitable material may be deposited using a deposition process such as sputtering, CVD, electroplating, electroless plating, or the like. In some embodiments, the source/drain contacts 430 may each include single conductive material layer or multiple conductive layers.

As shown in FIGS. 5A to 5G, the SRAM cells 100A and 100A' further include gate vias 502 (including gate vias 502-1 to 502-10), vias 504 (including vias 504-1 to 504-14), metal conductors 506 (including metal conductors 506-1 to 506-17), vias 508 (including vias 508-1 to 508-10), metal conductors 510 (including metal conductors 506-1 to 506-10), vias 512 (including vias 512-1 to 512-8), metal conductors 514 (including metal conductors 514-1 to 514-9), vias 516 (including vias 512-1 to 512-8), and metal conductors 518 (including metal conductors 518-1 to 518-4), and an inter-metal dielectric (IMD) layer 520, which are over the transistors in the SRAM cells 100A and 100A' (e.g., the write-port PG transistors W_PG1, W_PG2, W_PG1', and W_PG2', the write-port PD transistors W_PD1, W_PD2, W_PD1', and W_PD2', the write-port PU transistors W_PU1, W_PU2, W_PU1', and W_PU2', the read-port PG transistors R_PG and R_PG', and the read-port PD transistors R_PD and R_PD').

The gate vias 502, vias 504, 508, 512, and 516, and metal conductors 506, 510, 514, and 518 are in the IMD layer 520. The metal conductors 506, 510, 514, and 518 are respectively in the metal layers M1, M2, M3, and M4, as discussed above.

Therefore, the metal conductors 510 are over the metal conductors 506, the metal conductors 514 are over the metal conductors 510, and the metal conductors 518 are over the metal conductors 514. As show in FIGS. 5A to 5D, the metal conductors 506 and 514 extend lengthwise in the Y-direction, and the metal conductors 510 and 518 extend lengthwise in the X-direction.

Each of the gate vias 502 is vertically between and electrically connected to the respective gate structure 404 and the respective metal conductor 506. Each of the vias 504 is vertically between and electrically connected to the respective source/drain contact 430 and the respective metal conductor 506. Each of the vias 508 is vertically between and electrically connected to the respective metal conductor 506 and the respective metal conductor 510. Each of the vias 512 is vertically between and electrically connected to the respective metal conductor 510 and the respective metal conductor 514. Each of the vias 516 is vertically between and electrically connected to the respective metal conductor 514 and the respective metal conductor 518. In some embodiments, the gate vias 502, vias 504, 508, 512, and 516 may have a rectangular shape in the top view. In other embodiments, gate vias 502, vias 504, 508, 512, and 516 may have a circular shape in the top view.

As discussed above, connections of the SRAM cells 100A and 100A' correspond to the circuit of the SRAM cells 100 and 100' shown in FIG. 2. In some embodiments, the metal conductor 506-9 serves as the read bit-line RBL discussed above that shared by the SRAM cells 100A and 100A'. More specifically, the metal conductor 506-9 serving as the read bit-line RBL is shared by the read-port PG transistors R_PG and R_PG'.

As shown in FIG. 5A, the metal conductor 506-9 is over the read-port PG transistors R_PG and R_PG' and the read-port PD transistors R_PD and R_PD'. In some embodiments, the metal conductor 506-9 overlaps the active are 402-3 in the Y-direction and in the top view. The metal conductor 506-9 is electrically connected to the source/drain feature 412N of the read-port PG transistor R_PG through the via 504-7 and the source/drain contact 430-2 and electrically connected to the source/drain feature 412N of the read-port PG transistor R_PG' through the via 504-14 and the source/drain contact 430-14. As shown in FIG. 5A, in the top view, the via 504-7 overlaps the cell boundary CB, and the via 504-14 overlaps the cell boundary CB'. In some embodiments, the metal conductor 506-9 may be referred to as read bit-line conductor.

In some embodiments, the metal conductors 506-2 and 506-16 serves as VDD lines that are electrically coupled to a voltage source (not shown) (e.g., the supply voltage VDD discussed above) and electrically connected to the source/drain features of the write-port PU transistors. As shown in FIG. 5A, the metal conductor 506-2 is over the write-port PU transistors W_PU1 and W_PU2, and the metal conductor 506-16 is over the write-port PU transistors W_PU1' and W_PU2'. In some embodiments, the metal conductor 506-2 overlaps the active are 402-1 in the Y-direction and in the top view, and the metal conductor 506-16 overlaps the active are 402-5 in the Y-direction and in the top view.

As shown in FIG. 5A, for the SRAM cell 100A, the metal conductor 506-2 is electrically connected to the source/drain feature 412P shared by the write-port PU transistors W_PU1 and W_PU2 through the via 504-1 and the source/drain contact 430-7. For the SRAM cell 100A', the metal conductor 506-16 is electrically connected to the source/drain feature 412P shared by the write-port PU transistors W_PU1' and W_PU2' through the via 504-8 and the source/drain contact 430-9. In some embodiments, the metal conductors 506-2 and 506-16 may be referred to as the VDD conductors or the VDD lines.

In some embodiments, the metal conductors 506-3, 506-15, 506-6, and 506-12 also respective serve as data node ND, ND', NDB, and NDB' as discussed above. In the top view, as shown in FIG. 5A, the metal conductor 506-3 is across the gate structures 404-2 and 404-3 and the source/drain contact 430-4; the metal conductor 506-6 is across the gate structures 404-2 and 404-3 and the source/drain contact 430-10; the metal conductor 506-12 is across the gate structures 404-7 and 404-8 and the source/drain contact 430-6; and the metal conductor 506-15 is across the gate structures 404-7 and 404-8 and the source/drain contact 430-12.

As shown in FIG. 5A, for the SRAM cell 100A, the metal conductor 506-3 is electrically connected to the source/drain contact 430-4 (thus also electrically connected to the source/drain feature 412N shared by the write-port PG transistor W_PG1 and the write-port PD transistor W_PD1 and the source/drain feature 412P of the write-port PU transistor W_PU1) through the via 504-2 and the gate structure 404-3 through the gate via 502-3; the metal conductor 506-6 is electrically connected to the source/drain contact 430-10 (thus also electrically connected to the source/drain feature 412N shared by the write-port PG transistor W_PG2 and the write-port PD transistor W_PD2 and the source/drain feature 412P of the write-port PU transistor W_PU2) through the via 504-5 and the gate structure 404-2 through the gate via 502-4.

For the SRAM cell 100A', the metal conductor 506-15 is electrically connected to the source/drain contact 430-12 (thus also electrically connected to the source/drain feature 412N shared by the write-port PG transistor W_PG1' and the write-port PD transistor W_PD1' and the source/drain feature 412P of the write-port PU transistor W_PU1') through the via 504-9 and the gate structure 404-8 through the gate via 502-8; the metal conductor 506-12 is electrically connected to the source/drain contact 430-6 (thus also electrically connected to the source/drain feature 412N shared by the write-port PG transistor W_PG2' and the write-port PD transistor W_PD2' and the source/drain feature 412P of the write-port PU transistor W_PU2') through the via 504-12 and the gate structure 404-7 through the gate via 502-9.

Since the metal conductor 506-3 is connected to the source/drain contact 430-4 that corresponds to the data node ND, the metal conductor 506-15 is connected to the source/drain contact 430-12 that corresponds to the data node ND', the metal conductor 506-6 is connected to the source/drain contact 430-10 that corresponds to the data node NDB, and the metal conductor 506-12 is connected to the source/drain contact 430-6 that corresponds to the data node NDB', the metal conductors 506-3, 506-15, 506-6, and 506-12 may also be referred to as data node lines or data node conductors.

In some embodiments, the metal conductors 510-4 and 510-7 respectively serve as the write word-lines WWL and WWL' discussed above that controls and electrically connected to the gate structures (more specifically, the gate electrodes) of the write-port PG transistors. As shown in FIGS. 5A and 5B, for the SRAM cell 100A, the metal conductor 510-4 is electrically connected to the gate structure 404-1 of the write-port PG transistor W_PG1 through the via 508-1, the metal conductor 506-1, and the gate via 502-1, and is electrically connected to the gate structure 404-4 of the write-port PG transistor W_PG2 through the via 508-1, the metal conductor 506-1, and the gate via 502-2. For the SRAM cell 100A', the metal conductor 510-7 is electrically connected to the gate structure 404-6 of the write-port PG transistor W_PG1' through the via 508-10, the metal conductor 506-17, and the gate via 502-6, and is electrically connected to the gate structure 404-9 of the write-port PG transistor W_PG2' through the via 508-10, the metal conductor 506-17, and the gate via 502-7.

As shown in FIGS. 5A and 5B, in the top view, the via 508-1 and the gate vias 502-1 and 502-2 overlap the cell boundary CB, and the via 508-10 and the gate vias 502-6 and 502-7 overlap the cell boundary CB'. Furthermore, in the top view, the metal conductor 506-1 lengthwise overlaps the cell boundary CB and the metal conductor 506-17 lengthwise overlaps the cell boundary CB'. In some embodiments, the metal conductors 510-4 and 510-7 may be referred to as write word-line conductors. In some embodiments, the metal conductors 506-1 and 506-14 may be referred to as write word-line landing pads.

In some embodiments, the metal conductors 514-4, 514-2, 514-6, and 514-8 respectively serve as the write bit-line WBL, the write bit-line-bar WBLB, the write bit-line WBL', and the write bit-line-bar WBLB' discussed above that electrically connected to the source/drain features of the write-port PG transistors. As shown in FIGS. 5A to 5C, for the SRAM cell 100A, the metal conductor 514-4 is electrically connected to the source/drain feature 412N of the write-port PG transistor W_PG1 through the via 512-3, the metal conductor 510-1, the via 508-3, the metal conductor 506-5, the via 504-3, and the source/drain contact 430-1; and the metal conductor 514-2 is electrically connected to the source/drain feature 412N of the write-port PG transistor W_PG2 through the via 512-1, the metal conductor 510-8, the via 508-2, the metal conductor 506-4, the via 504-4, and the source/drain contact 430-13.

For the SRAM cell 100A', the metal conductor 514-6 is electrically connected to the source/drain feature 412N of the write-port PG transistor W_PG1' through the via 512-6, the metal conductor 510-10, the via 508-8, the metal conductor 506-13, the via 504-10, and the source/drain contact 430-15; and the metal conductor 514-8 is electrically connected to the source/drain feature 412N of the write-port PG transistor W_PG2' through the via 512-8, the metal conductor 510-3, the via 508-9, the metal conductor 506-14, the via 504-11, and the source/drain contact 430-3.

As shown in FIGS. 5A to 5C, in the top view, the vias 512-1, 512-3, 508-2, 508-3, 504-3, 504-4 overlap the cell boundary CB, and the vias 512-6, 512-8, 508-8, 508-9, 504-10, 504-11 overlap the cell boundary CB'. Furthermore, in the top view, the metal conductors 510-1, 510-8 lengthwise overlap the cell boundary CB and the metal conductors 510-3, 510-10 lengthwise overlap the cell boundary CB'. In some embodiments, the metal conductors 514-4 and 514-6 may be referred to as write bit-line conductors, and the metal conductors 514-2 and 514-8 may be referred to as write bit-line-bar conductors. In some embodiments, the metal conductors 510-1, 510-10, 506-5, and 506-13 may be referred to as write bit-line landing pads, and the metal conductors 510-3, 510-8, 506-4, and 506-14 may be referred to as write bit-line-bar landing pads.

In some embodiments, the metal conductors 518-2 and 518-3 respectively serve as the read word-lines RWL and RWL' discussed above that controls and electrically connected to the gate structures (more specifically, the gate electrodes) of the read-port PG transistors. As shown in FIGS. 5A to 5D, for the SRAM cell 100A, the metal conductor 518-2 is electrically connected to the gate structure 404-5 of the read-port PG transistor R_PG through the via 516-3, the metal conductor 514-3, the via 512-2, the metal conductor 510-5, the via 508-5, the metal conductor 506-8, and the gate via 502-5. For the SRAM cell 100A', the metal conductor 518-3 is electrically connected to the gate structure 404-10 of the read-port PG transistor R_PG' through the via 516-6, the metal conductor 514-7, the via 512-7, the metal conductor 510-6, the via 508-6, the metal conductor 506-10, and the gate via 502-10. In some embodiments, the metal conductors 518-2 and 518-3 may be referred to as read word-line conductor. In some embodiments, the metal conductors 514-3, 514-7, 510-5, 510-6, 506-8, and 506-10 may be referred to as read word-line landing pads.

The metal conductors 506-7, 506-11, 514-1, 514-5, 514-9, 518-1, and 518-4 serve as VSS lines that are coupled together, electrically coupled to a voltage source (not shown) (e.g., the reference voltage VSS discussed above), and electrically connected to the source/drain features of the write-port PD transistors and the read-port PD transistors. As shown in FIG. 5A, the metal conductor 506-7 and 506-11 are electrically connected to the source/drain feature 412N shared by the write-port PD transistor W_PD1 and W_PD2, the source/drain feature 412N shared by the read-port PD transistors R_PD and R_PD', and the source/drain feature 412N shared by the write-port PD transistor W_PD1' and W_PD2' through the via 504-6, 504-13 and the source/drain contact 430-8. As shown in FIG. 5C, the metal conductor 514-5 is electrically connected to the metal conductor 506-7 through the via 512-5, the metal conductor 510-9, and the via 508-4, and is electrically connected to the metal conductor 506-11 through the via 512-4, the metal conductor 510-2, the via 508-7. In some embodiments, the metal conductors 510-2 and 510-9 serve as and be referred to as VSS local connections. As shown in FIG. 5D, the metal conductor 518-1 is electrically connected to the metal conductor 514-5 through the via 516-4; and the metal conductor 518-4 is electrically connected to the metal conductor 514-5 through the via 516-5.

In some embodiments, the array 3000 further includes the metal conductors 514-1 and 514-9 in the metal layer M3 for other SRAM cells or isolation, as show in FIGS. 5C and 5D. Further, the metal conductor 518-1 is electrically connected to the metal conductors 514-1 and 514-9 respectively through the vias 516-1 and 516-7; and the metal conductor 518-4 is electrically connected to the metal conductors 514-1 and 514-9 respectively through the vias 516-2 and 516-8. As such, the metal conductors 506-7, 506-11, 510-2, 510-9, 514-1, 514-5, 514-9, 518-1, and 518-4 and vias 504-6, 504-13, 508-4, 508-7, 512-4, 512-5, 516-1, 516-2, 516-4, 516-5, 516-7, and 516-8 may construct a power mesh to supply the reference voltage VSS to the write-port PD transistors and the read-port PD transistors.

As shown in FIGS. 5A to 5C, in the top view, the via 508-4, 512-4, 516-1, 516-2, and 516-4 overlap the cell boundary CB, and the vias 508-7, 512-5, 516-5, 516-7, and 516-8 overlap the cell boundary CB'. Furthermore, in the top view, the metal conductor 514-1 lengthwise overlaps the cell boundary CB, the metal conductor 514-9 lengthwise overlaps the cell boundary CB', and the metal conductors 510-2, 510-9, 518-1, and 518-4 lengthwise overlap the cell boundaries CB and CB'. In some embodiments, the metal conductors 506-7, 506-11, 514-1, 514-5, 514-9, 518-1, and 518-4 may be referred to as VSS conductors or VSS lines.

The ILD layer 426 and the IMD 520 each may include one or more dielectric layers including dielectric materials, such as tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or a combination thereof.

The materials of the gate vias 502, the vias 504, the metal conductors 506, the vias 508, the metal conductors 510, the vias 512, the metal conductors 514, the vias 516, and the metal conductors 518 are selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof.

As shown in FIGS. 5A to 5D, the metal conductors 510-4 and 510-7 respectively serving as the write word-line and the metal conductors respectively serving as the read word-lines are more concerned about the resistance, so that the metal conductors 606-2 and 606-4 may be disposed at the higher metal layer to have more space, thereby it may be designed with wider width to reduce the resistance. In some embodiments, the metal conductors 510-4, 510-7, 518-2, and 518-3 may have the widest width than other metal conductors, as shown in FIGS. 5A to 5D. Furthermore, metal conductors 514-2, 514-4, 514-6, and 514-8 may also be designed with wider width, so that reducing the circuit resistance. In addition, the metal conductor 506-9 serving as the read bit-line is more concerned about the capacitance, so that the metal conductors 506-6 and 506-7 are preferred to put in lowest level metallization layer (e.g., the metal layer M1 discussed above) for bit-line capacitance reduction. This is also means that the crowded space at the interconnection structure in existing technologies are relieved to reduce the routing complexity of the SRAM cells.

Figure 6A:
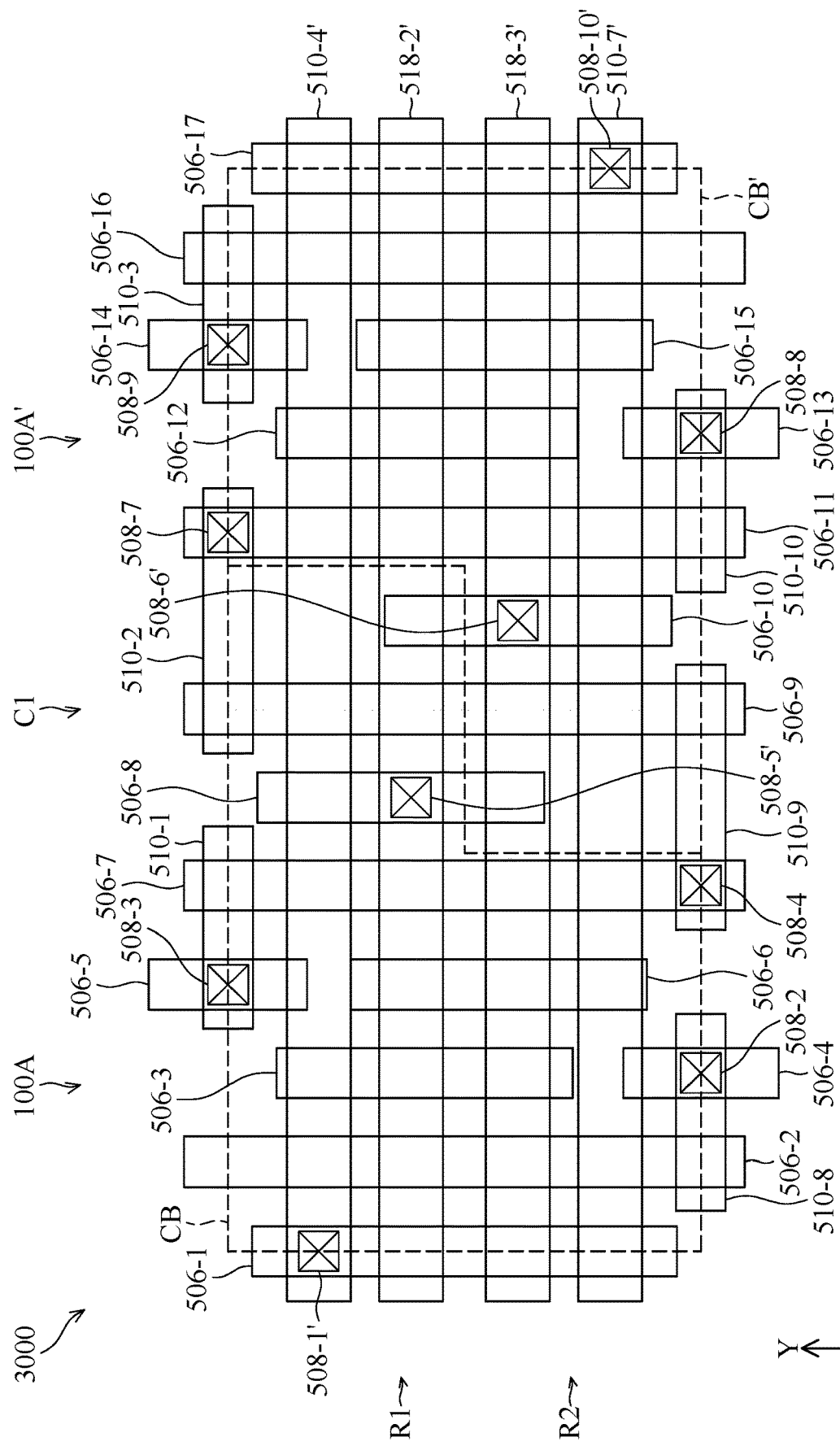
FIGS. 6A, 6B, and 6C illustrate top views (or layouts) of one embodiment of the interconnection structure (including vias and metal conductors) for two adjacent SRAM cells, in accordance with some embodiments of the present disclosure.
Figure 6B:
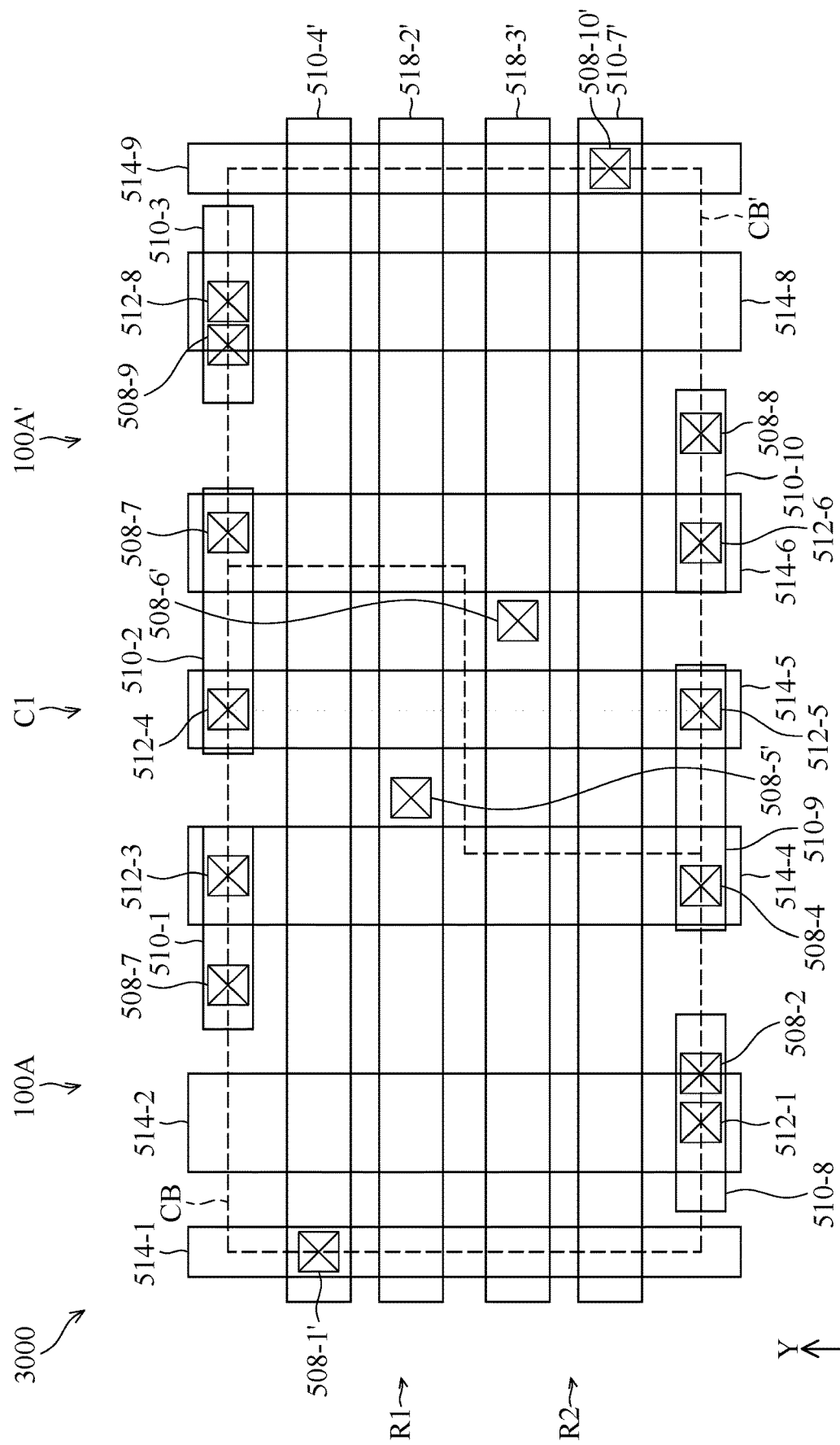
Figure 6C:
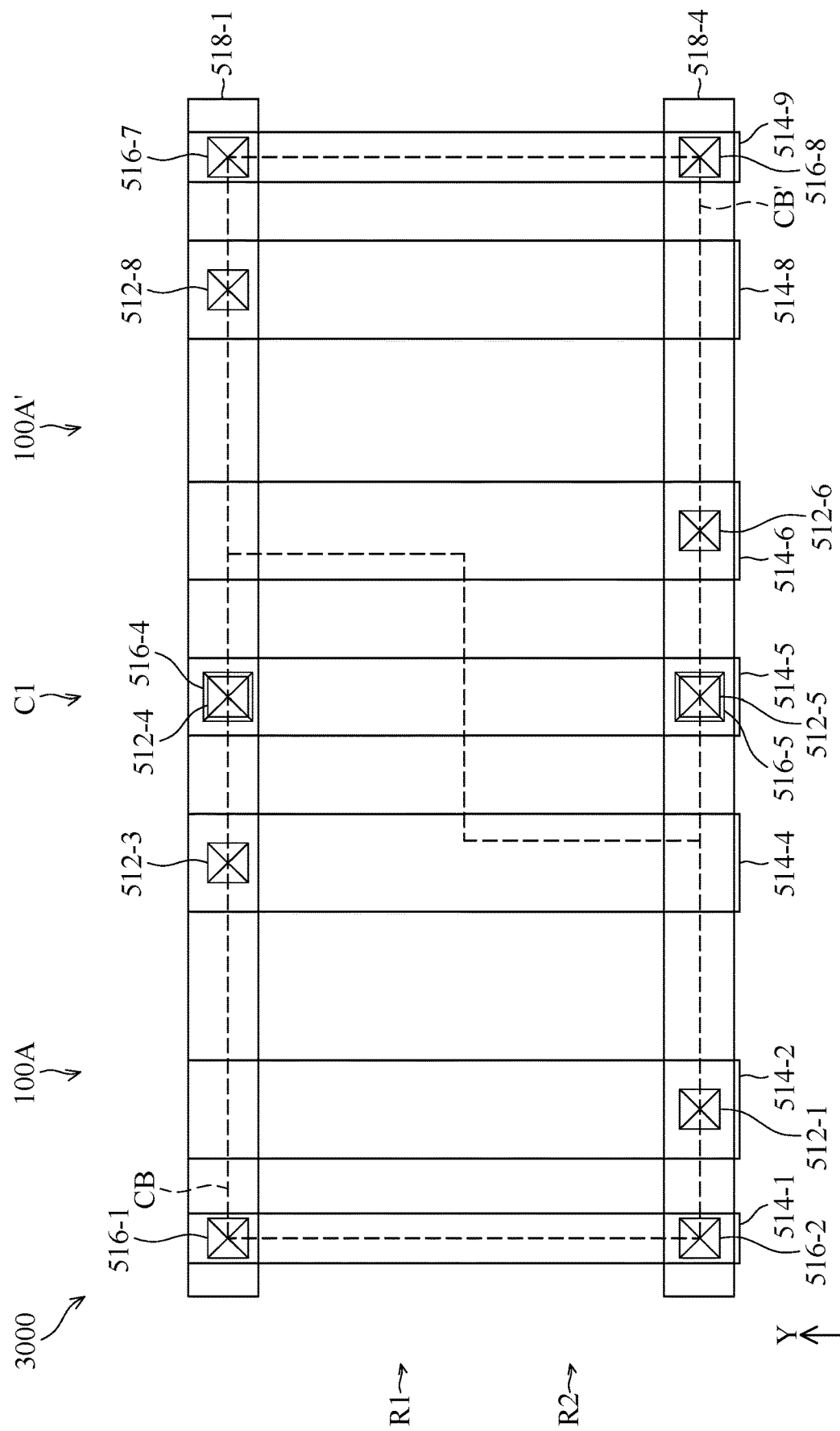

FIGS. 6A to 6C illustrate top views (or layouts) of one embodiment of the interconnection structure (including vias and metal conductors) for two adjacent SRAM cells 100A and 100A', in accordance with some embodiments of the present disclosure. FIG. 6A illustrates the metal conductors in the first metal layer (M1) and the second metal layer (M2), and vias vertically between the first metal layer (M1) and the second metal layer (M2). FIG. 6B illustrates the metal conductors in the second metal layer (M2) and the third metal layer (M3), vias vertically between the first metal layer (M1) and the second metal layer (M2), and vias vertically between the second metal layer (M2) and the third metal layer (M3). FIG. 6C illustrates the metal conductors in the third metal layer (M3) and the fourth metal layer (M4), vias vertically between the second metal layer (M2) and the third metal layer (M3), and vias vertically between the third metal layer (M3) and the fourth metal layer (M4).

The interconnection structure shown in FIGS. 6A to 6C is similar to the interconnection structure shown in FIGS. 5B to 5D discussed above, except that the metal conductors serving as the read word-lines RWL and RWL' discussed above are in the metal layer M2 rather than in the metal layer M4, and the metal conductors 518-2, 518-3, 514-3, 514-7, 510-5, and 510-6 and the vias 516-3, 516-6, 512-2, and 512-7 are removed. As shown in FIGS. 6A to 6C, the metal conductors 510-4', 518-2', 518-3', and 510-7' are in the metal layer M2 and extend in the X-direction. In some embodiments, the metal conductors 518-2' and 518-3' are between the metal conductors 510-4' and 510-7' in the Y-direction. The vias 508-1', 508-5', 508-6', 508-10' are similar to the vias 508-1, 508-5, 508-6, 508-10 discussed above.

The metal conductors 510-4' and 510-7' serve as the write word-lines WWL and WWL' discussed above. As shown in FIGS. 5A and 6A to 6C, for the SRAM cell 100A, the metal conductor 510-4' is electrically connected to the gate structure 404-1 of the write-port PG transistor W_PG1 through the via 508-1', the metal conductor 506-1, and the gate via 502-1, and is electrically connected to the gate structure 404-4 of the write-port PG transistor W_PG2 through the via 508-1', the metal conductor 506-1, and the gate via 502-2. For the SRAM cell 100A', the metal conductor 510-7' is electrically connected to the gate structure 404-6 of the write-port PG transistor W_PG1' through the via 508-10', the metal conductor 506-17, and the gate via 502-6, and is electrically connected to the gate structure 404-9 of the write-port PG transistor W_PG2' through the via 508-10', the metal conductor 506-17, and the gate via 502-7.

The metal conductors 518-2' and 518-3' serve as the read word-lines RWL and RWL' discussed above. As shown in FIGS. 5A and 6A to 6C, for the SRAM cell 100A, the metal conductor 518-2' is electrically connected to the gate structure 404-5 of the read-port PG transistor R_PG through the via 508-5', the metal conductor 506-8, and the gate via 502-5. For the SRAM cell 100A', the metal conductor 518-3' is electrically connected to the gate structure 404-10 of the read-port PG transistor R_PG' through the via 508-6', the metal conductor 506-10, and the gate via 502-10.

Other metal conductors and vias are the same as the metal conductors and the vias shown in FIGS. 5B to 5D. In some embodiments, the metal conductors 510-4' and 510-7' may be referred to as write word-line conductors. In some embodiments, the metal conductors 518-2' and 518-3' may be referred to as read word-line conductor.

Figure 7A:
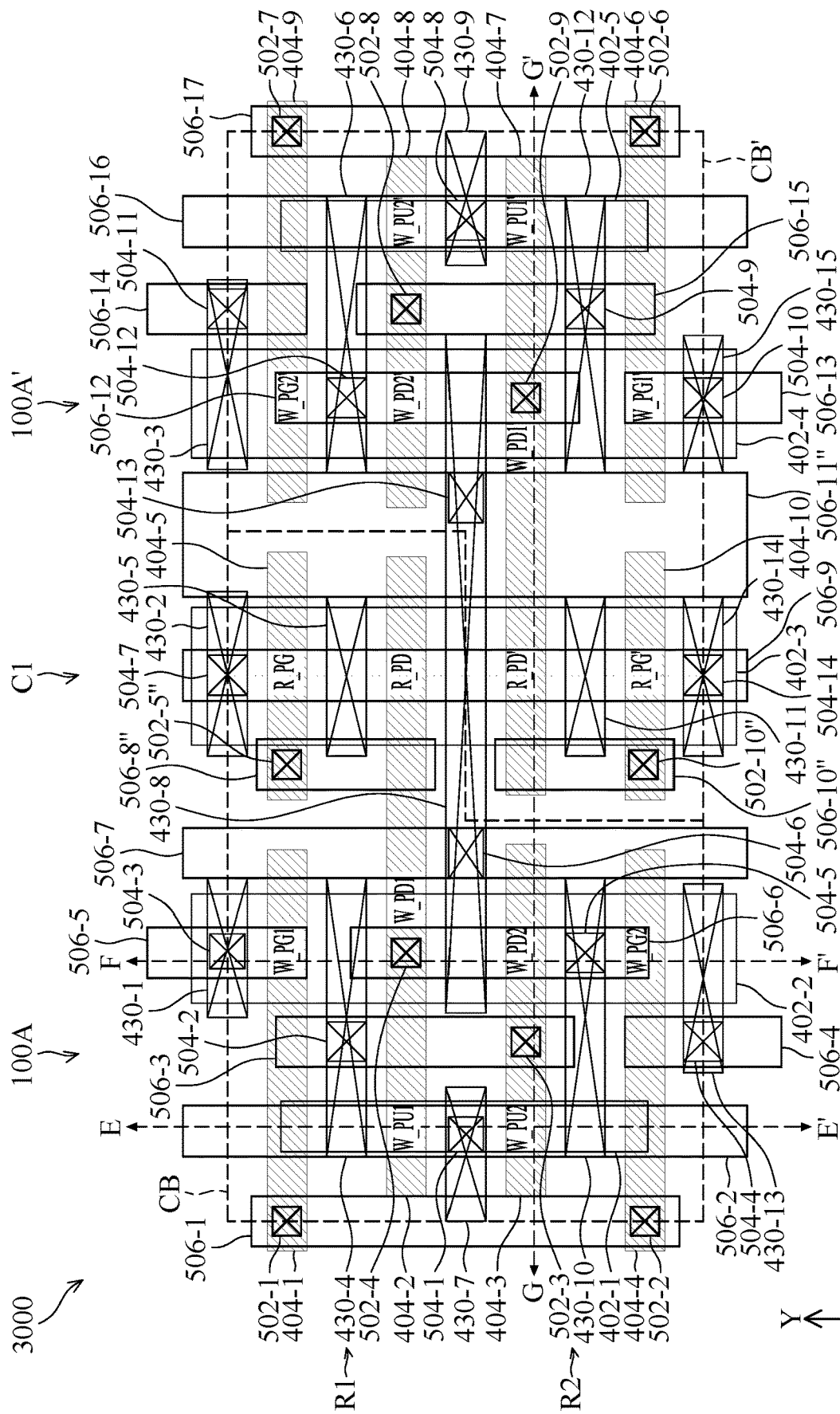
FIGS. 7A to 7C illustrate top views (or layouts) of one embodiment of the interconnection structure (including vias and metal conductors) for two adjacent SRAM cells, in accordance with some embodiments of the present disclosure.
Figure 7B:
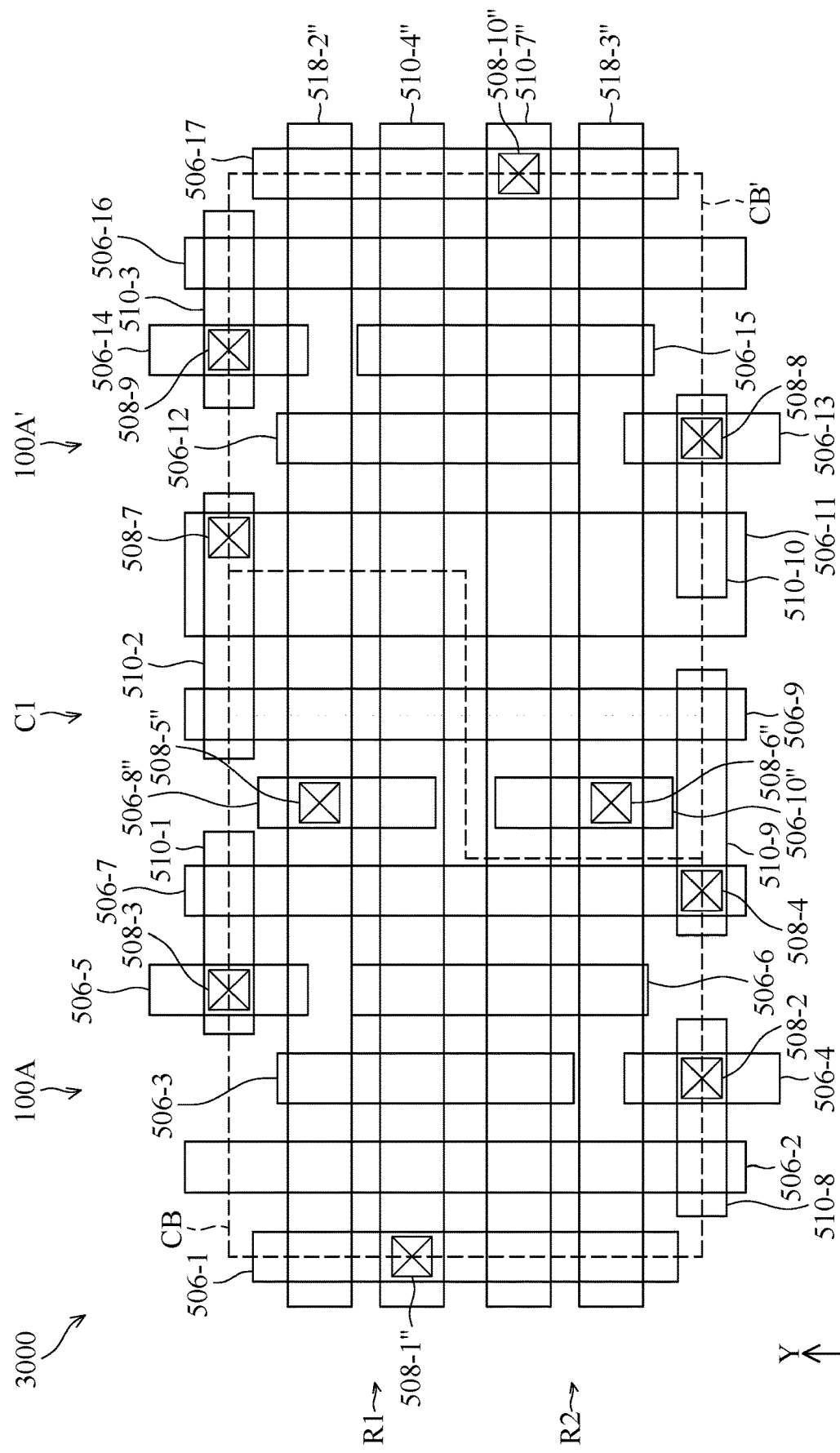
Figure 7C:
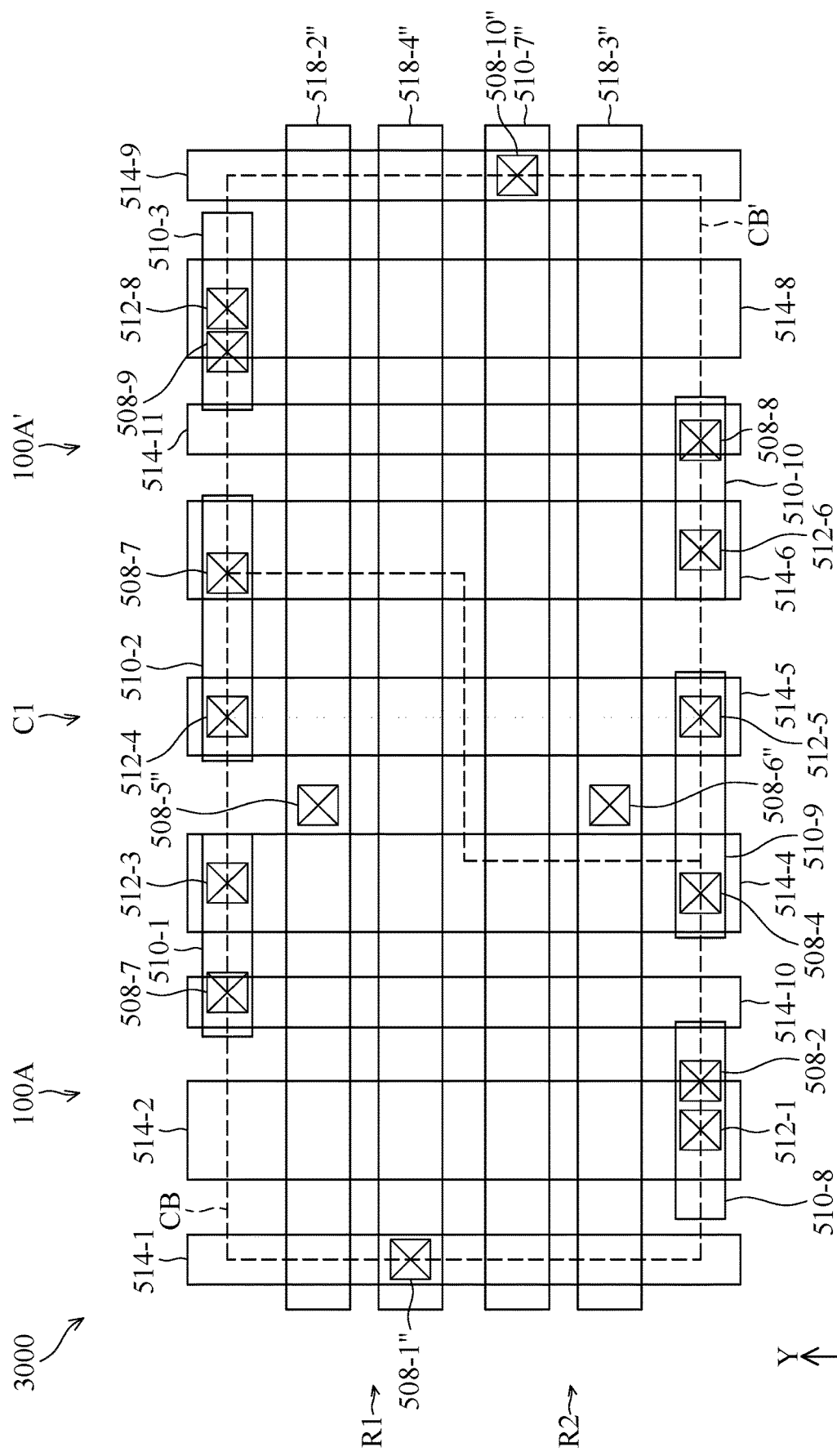

FIGS. 7A to 7C illustrate top views (or layouts) of one embodiment of the interconnection structure (including vias and metal conductors) for two adjacent SRAM cells 100A and 100A', in accordance with some embodiments of the present disclosure. FIG. 7A illustrates the features in the device region (including transistors), the metal conductors in the first metal layer (M1), and vias vertically between the features and the first metal layer (M1). FIG. 7B illustrates the metal conductors in the first metal layer (M1) and the second metal layer (M2), and vias vertically between the first metal layer (M1) and the second metal layer (M2). FIG. 7C illustrates the metal conductors in the second metal layer (M2) and the third metal layer (M3), vias vertically between the first metal layer (M1) and the second metal layer (M2), and vias vertically between the second metal layer (M2) and the third metal layer (M3).

The cell structure and interconnection structure shown in FIGS. 7A to 7C are similar to that shown in FIGS. 5A to 5C discussed above, except that the metal conductors serving as the read word-lines RWL and RWL' discussed above are in the metal layer M2 rather than in the metal layer M4, and the metal conductors 518-1 to 518-4, 514-3, 514-7, 510-5, and 510-6 and the vias 516-1 to 516-8, 512-2, and 512-7 are removed. As shown in FIGS. 7A to 7C, the metal conductors 510-4", 518-2", 518-3", and 510-7" are in the metal layer M2 and extend in the X-direction. In some embodiments, the metal conductors 510-4" and 510-7" are between the metal conductors 518-2" and 518-3" in the Y-direction. The vias 508-1", 508-5", 508-6", 508-10" are similar to the vias 508-1, 508-5, 508-6, 508-10 discussed above.

Further, the vias 502-5", 502-10" and the metal conductors 506-8", 506-10", 506-11" have different configuration or routing from the vias 502-5, 502-10 and the metal conductors 506-8, 506-10, 506-11 shown in FIG. 5A. More specifically, the metal conductors 506-8" and 506-10" are in the metal layer M1 and configured at the left side of the metal conductor 506-9 in the top view, as shown in FIGS. 7A and 7B. The vias 502-5" and 502-10" are also configured at the left side of the metal conductor 506-9 in the top view and respectively over the gate structure 404-5 and 404-10. As such, the metal conductor 506-11" may be designed to have a wider width (than other metal conductors 506), so that reducing the circuit resistance. In some embodiments, in the top view, the metal conductors 506-8" and 506-10" are aligned in the Y-direction, as shown in FIG. 7A. In other embodiments, in the top view, the metal conductors 506-8" and 506-10" are between the metal conductors 506-7 and 506-9 in the X-direction, as shown in FIG. 7A. It should be understood that the opposite configuration is applicable. For examples, the metal conductors 506-8" and 506-10" and the vias 502-5" and 502-10" may be configured at the right side of the metal conductor 506-9 in the top view and between the metal conductors 506-9 and 506-11 (shown in FIG. 5A) in the X-direction, and the metal conductor 506-7 may be designed to have a wider width.

The metal conductors 510-4" and 510-7" serve as the write word-lines WWL and WWL' discussed above. As shown in FIG. 7A to 7C, for the SRAM cell 100A, the metal conductor 510-4" is electrically connected to the gate structure 404-1 of the write-port PG transistor W_PG1 through the via 508-1", the metal conductor 506-1, and the gate via 502-1, and is electrically connected to the gate structure 404-4 of the write-port PG transistor W_PG2 through the via 508-1", the metal conductor 506-1, and the gate via 502-2. For the SRAM cell 100A', the metal conductor 510-7" is electrically connected to the gate structure 404-6 of the write-port PG transistor W_PG1' through the via 508-10", the metal conductor 506-17, and the gate via 502-6, and is electrically connected to the gate structure 404-9 of the write-port PG transistor W_PG2' through the via 508-10", the metal conductor 506-17, and the gate via 502-7.

The metal conductors 518-2" and 518-3" serve as the read word-lines RWL and RWL' discussed above. As shown in FIG. 7A to 7C, for the SRAM cell 100A, the metal conductor 518-2" is electrically connected to the gate structure 404-5 of the read-port PG transistor R_PG through the via 508-5", the metal conductor 506-8", and the gate via 502-5". For the SRAM cell 100A', the metal conductor 518-3" is electrically connected to the gate structure 404-10 of the read-port PG transistor R_PG' through the via 508-6", the metal conductor 506-10", and the gate via 502-10".

In some embodiments, the metal conductors 514-10 and 514-11 are added and disposed in the metal layer M3. The metal conductors 514-10 and 514-11 serve as VSS lines for other SRAM cells or isolation, in which the metal conductor 514-10 is between the metal conductors 514-2 and 514-4, and the metal conductor 514-11 is between the metal conductors 514-6 and 514-8.

Other metal conductors and vias are the same as the metal conductors and the vias shown in FIGS. 5A to 5C. In some embodiments, the metal conductors 510-4' and 510-7' may be referred to as write word-line conductors. In some embodiments, the metal conductors 518-2' and 518-3' may be referred to as read word-line conductor.

Figure 8:
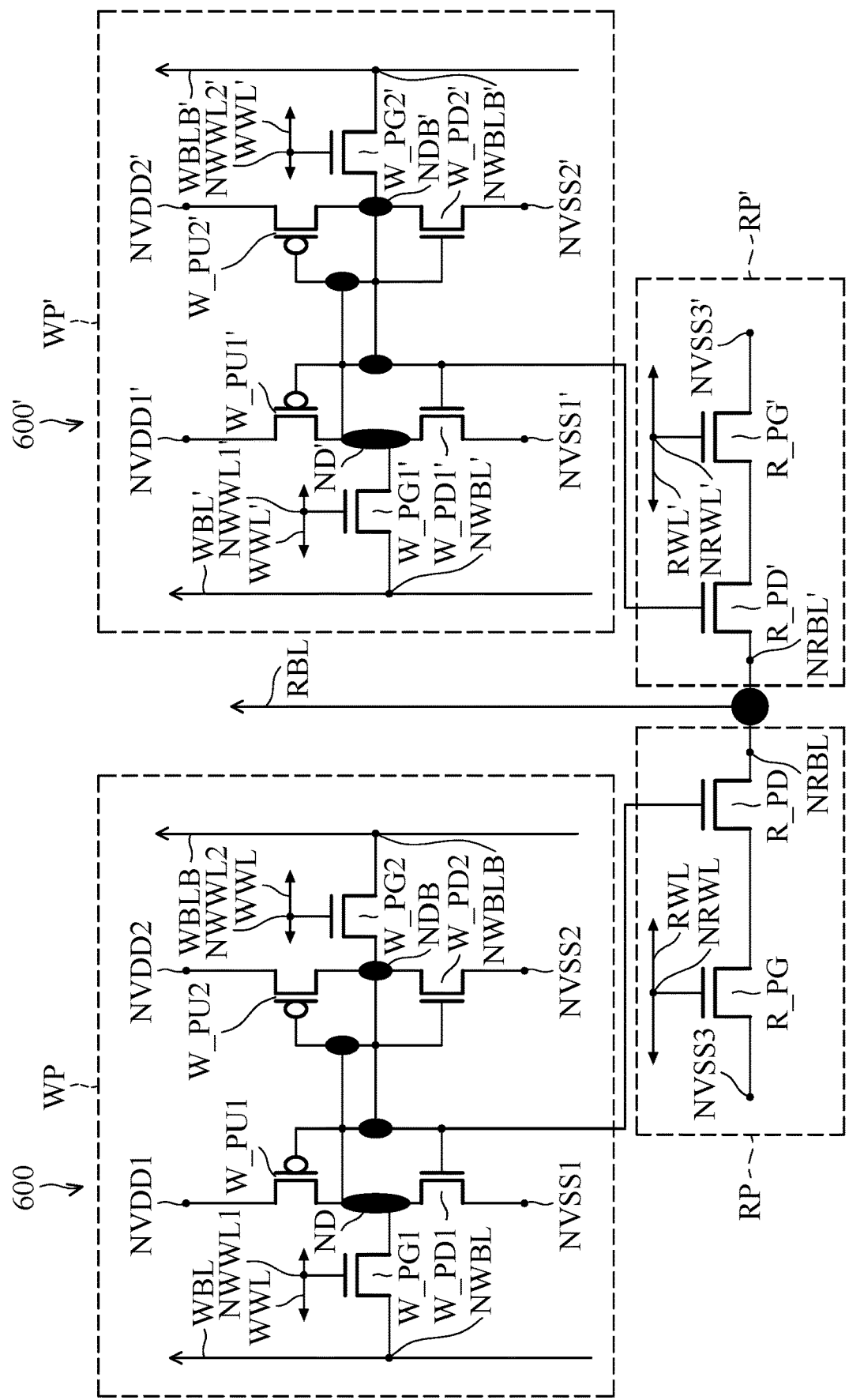
FIG. 8 is a circuit diagram for SRAM cells that can be implemented in an array of two-port SRAM cells in the memory region of FIG. 1, in accordance with some alternative embodiments of the present disclosure.

FIG. 8 is a circuit diagram for SRAM cells 600 and 600' that can be implemented in an array of two-port SRAM cells in the memory region 20 of FIG. 1, in accordance with some alternative embodiments of the present disclosure. Similar to the SRAM cells 100 and 100', the SRAM cell 600 includes a write-port circuit WP having data nodes ND and NDB, a read-port circuit RP coupled with data node ND; and the SRAM cell 600' includes a write-port circuit WP' having data nodes ND' and NDB', a read-port circuit RP1' coupled with data node ND', and a second read-port circuit RP2' coupled with data node NDB'. Similarly, the SRAM cells 600 and 600' may also be referred to as two-port SRAM cells.

Similarly, the SRAM cell 600 may also in a row of an array of SRAM cells, and the SRAM cell 600' may also be adjacent to the SRAM cell 600 and in an adjacent row of the array of the SRAM cells. The SRAM cells 600 and 600' also have the same features and components. For the sake of distinction, the reference numbers of the components in the SRAM cell 600' are additionally labeled with "'".

The configuration and operation of the write-port circuits WP and WP' of the SRAM cell 600 and 600' are the same as that of the write-port circuits WP and WP' of the SRAM cell 100 and 100'. As shown in FIG. 8, take the SRAM cell 600 as an example, similar to the SRAM cell 100 discussed in FIG. 2, the read-port circuit RP also includes two n-type transistors, such as read-port PD transistor R_PD and read-port PG transistor R_PG. The source of the read-port PG transistor R_PG is coupled with the reference voltage node NVSS3 configured to receive the reference voltage VSS. The gate of the read-port PG transistor R_PG is referred to as the read word-line node NRWL and electrically coupled with the read word-line RWL. The drain of the read-port PG transistor R_PG is coupled with the source of the read-port PD transistor R_PD. The gate of the read-port PD transistor R_PD is coupled with the data node NDB. The drain of the read-port PD transistor R_PD is referred to as the read bit-line node NRBL and electrically coupled with the read bit-line RBL.

In a read operation of the SRAM cell 600 using the read-port circuit RP, the read bit-line RBL is pre-charged with a high logical value. The read word-line RWL is activated with a high logical value to turn on the read-port PG transistor R_PG. The data stored in data node NDB turns on or off the read-port PD transistor R_PD. For example, if data node NDB stores a high logical value, the read-port PD transistor R_PD is turned on. The turned-on read-port PG transistor R_PG and the turned-on read-port PD transistor R_PD then pull read bit-line RBL to the reference voltage VSS or a low logical value at the source of the read-port PG transistor R_PG. On the other hand, if the data node NDB stores a low logical value, the read-port PD transistor R_PD is turned off and operates as an open circuit. As a result, the read bit-line RBL remains at the pre-charged high logical value. Detecting a logical value on the read bit-line RBL therefore reveals the logical value stored in the data node NDB.

The difference of the SRAM cells 600 and 600' from the SRAM cells 100 and 100' is that the read bit-line RBL is share by the read-port PD transistors R_PD and R_PD', rather than the read-port PG transistors R_PG and R_PG'. In the present embodiments, the read bit-line node NRBL of the read-port PD transistor R_PD of the SRAM cell 600 and the read bit-line node NRBL' of the read-port PD transistor R_PD' of the SRAM cell 600' are further coupled together and to the read bit-line RBL, as shown in FIG. 8. In other word, the SRAM cell 600 and 600' share the read bit-line RBL.

Figure 9A:
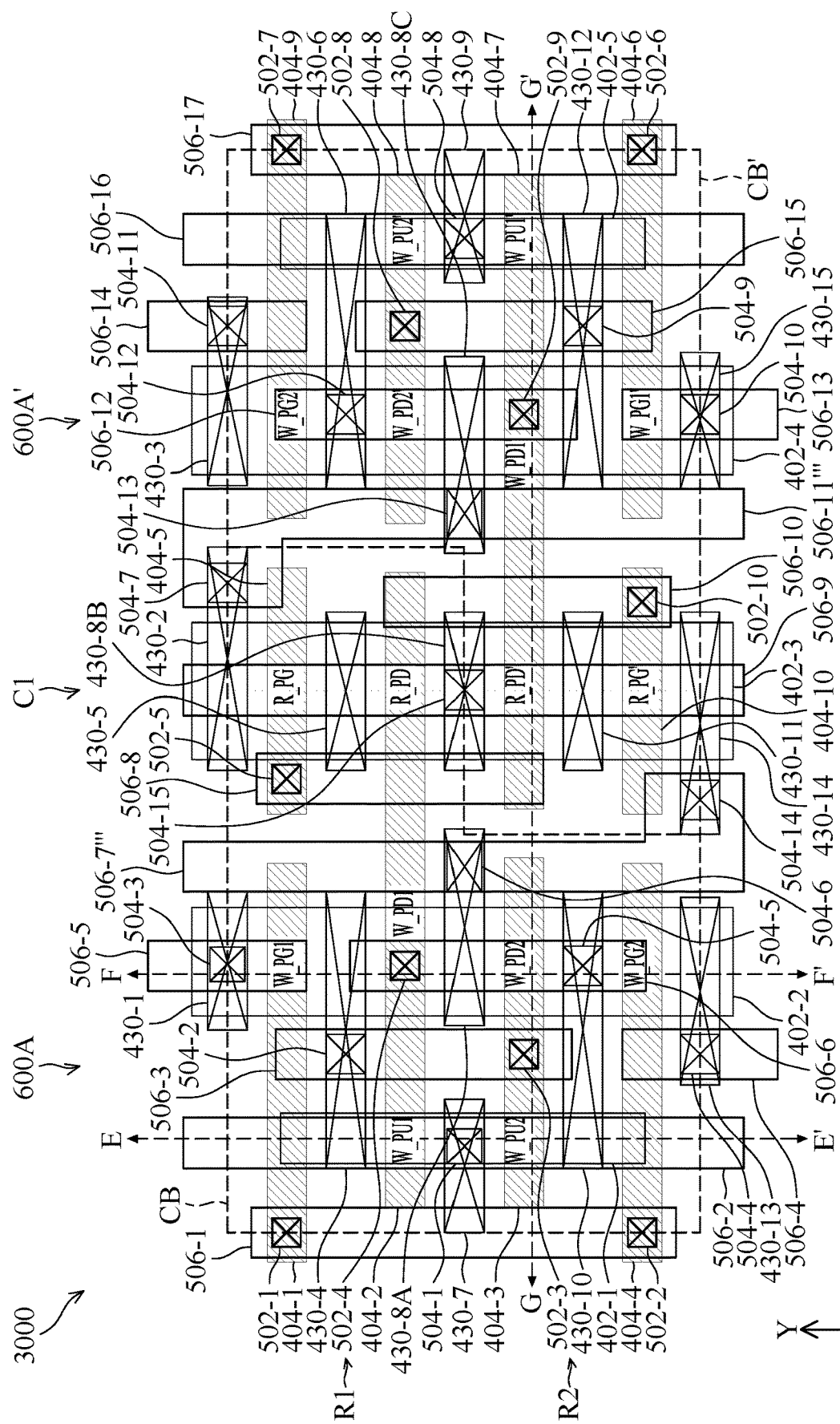
FIGS. 9A, 9B, 9C, and 9D illustrate top views (or layouts) of two adjacent SRAM cells in a portion of the array that can be one embodiment of the SRAM cells implemented in the memory region, in accordance with some embodiments of the present disclosure.
Figure 9B:
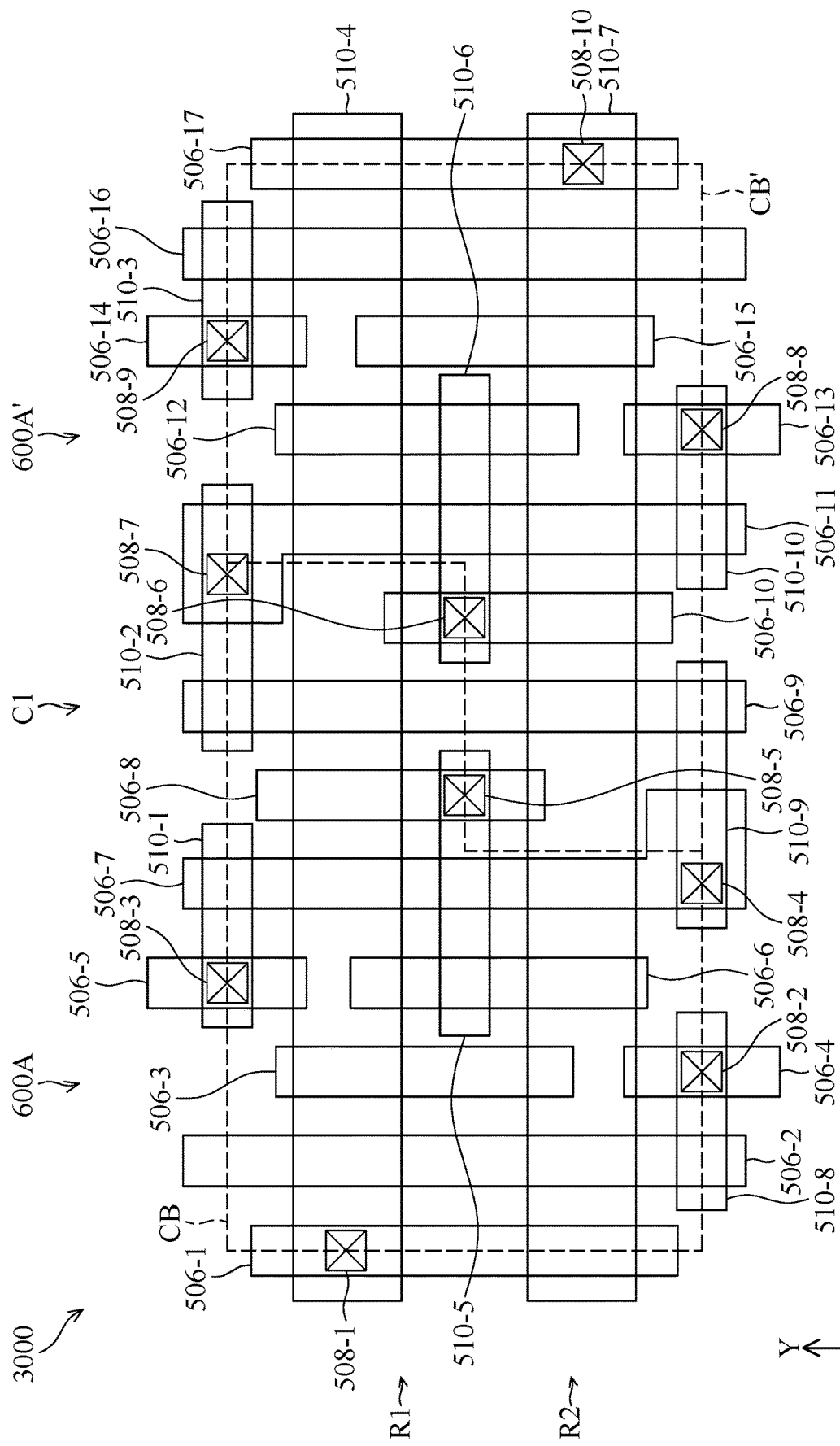
Figure 9C:
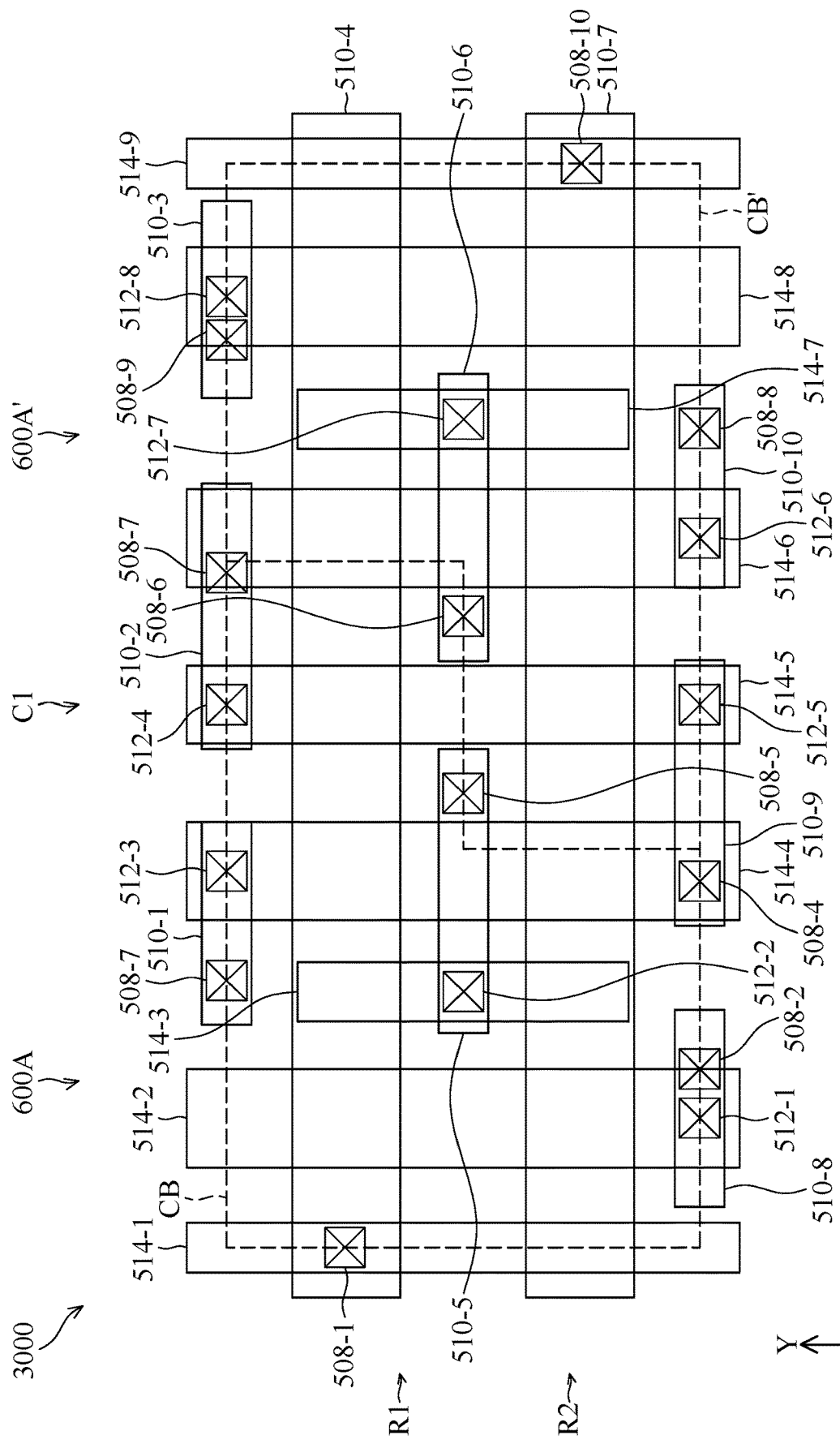
Figure 9D:
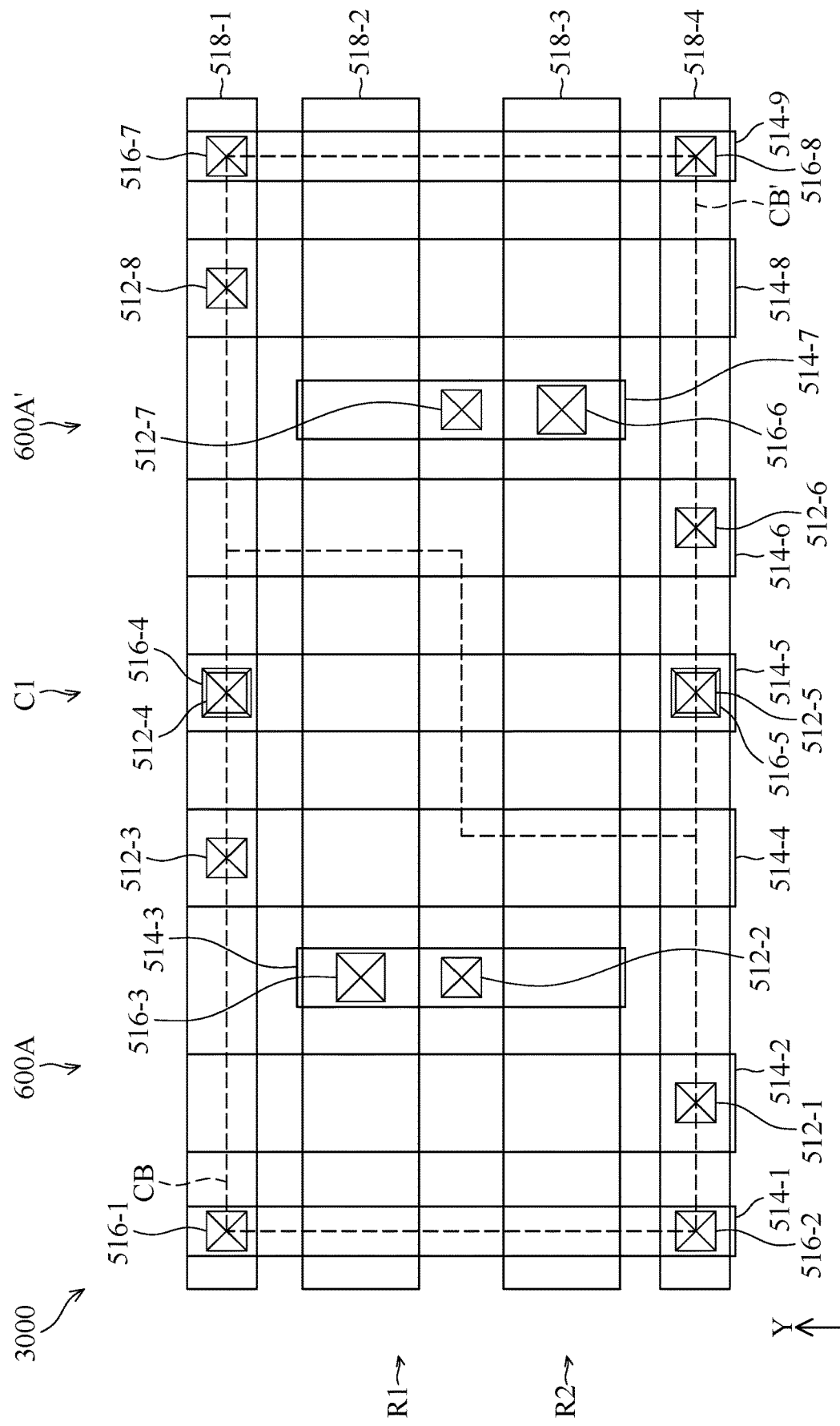

FIGS. 9A to 9D illustrate top views (or layouts) of two adjacent SRAM cells 600A and 600A' in a portion of the array 3000 that can be one embodiment of the SRAM cells 600 and 600' implemented in the memory region 20, in accordance with some embodiments of the present disclosure. FIG. 9A illustrates the features in the device region (including transistors), the metal conductors in the first metal layer (M1), and vias vertically between the features and the first metal layer (M1). FIG. 9B illustrates the metal conductors in the first metal layer (M1) and the second metal layer (M2), and vias vertically between the first metal layer (M1) and the second metal layer (M2). FIG. 9C illustrates the metal conductors in the second metal layer (M2) and the third metal layer (M3), vias vertically between the first metal layer (M1) and the second metal layer (M2), and vias vertically between the second metal layer (M2) and the third metal layer (M3). FIG. 9D illustrates the metal conductors in the third metal layer (M3) and the fourth metal layer (M4), vias vertically between the second metal layer (M2) and the third metal layer (M3), and vias vertically between the third metal layer (M3) and the fourth metal layer (M4).

The cell structure and interconnection structure shown in FIGS. 9A to 9D are similar to that shown in FIGS. 5A to 5D discussed above, except that the metal conductor serving as the read bit-line RBL discussed above is shared by the read-port PD transistors R_PD and R_PD'. To implementing the circuit connection shown in FIG. 8, the source/drain contact 430-8 in FIG. 5A is replaced into source/drain contacts 430-8A, 430-8B, and the 430-8C, as shown in FIG. 9A. The source/drain contacts 430-8A, 430-8B, and the 430-8C are aligned and extend lengthwise in the X-direction. The source/drain contact 430-8A is over and electrically connected to the source/drain feature 412N shared by the write-port PD transistor W_PD1 and W_PD2; the source/drain contact 430-8B is over and electrically connected to the source/drain feature 412N shared by the read-port PD transistors R_PD and R_PD'; and the source/drain contact 430-8C is over and electrically connected to the source/drain feature 412N shared by the write-port PD transistor W_PD1' and W_PD2'.

The SRAM cells 600A and 600A' further include a via 504-15 vertically between the metal conductor 506-9 and the source/drain contact 430-8B. The metal conductor 506-9 serving as the read bit-line RBL is shared by the read-port PD transistors R_PD and R_PD'. The metal conductor 506-9 is electrically connected to the source/drain feature 412N shared by the read-port PD transistors R_PD and R_PD' through the via 504-15 and the source/drain contact 430-8B.

Further, the metal conductors 506-7 and 506-11 in FIG. 5A is replaced into metal conductors 506-7''' and 506-11''', as shown in FIG. 9A. In the top view, the metal conductors 506-7''' and 506-11''' each has an L-shape. In some embodiments, the metal conductors 506-7''' and 506-11''' may be referred to as L-shaped metal conductors. Different to the vias 504-7 and 504-14 shown in FIG. 5A, the vias 504-7 and 504-14 shown in FIG. 9A are disposed at both side of the metal conductor 506-9 in the top view (the via 504-7 is at the right side and the via 504-14 is at the left side). The via 504-7 is vertically between the metal conductor 506-11''' and the source/drain contact 430-2, and the via 504-14 is vertically between the metal conductor 506-7''' and the source/drain contact 430-14.

As such, the metal conductors 506-7''' is electrically connected to the source/drain feature 412N shared by the write-port PD transistor W_PD1 and W_PD2 through the via 504-6 and the source/drain contact 430-8A, and electrically connected to the source/drain feature 412N of the read-port PG transistor R_PG' through the via 504-14 and the source/drain contact 430-14. The metal conductors 506-11''' is electrically connected to the source/drain feature 412N shared by the write-port PD transistor W_PD1' and W_PD2' through the via 504-13 and the source/drain contact 430-8C, and electrically connected to the source/drain feature 412N of the read-port PG transistor R_PG through the via 504-7 and the source/drain contact 430-2.

Similar to the metal conductors 506-7 and 506-11, the metal conductors 506-7''' and 506-11''' serve as VSS lines that are coupled together, electrically coupled to a voltage source (not shown) (e.g., the reference voltage VSS discussed above). Therefore, the metal conductors 506-7''' and 506-11''' may supply the reference voltage VSS to the write-port PD transistors and the read-port PG transistors. As result, the above interconnection structure achieve the circuit connection shown in FIG. 8. Other metal conductors and vias show in FIG. 9A to 9D are the same as the metal conductors and the vias shown in FIGS. 5A to 5D.

Figure 10:
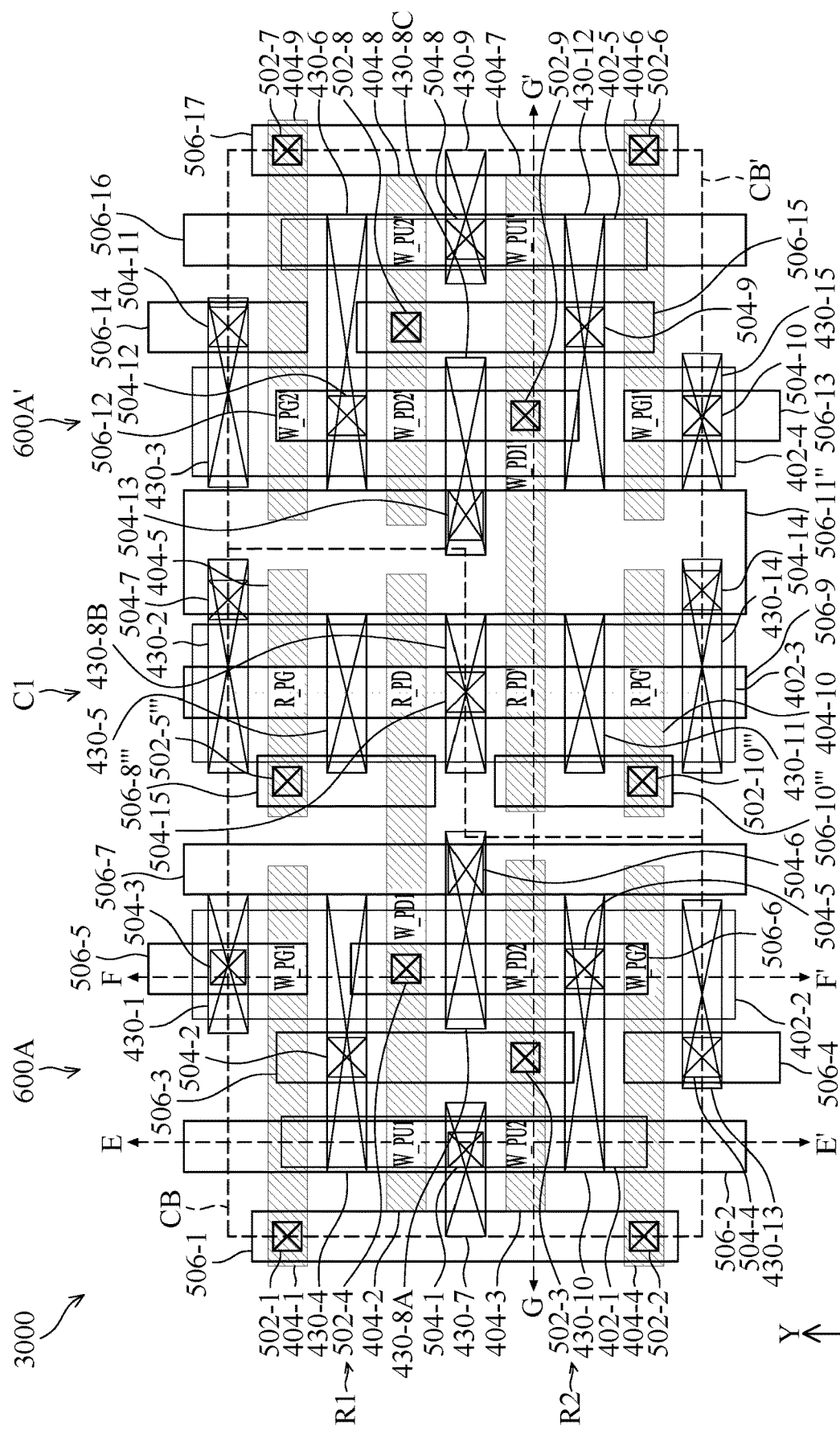
FIG. 10 illustrates a top view (or a layout) of one embodiment of the interconnection structure (including vias and metal conductors) for two adjacent SRAM cells, in accordance with some embodiments of the present disclosure.

FIG. 10 illustrates a top view (or a layout) of one embodiment of the interconnection structure (including vias and metal conductors) for two adjacent SRAM cells 600A and 600A', in accordance with some embodiments of the present disclosure. FIG. 10 illustrates the features in the device region (including transistors), the metal conductors in the first metal layer (M1), and vias vertically between the features and the first metal layer (M1).

The cell structure and interconnection structure shown in FIG. 10 are similar to that shown in FIG. 5A discussed above, except that the metal conductor serving as the read bit-line RBL discussed above is shared by the read-port PD transistors R_PD and R_PD'. The cell structure and interconnection structure shown in FIG. 10 are also similar to that shown in FIGS. 7A and 9A. As shown in FIG. 10, the source/drain contact 430-8 in FIG. 5A is replaced into source/drain contacts 430-8A, 430-8B, and the 430-8C, which are the same as that shown in FIG. 9A. Similarly, The metal conductor 506-9 serving as the read bit-line RBL is electrically connected to the source/drain feature 412N shared by the read-port PD transistors R_PD and R_PD' through the via 504-15 and the source/drain contact 430-8B.

The metal conductors 506-8, 506-10 and the vias 502-5, 502-10 shown in FIGS. 5A and 9A is respectively replaced into metal conductors 506-8''', 506-10''' and vias 502-5''', 502-10''', as shown in FIG. 10. The configuration of the metal conductors 506-8''', 506-10''' and the vias 502-5''', 502-10''' are similar to that of the metal conductors 506-8'', 506-10'' and the vias 502-5'', 502-10'' shown in FIG. 7A. The metal conductors 506-8''', 506-10''' and the vias 502-5''', 502-10''' are configured at the left side of the metal conductor 506-9 in the top view, as shown in FIG. 10.

As such, similar FIG. 7A, the metal conductor 506-11'' shown in FIG. 10 may be designed to have a wider width (than other metal conductors 506), so that reducing the circuit resistance. Further, the vias 504-7 and 504-14 shown in FIG. 10 are disposed at right side of the metal conductor 506-9 in the top view. The via 504-7 is vertically between the metal conductor 506-11'' and the source/drain contact 430-2, and the via 504-14 is vertically between the metal conductor 506-11'' and the source/drain contact 430-14.

The metal conductors 506-7 and 506-11'' serve as VSS lines that are coupled together, electrically coupled to a voltage source (not shown) (e.g., the reference voltage VSS discussed above). The metal conductors 506-7 is electrically connected to the source/drain feature 412N shared by the write-port PD transistor W_PD1 and W_PD2 through the via 504-6 and the source/drain contact 430-8A. The metal conductors 506-11'' is electrically connected to the source/drain feature 412N shared by the write-port PD transistor W_PD1' and W_PD2' through the via 504-13 and the source/drain contact 430-8C, electrically connected to the source/drain feature 412N of the read-port PG transistor R_PG through the via 504-7 and the source/drain contact 430-2, and electrically connected to the source/drain feature 412N of the read-port PG transistor R_PG' through the via 504-14 and the source/drain contact 430-14. Therefore, the metal conductors 506-7 and 506-11" may supply the reference voltage VSS to the write-port PD transistors and the read-port PG transistors. As result, the above interconnection structure achieve the circuit connection shown in FIG. 8. Other metal conductors and vias show in FIG. 10 are the same as the metal conductors and the vias shown in FIGS. 5A, 7A, and 9A. It should be understood that the opposite configuration is applicable. In some embodiments, the metal conductors and vias shown FIGS. 7B and 7C may be applied to FIG. 10 for higher interconnections.

Figure 11:
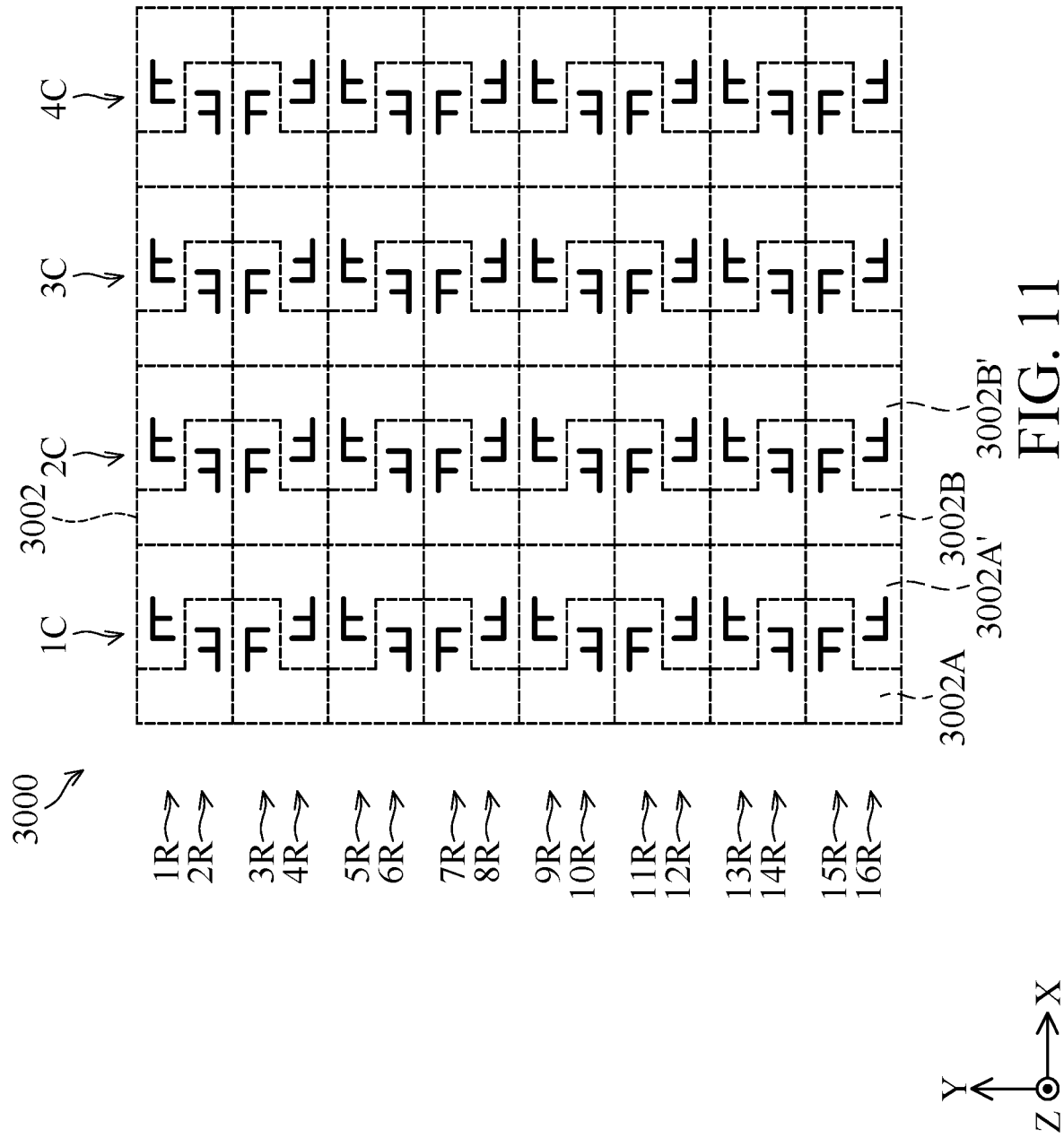
FIGS. 11 and 12 each illustrates one embodiment of a portion of the array, in accordance with some embodiments of the present disclosure.
Figure 12:
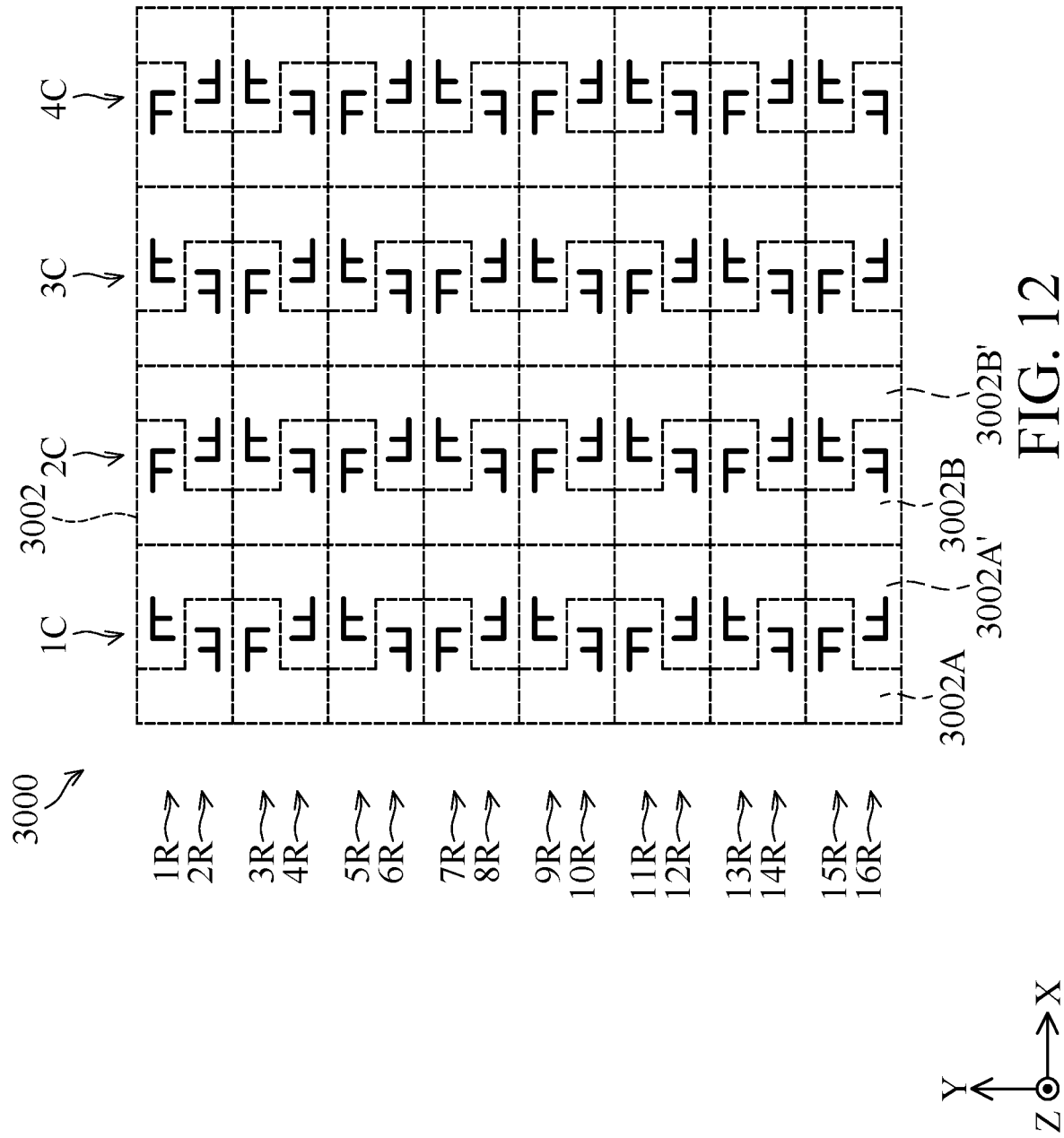

FIGS. 11 and 12 each illustrates one embodiment of a portion of the array 3000, in accordance with some embodiments of the present disclosure. The array 3000 shown in FIGS. 11 and 12 has SRAM cells 3002 arranged with four columns 1C to 4C and sixteen rows 1R to 16R. As discussed above, in every column, the adjacent two SRAM cells 3002 respectively in the adjacent two rows are abutted together. The abutted two SRAM cells 3002. The structures of the abutted two SRAM cells 3002 is rotational symmetry by a rotation of 180 degrees. For example, the structure of SRAM cell 3002A is symmetric to the structure of SRAM cell 3002A' by a rotation of 180 degrees, as shown in FIGS. 11 and 12. The structure of the SRAM cell 3002 are the same as the structure of the SRAM cells discussed above, such as the structure show in FIGS. 5A to 5G. For example, the structure of the SRAM cells 3002A and 3002A' are the same as that of the SRAM cells 100A and 100A'. Further, referring to FIG. 11, the configuration and structure of the SRAM cells 3002 in each column are the same. More specifically, the configurations and structures of the SRAM cells 3002A and 3002A' in column 1C are respectively the same as that of the SRAM cells 3002B and 3002B' in column 2C.

In addition, referring to FIG. 12, the configuration and structure of the SRAM cells 3002 in the adjacent two columns are mirror symmetry. For example, the configuration and structure of the SRAM cell 3002A in column 1C are a mirror image of that of SRAM cell 3002B in column 2C with respect to an axis along the Y-direction (i.e., Y-axis); and the configuration and structure of the SRAM cell 3002A' in column 1C are a mirror image of that of SRAM cell 3002B' in column 2C with respect to the axis.

Figure 13A:
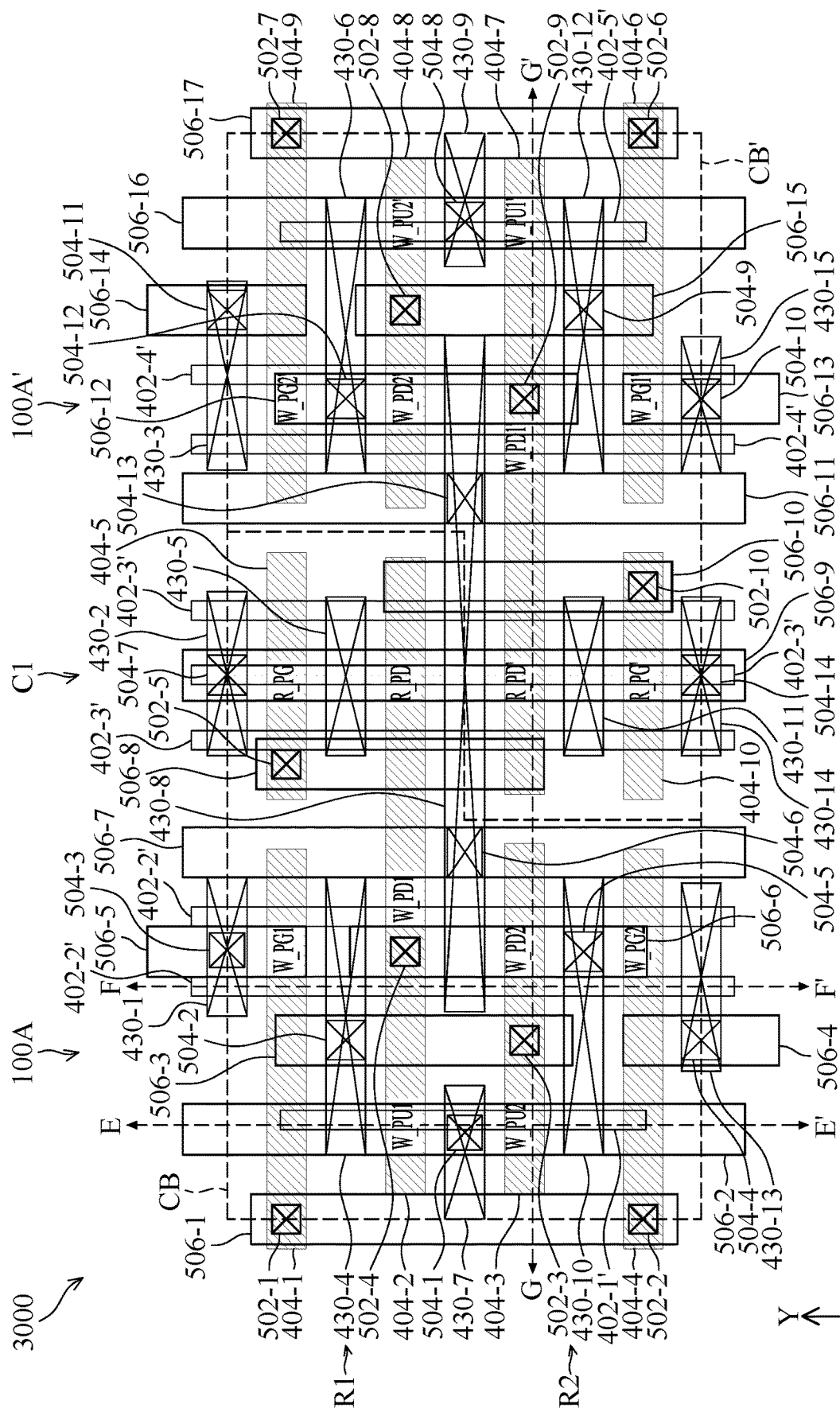
FIG. 13A illustrates top views (or layouts) of the SRAM cells constructed with FinFET, in accordance with some embodiments of the present disclosure.
Figure 13B:
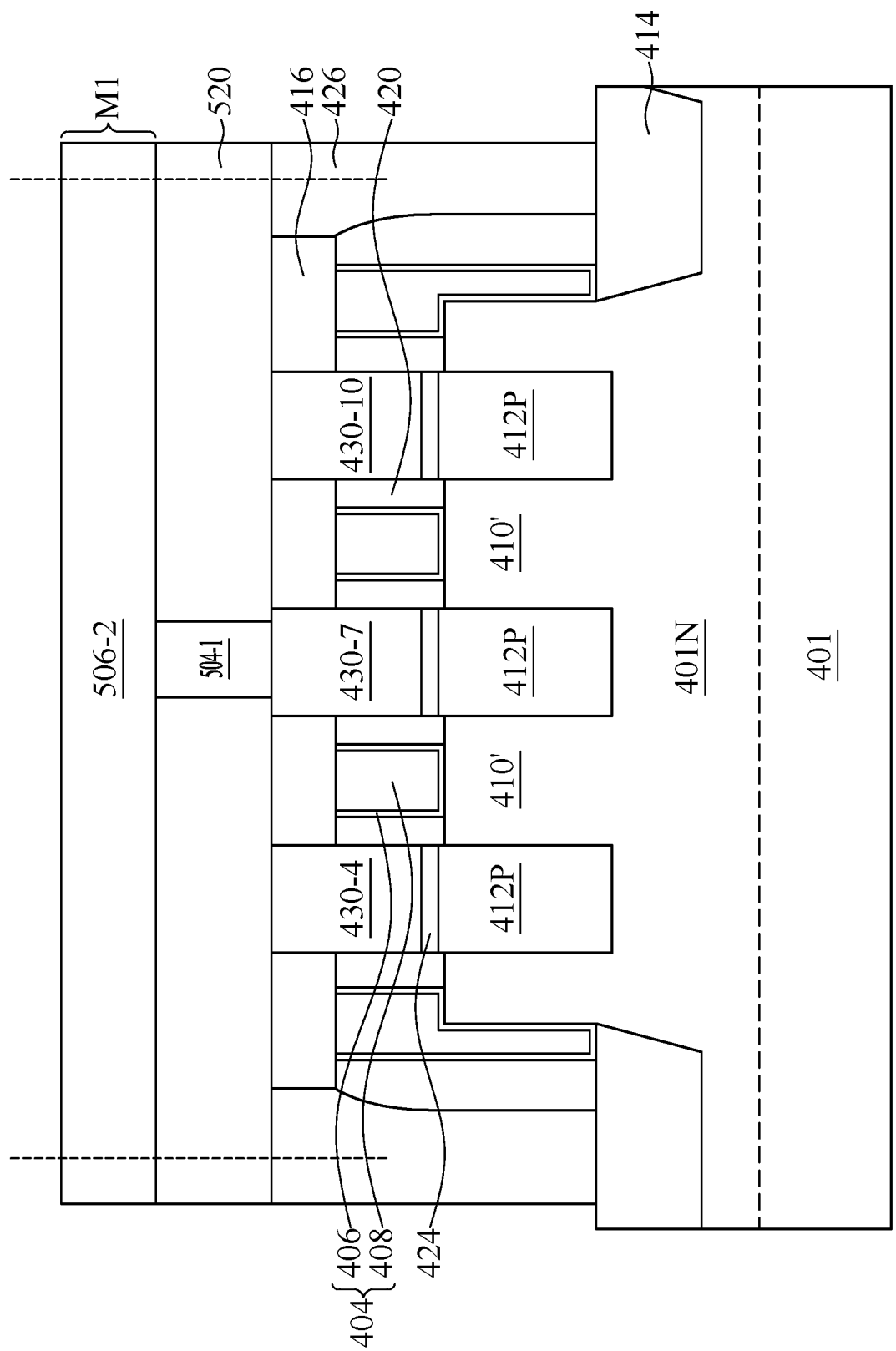
FIG. 13B illustrates a cross sectional view of the SRAM cells along a line E-E' in FIG. 13A, in accordance with some embodiments of the present disclosure.
Figure 13C:
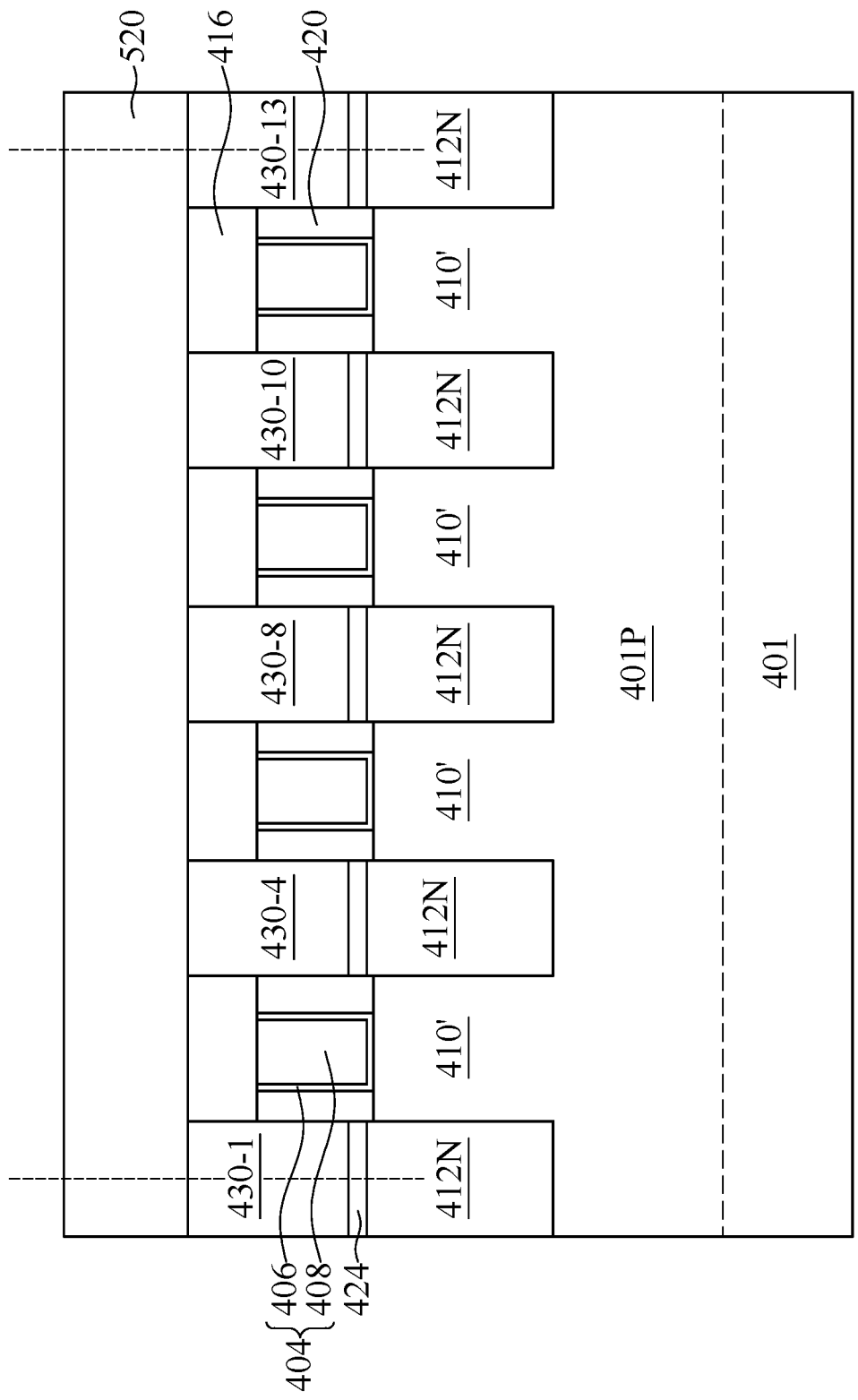
FIG. 13C illustrates a cross sectional view of the SRAM cells along a line F-F' in FIG. 13A, in accordance with some embodiments of the present disclosure.
Figure 13D:
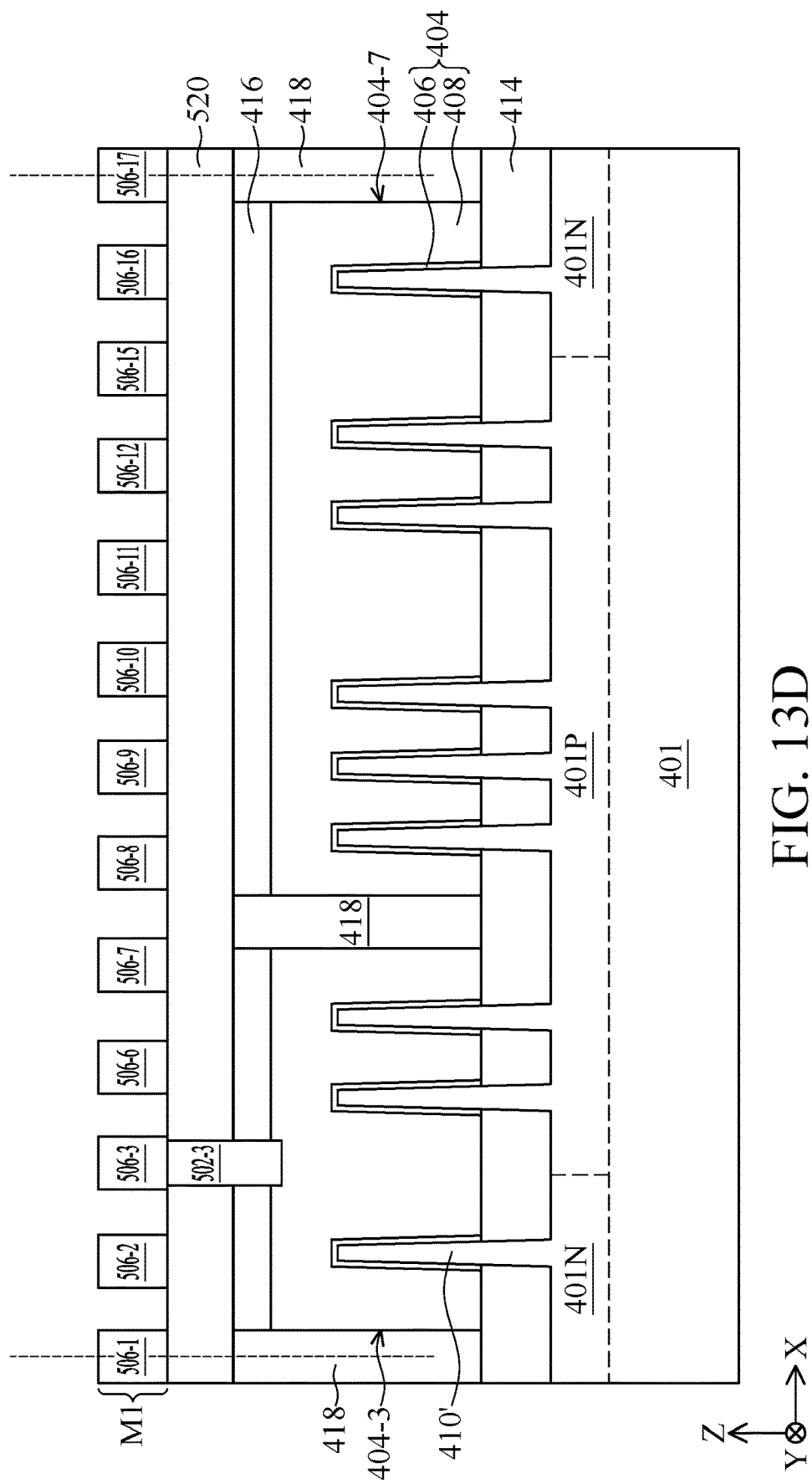
FIG. 13D illustrates a cross sectional view of the SRAM cells along a line G-G' in FIG. 13A, in accordance with some embodiments of the present disclosure.

The transistors of the SRAM cells discussed above each has a GAA structure or is GAA transistor. In some embodiments, the transistors of the SRAM cells discussed above may be FinFET. FIG. 13A illustrates top views (or layouts) of the SRAM cells 100A and 100A' constructed with FinFET, in accordance with some embodiments of the present disclosure. FIG. 13A illustrates the features in the device region (including transistors), the metal conductors in the first metal layer (M1), and vias vertically between the features and the first metal layer (M1). FIG. 13B illustrates a cross sectional view of the SRAM cells 100A and 100A' along a line E-E' in FIG. 13A, in accordance with some embodiments of the present disclosure. FIG. 13C illustrates a cross sectional view of the SRAM cells 100A and 100A' along a line F-F' in FIG. 13A, in accordance with some embodiments of the present disclosure. FIG. 13D illustrates a cross sectional view of the SRAM cells 100A and 100A' along a line G-G' in FIG. 13A, in accordance with some embodiments of the present disclosure.

As show in FIGS. 13A, the active areas 402-1 to 402-5 in FIG. 5A are replaced into the active areas 402-1' to 402-5', (may be collectively referred to as the active areas 402') that extend lengthwise in the Y-direction and are arranged in the X-direction. The gate structures 404-1 and 404-3 each engages the active area 402-1' to respectively form the write-port PU transistors W_PU1 and W_PU2; the gate structures 404-1, 404-2, 404-3, and 404-4 each engages two active areas 402-2' to respectively form the write-port PG transistor W_PG1, the write-port PD transistor W_PD1, the write-port PD transistor W_PD2, and the write-port PG transistor W_PG2; the gate structures 404-5, 404-2, 404-7, 404-10 each engages three active areas 402-3' to respectively form the read-port PG transistor R_PG, the read-port PD transistor R_PD, the read-port PD transistor R_PD', and the read-port PG transistor R_PG'; the gate structures 404-9, 404-8, 404-7, and 404-6 each engages two active areas 402-4' to respectively form the write-port PG transistor W_PG2', the write-port PD transistor W_PD2', the write-port PD transistor W_PD1', and the write-port PG transistor W_PG1'; and gate structures 404-8 and 404-7 each engages the active area 402-5' to respectively form the write-port PU transistors W_PU2' and W_PU1'.

Each of the transistors in the SRAM cell 100A (e.g., the write-port PG transistors W_PG1 and W_PG2, the write-port PD transistors W_PD1 and W_PD2, the write-port PU transistors W_PU1 and W_PU2, the read-port PG transistor R_PG, and the read-port PD transistor R_PD) and the transistors in the SRAM cell 100A' (e.g., the write-port PG transistors W_PG1' and W_PG2', the write-port PD transistors W_PD1' and W_PD2', the write-port PU transistors W_PU1' and W_PU2', the read-port PG transistor R_PG', and the read-port PD transistor R_PD') includes one or more fins 410' in the channel regions of the respective active areas 402-1' to 402-5'. In some embodiments, the gate structures 404-1 to 404-10 wrap and/or surround the fins 410' (as shown in FIGS. 13B to 13D). The fins 410' are referred to and/or serve as channels, channel layers, and channel members of the transistors discussed above. As shown in FIGS. 13B and 13C, the fins 410' each extends in the Y-direction to connect one source/drain feature 412N/412P to the other source/drain feature 412N/412P.

As shown in FIGS. 13B to 13D, the fins 410' are protruded from the substrate 401. More specifically, the fins 410' are protruded and formed from wells in the substrate 401. The fins 410' in the channel regions of the active areas 402-1' and 402-5' are formed from N-well 401N, and the fins 410' in the channel regions of the active areas 402-2' and 402-4' formed from P-well 401P. The N-well 401N is configured for a p-type metal-oxide-semiconductor (PMOS) transistor and the P-well 401P is configured for an n-type MOS (NMOS) transistor. The N-well 401N is doped with n-type dopants, such as phosphorus, arsenic, other n-type dopant, or combinations thereof.

The P-well 401P is doped with p-type dopants, such as boron (for example, BF2), indium, other p-type dopant, or combinations thereof.

The embodiments disclosed herein relate to memory devices, and more particularly to memory devices including a metal conductor for the read bit-line that is shared by two SRAM cells in adjacent two rows of an SRAM array, in which the metal conductor is in the lowest metal layer, that can improve cell performance of the SRAM cells. Furthermore, the present embodiments provide one or more of the following advantages. The metal conductors for write word-line and read word-line in the higher metal layers may have a wider width to provide a lower circuit resistance, which improves the performance of the SRAM cells, such as RC delay.

Thus, one of the embodiments of the present disclosure describes a memory device that includes a first static random access memory (SRAM) cell, a second SRAM cell, and a first metal layer. The first SRAM cell includes a first write-port pull-up (PU) transistor and a second write-port PU transistor arranged in a Y-direction, and a first read-port pull-down (PD) transistor and a first read-port pass-gate (PG) transistor. The second SRAM cell includes a third write-port PU transistor and a fourth write-port PU transistor arranged in the Y-direction, and a second read-port PD transistor and a second read-port PG transistor. The first metal layer is over the first SRAM cell and the second SRAM cell. The first metal layer includes a read bit-line conductor extending in the Y-direction and shared by the first SRAM cell and the second SRAM cell. The first read-port PD transistor, the first read-port PG transistor, the second read-port PD transistor, and the second read-port PG transistor are arranged in the Y-direction.

In some embodiments, the first SRAM cell further includes a first write-port pull-down (PD) transistor, a second write-port PD transistor, a first write-port pass-gate (PG) transistor, and a second write-port PG transistor sharing a second active area extending in the Y-direction. The second SRAM cell further includes a third write-port PD transistor, a fourth write-port PD transistor, a third write-port PG transistor, and a fourth write-port PG transistor sharing a fifth active area extending in the Y-direction. The first write-port PU transistor, the first write-port PD transistor, and the first read-port PD transistor share a first gate structure extending in an X-direction perpendicular to the Y-direction. The third write-port PU transistor, the third write-port PD transistor, and the second read-port PD transistor share a second gate structure extending in the X-direction.

In some embodiments, the read bit-line conductor is electrically connected to a source/drain feature of the first read-port PG transistor and a source/drain feature of the second read-port PG transistor.

In some embodiments, the first metal layer further includes a first metal conductor and a second metal conductor extending in the Y-direction and electrically coupled to a reference voltage. The memory device further includes a source/drain contact extending in the X-direction. The source/drain contact is electrically connected to a source/drain feature shared by the first read-port PD transistor and second read-port PD transistor, a source/drain feature shared by the first write-port PD transistor and the second write-port PD transistor, and a source/drain feature shared by the third write-port PD transistor and the fourth write-port PD transistor. The first metal conductor and the second metal conductor are electrically connected to the source/drain contact.

In some embodiments, the memory device further includes a second metal layer over the first metal layer. The second metal layer includes a first write word-line conductor and a second write word-line conductor extending in the X-direction. The first write word-line conductor is electrically connected to gate structures of the first write-port PG transistor and the second write-port PG transistor. The second write word-line conductor is electrically connected to gate structures of the third write-port PG transistor and the fourth write-port PG transistor.

In some embodiments, the memory device further includes a third metal layer over the second metal layer. The third metal layer includes a first write bit-line conductor and a second write bit-line conductor extending in the Y-direction. The first write bit-line conductor is electrically connected to a source/drain feature of the first write-port PG transistor. The second write bit-line conductor is electrically connected to a source/drain feature of the third write-port PG transistor.

In some embodiments, the third metal layer further includes a first write bit-line-bar conductor and a second write bit-line-bar conductor extending in the Y-direction. The first write bit-line-bar conductor is electrically connected to a source/drain feature of the second write-port PG transistor. The second write bit-line-bar conductor is electrically connected to a source/drain feature of the fourth write-port PG transistor.

In some embodiments, the memory device further includes a fourth metal layer over the third metal layer. The third metal layer includes a first read word-line conductor and a second read word-line conductor extending in the X-direction. The first read word-line conductor is electrically connected to a gate structure of the first read-port PG transistor. The second read word-line conductor is electrically connected to a gate structure of the second read-port PG transistor.

In some embodiments, the read bit-line conductor is electrically connected to a source/drain feature shared by the first read-port PD transistor and the second read-port PD transistor.

In some embodiments, the first metal layer further includes a first metal conductor and a second metal conductor electrically coupled to a reference voltage. The first metal conductor electrically connects a source/drain contact over a source/drain feature shared by the first write-port PD transistor and the second write-port PD transistor to a source/drain contact over a source/drain feature of the second read-port PG transistor. The second metal conductor electrically connects a source/drain contact over a source/drain feature shared by the third write-port PD transistor and the fourth write-port PD transistor to a source/drain contact over a source/drain feature of the first read-port PG transistor.

In another of the embodiments, discussed is a memory device including a first static random access memory (SRAM) cell, a second SRAM cell, and a first metal layer. The first SRAM cell includes a first write-port pull-up (PU) transistor and a second write-port PU transistor sharing a first active area extending in a Y-direction; a first write-port pull-down (PD) transistor, a second write-port PD transistor, a first write-port pass-gate (PG) transistor, and a second write-port PG transistor sharing a second active area extending in the Y-direction; and a first read-port PD transistor and a first read-port PG transistor sharing a third active area extending in the Y-direction. The second SRAM cell includes a third write-port PU transistor and a fourth write-port PU transistor sharing a fourth active area extending in the Y-direction; a third write-port PD transistor, a fourth write-port PD transistor, a third write-port PG transistor, and a fourth write-port PG transistor sharing a fifth active area extending in the Y-direction; and a second read-port PD transistor and a second read-port PG transistor sharing the third active area. The first metal layer is over the first SRAM cell and the second SRAM cell. The first metal layer includes a read bit-line conductor extending in the Y-direction and shared by the first SRAM cell and the second SRAM cell.

In some embodiments, the first SRAM cell and the second SRAM cell respectively have a first non-rectangular cell boundary and a second non-rectangular cell boundary.

In some embodiments, the first metal layer further includes a first write word-line landing pad and a second write word-line landing pad extending in the Y-direction. The first write word-line landing pad lengthwise overlaps the first non-rectangular cell boundary in a top view and is electrically connected to gate structures of the first write-port PG transistor and the second write-port PG transistor.

The second write word-line landing pad lengthwise overlaps the second non-rectangular cell boundary in the top view and is electrically connected to gate structures of the third write-port PG transistor and the fourth write-port PG transistor. The memory device further includes a second metal layer over the first metal layer. The second metal layer includes a first write word-line conductor electrically connected to the first write word-line landing pad and a second write word-line conductor electrically connected to the second write word-line landing pad.

In some embodiments, the first metal layer further includes a first metal conductor and a second metal conductor extending in the Y-direction and electrically coupled to a voltage source. The first metal conductor overlaps the first active area in a top view and is electrically connected to a source/drain feature shared by the first write-port PU transistor and the second write-port PU transistor. The second metal conductor overlaps the fourth active area in the top view and is electrically connected to a source/drain feature shared by the third write-port PU transistor and the fourth write-port PU transistor.

In some embodiments, the memory device further includes a first source/drain contact, a second source/drain contact, a third source/drain contact, a fourth source/drain contact, a first metal conductor, and a second metal conductor. The first source/drain contact extends in an X-direction and is over a source/drain feature shared by the first write-port PD transistor and the second write-port PD transistor. The X-direction is perpendicular to the Y-direction. The second source/drain contact extends in the X-direction and is over a source/drain feature shared by the third write-port PD transistor and the fourth write-port PD transistor. The third source/drain contact lengthwise overlaps the first non-rectangular cell boundary in a top view and is over a source/drain feature of the first read-port PG transistor. The fourth source/drain contact lengthwise overlaps the second non-rectangular cell boundary in the top view and is over a source/drain feature of the second read-port PG transistor. The first metal conductor is in the first metal layer and electrically connected to the first source/drain contact and the fourth source/drain contact. The second metal conductor is in the first metal layer and electrically connected to the second source/drain contact and the third source/drain contact.

In some embodiments, the first metal conductor and the second metal conductor each has an L-shape in the top view.

In yet another of the embodiments, discussed is a memory device that includes a first static random access memory (SRAM) cell, a second SRAM cell, a first metal layer, and a second metal layer. The first SRAM cell includes a first write-port pull-up (PU) transistor and a second write-port PU transistor sharing a first active area extending in a Y-direction; a first write-port pull-down (PD) transistor, a second write-port PD transistor, a first write-port pass-gate (PG) transistor, and a second write-port PG transistor sharing a second active area extending in the Y-direction; and a first read-port PD transistor and a first read-port PG transistor sharing a third active area extending in the Y-direction. The second SRAM cell includes a third write-port PU transistor and a fourth write-port PU transistor sharing a fourth active area extending in the Y-direction; a third write-port PD transistor, a fourth write-port PD transistor, a third write-port PG transistor, and a fourth write-port PG transistor sharing a fifth active area extending in the Y-direction; and a second read-port PD transistor and a second read-port PG transistor sharing the third active area. The first metal layer is over the first SRAM cell and the second SRAM cell. The first metal layer includes a read bit-line conductor extending in the Y-direction and shared by the first SRAM cell and the second SRAM cell. The second metal layer is over the first metal layer. The second metal layer includes a first write word-line conductor for the first SRAM cell and a second write word-line conductor for the second SRAM cell extending in an X-direction perpendicular to the Y-direction.

In some embodiments, the first SRAM cell and the second SRAM cell respectively have a first L-shaped cell boundary and a second L-shaped cell boundary in a top view.

In some embodiments, the memory device further includes a source/drain contact extending in the X-direction, over a source/drain feature shared by the first read-port PD transistor and the second read-port PD transistor, and lengthwise overlapping the first L-shaped cell boundary and the second L-shaped cell boundary. The read bit-line conductor is electrically connected to the source/drain contact.

In some embodiments, the memory device further includes a first source/drain contact and a second source/drain contact. The first source/drain contact extends in the X-direction, is over a source/drain feature of the first read-port PG transistor, and lengthwise overlaps the first L-shaped cell boundary. The second source/drain contact extends in the X-direction, is over a source/drain feature of the second read-port PG transistor, and lengthwise overlaps the second L-shaped cell boundary. The read bit-line conductor is electrically connected to the first source/drain contact and the second source/drain contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a first static random access memory (SRAM) cell comprising:
   a first write-port pull-up (PU) transistor and a second write-port PU transistor arranged in a Y-direction; and
   a first read-port pull-down (PD) transistor and a first read-port pass-gate (PG) transistor;
   a second SRAM cell comprising:
   a third write-port PU transistor and a fourth write-port PU transistor arranged in the Y-direction; and
   a second read-port PD transistor and a second read-port PG transistor; and
   a first metal layer over the first SRAM cell and the second SRAM cell, wherein the first metal layer comprises a read bit-line conductor extending in the Y-direction and shared by the first SRAM cell and the second SRAM cell,
   wherein the first read-port PD transistor, the first read-port PG transistor, the second read-port PD transistor, and the second read-port PG transistor are arranged in the Y-direction.

2. The memory device of claim 1, wherein the first SRAM cell further comprises a first write-port pull-down (PD) transistor, a second write-port PD transistor, a first write-port pass-gate (PG) transistor, and a second write-port PG transistor sharing a second active area extending in the Y-direction,
wherein the second SRAM cell further comprises a third write-port PD transistor, a fourth write-port PD transistor, a third write-port PG transistor, and a fourth write-port PG transistor sharing a fifth active area extending in the Y-direction,
wherein the first write-port PU transistor, the first write-port PD transistor, and the first read-port PD transistor share a first gate structure extending in an X-direction perpendicular to the Y-direction,
wherein the third write-port PU transistor, the third write-port PD transistor, and the second read-port PD transistor share a second gate structure extending in the X-direction.

3. The memory device of claim 2, wherein the read bit-line conductor is electrically connected to a source/drain feature of the first read-port PG transistor and a source/drain feature of the second read-port PG transistor.

4. The memory device of claim 3, wherein the first metal layer further comprises a first metal conductor and a second metal conductor extending in the Y-direction and electrically coupled to a reference voltage, wherein the memory device further comprises:
a source/drain contact extending in the X-direction, wherein the source/drain contact is electrically connected to a source/drain feature shared by the first read-port PD transistor and second read-port PD transistor, a source/drain feature shared by the first write-port PD transistor and the second write-port PD transistor, and a source/drain feature shared by the third write-port PD transistor and the fourth write-port PD transistor, wherein the first metal conductor and the second metal conductor are electrically connected to the source/drain contact.

5. The memory device of claim 2, further comprising:
a second metal layer over the first metal layer, wherein the second metal layer comprises a first write word-line conductor and a second write word-line conductor extending in the X-direction,
wherein the first write word-line conductor is electrically connected to gate structures of the first write-port PG transistor and the second write-port PG transistor,
wherein the second write word-line conductor is electrically connected to gate structures of the third write-port PG transistor and the fourth write-port PG transistor.

6. The memory device of claim 5, further comprising:
a third metal layer over the second metal layer, wherein the third metal layer comprises a first write bit-line conductor and a second write bit-line conductor extending in the Y-direction,
wherein the first write bit-line conductor is electrically connected to a source/drain feature of the first write-port PG transistor,
wherein the second write bit-line conductor is electrically connected to a source/drain feature of the third write-port PG transistor.

7. The memory device of claim 6, wherein the third metal layer further comprises a first write bit-line-bar conductor and a second write bit-line-bar conductor extending in the Y-direction,
wherein the first write bit-line-bar conductor is electrically connected to a source/drain feature of the second write-port PG transistor,
wherein the second write bit-line-bar conductor is electrically connected to a source/drain feature of the fourth write-port PG transistor.

8. The memory device of claim 7, further comprising:
a fourth metal layer over the third metal layer, wherein the third metal layer comprises a first read word-line conductor and a second read word-line conductor extending in the X-direction,
wherein the first read word-line conductor is electrically connected to a gate structure of the first read-port PG transistor,
wherein the second read word-line conductor is electrically connected to a gate structure of the second read-port PG transistor.

9. The memory device of claim 2, wherein the read bit-line conductor is electrically connected to a source/drain feature shared by the first read-port PD transistor and the second read-port PD transistor.

10. The memory device of claim 9, wherein the first metal layer further comprises a first metal conductor and a second metal conductor electrically coupled to a reference voltage,
wherein the first metal conductor electrically connects a source/drain contact over a source/drain feature shared by the first write-port PD transistor and the second write-port PD transistor to a source/drain contact over a source/drain feature of the second read-port PG transistor,
wherein the second metal conductor electrically connects a source/drain contact over a source/drain feature shared by the third write-port PD transistor and the fourth write-port PD transistor to a source/drain contact over a source/drain feature of the first read-port PG transistor.

11. A memory device, comprising:
a first static random access memory (SRAM) cell comprising:
a first write-port pull-up (PU) transistor and a second write-port PU transistor sharing a first active area extending in a Y-direction;
a first write-port pull-down (PD) transistor, a second write-port PD transistor, a first write-port pass-gate (PG) transistor, and a second write-port PG transistor sharing a second active area extending in the Y-direction; and
a first read-port PD transistor and a first read-port PG transistor sharing a third active area extending in the Y-direction;
a second SRAM cell comprising:
a third write-port PU transistor and a fourth write-port PU transistor sharing a fourth active area extending in the Y-direction;
a third write-port PD transistor, a fourth write-port PD transistor, a third write-port PG transistor, and a fourth write-port PG transistor sharing a fifth active area extending in the Y-direction; and
a second read-port PD transistor and a second read-port PG transistor sharing the third active area; and
a first metal layer over the first SRAM cell and the second SRAM cell, wherein the first metal layer comprises a read bit-line conductor extending in the Y-direction and shared by the first SRAM cell and the second SRAM cell.

12. The memory device of claim 11, wherein the first SRAM cell and the second SRAM cell respectively have a first non-rectangular cell boundary and a second non-rectangular cell boundary.

13. The memory device of claim 12, wherein the first metal layer further comprises a first write word-line landing pad and a second write word-line landing pad extending in the Y-direction,
wherein the first write word-line landing pad lengthwise overlaps the first non-rectangular cell boundary in a top view and is electrically connected to gate structures of the first write-port PG transistor and the second write-port PG transistor,
wherein the second write word-line landing pad lengthwise overlaps the second non-rectangular cell boundary in the top view and is electrically connected to gate structures of the third write-port PG transistor and the fourth write-port PG transistor,
wherein the memory device further comprises a second metal layer over the first metal layer, wherein the second metal layer comprises a first write word-line conductor electrically connected to the first write word-line landing pad and a second write word-line conductor electrically connected to the second write word-line landing pad.

14. The memory device of claim 11, wherein the first metal layer further comprises a first metal conductor and a second metal conductor extending in the Y-direction and electrically coupled to a voltage source,
wherein the first metal conductor overlaps the first active area in a top view and is electrically connected to a source/drain feature shared by the first write-port PU transistor and the second write-port PU transistor,
wherein the second metal conductor overlaps the fourth active area in the top view and is electrically connected to a source/drain feature shared by the third write-port PU transistor and the fourth write-port PU transistor.

15. The memory device of claim 12, further comprising:
a first source/drain contact extending in an X-direction and over a source/drain feature shared by the first write-port PD transistor and the second write-port PD transistor, wherein the X-direction is perpendicular to the Y-direction;
a second source/drain contact extending in the X-direction and over a source/drain feature shared by the third write-port PD transistor and the fourth write-port PD transistor;
a third source/drain contact lengthwise overlapping the first non-rectangular cell boundary in a top view and over a source/drain feature of the first read-port PG transistor;
a fourth source/drain contact lengthwise overlapping the second non-rectangular cell boundary in the top view and over a source/drain feature of the second read-port PG transistor;
a first metal conductor in the first metal layer and electrically connected to the first source/drain contact and the fourth source/drain contact; and
a second metal conductor in the first metal layer and electrically connected to the second source/drain contact and the third source/drain contact.

16. The memory device of claim 15, wherein the first metal conductor and the second metal conductor each has an L-shape in the top view.

17. A memory device, comprising:
a first static random access memory (SRAM) cell comprising:
a first write-port pull-up (PU) transistor and a second write-port PU transistor sharing a first active area extending in a Y-direction;
a first write-port pull-down (PD) transistor, a second write-port PD transistor, a first write-port pass-gate (PG) transistor, and a second write-port PG transistor sharing a second active area extending in the Y-direction; and
a first read-port PD transistor and a first read-port PG transistor sharing a third active area extending in the Y-direction;
a second SRAM cell comprising:
a third write-port PU transistor and a fourth write-port PU transistor sharing a fourth active area extending in the Y-direction;
a third write-port PD transistor, a fourth write-port PD transistor, a third write-port PG transistor, and a fourth write-port PG transistor sharing a fifth active area extending in the Y-direction; and
a second read-port PD transistor and a second read-port PG transistor sharing the third active area;
a first metal layer over the first SRAM cell and the second SRAM cell, wherein the first metal layer comprises a read bit-line conductor extending in the Y-direction and shared by the first SRAM cell and the second SRAM cell; and
a second metal layer over the first metal layer, wherein the second metal layer comprises a first write word-line conductor for the first SRAM cell and a second write word-line conductor for the second SRAM cell extending in an X-direction perpendicular to the Y-direction.

18. The memory device of claim 17, wherein the first SRAM cell and the second SRAM cell respectively have a first L-shaped cell boundary and a second L-shaped cell boundary in a top view.

19. The memory device of claim 18, further comprising:
a source/drain contact extending in the X-direction, over a source/drain feature shared by the first read-port PD transistor and the second read-port PD transistor, and lengthwise overlapping the first L-shaped cell boundary and the second L-shaped cell boundary,
wherein the read bit-line conductor is electrically connected to the source/drain contact.

20. The memory device of claim 18, further comprising:
a first source/drain contact extending in the X-direction, over a source/drain feature of the first read-port PG transistor, and lengthwise overlapping the first L-shaped cell boundary; and
a second source/drain contact extending in the X-direction, over a source/drain feature of the second read-port PG transistor, and lengthwise overlapping the second L-shaped cell boundary,
wherein the read bit-line conductor is electrically connected to the first source/drain contact and the second source/drain contact.

* * * * *